(12) United States Patent
Lee et al.

(10) Patent No.: US 10,418,278 B2
(45) Date of Patent: Sep. 17, 2019

(54) SEMICONDUCTOR DEVICE HAVING INTERCONNECTION STRUCTURE

(71) Applicants: Dohyun Lee, Hwaseong-si (KR);
Youngwoo Park, Seoul (KR);
Junghoon Park, Yongin-si (KR);
Jaeduk Lee, Seongnam-si (KR)

(72) Inventors: Dohyun Lee, Hwaseong-si (KR);
Youngwoo Park, Seoul (KR);
Junghoon Park, Yongin-si (KR);
Jaeduk Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 6 days.

(21) Appl. No.: 15/857,961

(22) Filed: Dec. 29, 2017

(65) Prior Publication Data

US 2018/0122695 A1    May 3, 2018

Related U.S. Application Data

(63) Continuation of application No. 15/201,922, filed on Jul. 5, 2016, now Pat. No. 9,875,931.

(30) Foreign Application Priority Data

Jul. 6, 2015  (KR) ........................ 10-2015-0096024

(51) Int. Cl.
*H01L 21/00* (2006.01)
*H01L 21/768* (2006.01)
(Continued)

(52) U.S. Cl.
CPC .. *H01L 21/76877* (2013.01); *H01L 21/76816* (2013.01); *H01L 23/5226* (2013.01);
(Continued)

(58) Field of Classification Search
CPC ......... H01L 21/76877; H01L 27/11575; H01L 27/11573; H01L 23/53266
See application file for complete search history.

(56) References Cited

U.S. PATENT DOCUMENTS 5,879,982 A * 3/1999 Park ................. H01L 27/10844
257/E21.645
8,188,530 B2 5/2012 Tanaka et al.
(Continued)

FOREIGN PATENT DOCUMENTS

KR     20170005660 A  *  1/2017 .......... H01L 27/1157

*Primary Examiner* — Laura M Menz
(74) *Attorney, Agent, or Firm* — Harness, Dickey & Pierce, P.L.C.

(57) ABSTRACT

A semiconductor device includes a semiconductor pattern on a semiconductor substrate, a three-dimensional memory array on the semiconductor pattern, and a peripheral interconnection structure between the semiconductor pattern and the semiconductor substrate. The peripheral interconnection structure includes an upper interconnection structure on a lower interconnection structure. The upper interconnection structure includes an upper interconnection and an upper barrier layer. The lower interconnection structure includes a lower interconnection and a lower barrier layer. The upper barrier layer is under a bottom surface of the upper interconnection and does not cover side surfaces of the upper interconnection. The lower barrier layer is under a bottom surface of the lower interconnection and covers side surfaces of the lower interconnection.

20 Claims, 38 Drawing Sheets

(51) Int. Cl.
*H01L 27/1157* (2017.01)
*H01L 27/11582* (2017.01)
*H01L 23/522* (2006.01)
*H01L 23/532* (2006.01)
*H01L 27/11573* (2017.01)
*H01L 27/11575* (2017.01)
*H01L 23/528* (2006.01)

(52) U.S. Cl.
CPC .... *H01L 23/53266* (2013.01); *H01L 27/1157* (2013.01); *H01L 27/11573* (2013.01); *H01L 27/11575* (2013.01); *H01L 27/11582* (2013.01); *H01L 23/522* (2013.01); *H01L 23/5283* (2013.01); *H01L 23/53295* (2013.01)

(56) References Cited

U.S. PATENT DOCUMENTS

| | | | |
|---|---|---|---|
| 8,338,882 B2 | 12/2012 | Tanaka et al. | |
| 8,492,828 B2 | 7/2013 | Son et al. | |
| 9,666,281 B2 * | 5/2017 | Sakakibara | G11C 16/0483 |
| 9,711,603 B2 * | 7/2017 | Lim | H01L 23/485 |
| 9,721,963 B1 * | 8/2017 | Rabkin | H01L 27/11582 |
| 10,074,661 B2 * | 9/2018 | Sakakibara | H01L 21/28273 |
| 2004/0228172 A1 * | 11/2004 | Rinerson | G11C 11/5685 365/158 |
| 2005/0101086 A1 * | 5/2005 | Rinerson | G11C 11/5685 438/257 |
| 2005/0176208 A1 * | 8/2005 | Uchida | H01L 21/86 438/311 |
| 2007/0210367 A1 * | 9/2007 | Bernhardt | H01L 27/10861 257/306 |
| 2010/0320526 A1 | 12/2010 | Kidoh et al. | |
| 2014/0183738 A1 * | 7/2014 | Jezewski | H01L 23/485 257/751 |
| 2015/0014759 A1 * | 1/2015 | Lee | H01L 23/5329 257/306 |
| 2016/0233111 A1 * | 8/2016 | Shiota | H01L 21/304 |
| 2016/0240455 A1 * | 8/2016 | Yun | H01L 23/36 |
| 2017/0011996 A1 * | 1/2017 | Lee | H01L 27/1157 |
| 2017/0053868 A1 * | 2/2017 | Lin | H01L 23/5226 |
| 2017/0125285 A1 * | 5/2017 | Jung | H01L 23/498 |

\* cited by examiner

SEMICONDUCTOR DEVICE HAVING INTERCONNECTION STRUCTURE

CROSS-REFERENCE TO RELATED APPLICATION

This application is a continuation of U.S. application Ser. No. 15/201,922, filed Jul. 5, 2016, which claims priority under 35 U.S.C. § 119 to Korean Patent Application No. 10-2015-0096024 filed on Jul. 6, 2015, the disclosures of each of which are hereby incorporated by reference in their entirety.

BACKGROUND

Technical Field

Example embodiments of inventive concepts relate to a semiconductor device having an interconnection structure, a method of forming the semiconductor device, and electronic systems using the same.

Description of Related Art

In semiconductor devices such as NAND flash memories, a degree of integration is may affect the price of a semiconductor product. In order to increase the degree of integration, three-dimensionally arranged memory cells have been proposed, and the study for reducing the areas of interconnection structures capable of applying an electric signal to the three-dimensional memory cells and peripheral circuits has been conducted.

SUMMARY

In accordance with example embodiments of inventive concepts, a semiconductor device is provided. The semiconductor device includes a semiconductor substrate, a semiconductor pattern on the semiconductor substrate, a three-dimensional memory array on the semiconductor pattern, and a peripheral interconnection structure between the semiconductor pattern and the semiconductor substrate. The peripheral interconnection structure includes an upper interconnection structure and a lower interconnection structure. The lower interconnection structure is under the upper interconnection structure. The upper interconnection structure includes an upper interconnection and an upper barrier layer. The lower interconnection structure includes a lower interconnection and a lower barrier layer. The upper barrier layer is under a bottom surface of the upper interconnection. The upper barrier layer does not cover side surfaces of the upper interconnection. The lower barrier layer is under a bottom surface of the lower interconnection. The lower barrier layer covers side surfaces of the lower interconnection.

In example embodiments, a thickness of the upper interconnection may be greater than a thickness of the lower interconnection.

In example embodiments, the side surfaces of the upper interconnection may have positive slopes. The side surfaces of the lower interconnection may have negative slopes.

In example embodiments, the lower interconnection structure may further include a lower contact plug under the lower interconnection.

In example embodiments, the lower contact plug may be integrally formed with the lower interconnection.

In example embodiments, the lower barrier layer may extend on side surfaces and a bottom surface of the lower contact plug.

In example embodiments, the lower interconnection may further include a lower conductive layer. The lower conductive layer may be on the bottom surface and the side surfaces of the lower interconnection. The lower conductive layer may extend on side surfaces of the lower contact plug. The lower barrier layer may between the lower conductive layer and the lower interconnection. The lower barrier layer may extend between the lower conductive layer and the lower contact plug.

In example embodiments, the upper interconnection structure may further include an upper contact plug between the upper interconnection and the lower interconnection.

In example embodiments, the upper contact plug may be integrally formed with the upper interconnection. The upper barrier layer may extend so as to cover side surfaces and a lower surface of the upper contact plug.

In example embodiments, the three-dimensional memory array may include a plurality of memory cells. Each of the memory cells may include a charge trap layer.

In example embodiments, the three-dimensional memory array may include a plurality of memory strings. The memory strings may be perpendicular to the semiconductor pattern.

In accordance with example embodiments of inventive concepts, a semiconductor device is provided. The semiconductor device includes a semiconductor substrate, a semiconductor pattern on the semiconductor substrate, a data storage element on the semiconductor pattern, and a peripheral interconnection structure between the semiconductor pattern and the semiconductor substrate. The peripheral interconnection structure includes a lower interconnection structure and an upper interconnection structure. The upper interconnection structure is on the lower interconnection structure. The lower interconnection structure includes a lower contact plug, a lower interconnection, and a lower barrier layer. The upper interconnection structure includes an upper contact plug, an upper interconnection, and an upper barrier layer. The upper interconnection has a greater thickness than a thickness of the lower interconnection.

In example embodiments, the lower contact plug may be under the lower interconnection. The upper contact plug may be under the upper interconnection. The lower barrier layer may cover side surfaces of the lower interconnection. The lower barrier layer may extend under a bottom surface of the lower interconnection. The upper barrier layer may not cover side surfaces of the upper interconnection. The upper barrier may be under a bottom surface of the upper interconnection.

In example embodiments, an angle between an upper surface of the upper interconnection and a side surface of the upper interconnection may be greater than an angle between an upper surface of the lower interconnection and a side surface of the lower interconnection.

In example embodiments, an angle between an upper surface of the upper interconnection and a side surface of the upper interconnection may be an obtuse angle. An angle between an upper surface of the lower interconnection and a side surface of the lower interconnection may be an acute angle.

In accordance with example embodiments of inventive concepts, a semiconductor device is provided. The semiconductor device includes a peripheral transistor on a semiconductor substrate, a semiconductor pattern transistor on the semiconductor substrate and overlapping the peripheral transistor, a first three-dimensional memory array on the semiconductor pattern, and a peripheral interconnection structure between the semiconductor substrate and the semiconductor pattern and electrically connected to the peripheral transistor. The peripheral interconnection structure includes an upper interconnection structure and a lower interconnection structure under the upper interconnection structure, the upper interconnection structure includes an upper interconnection and an upper barrier layer. The lower interconnection structure includes a lower interconnection and a lower barrier layer. The upper barrier layer is under a bottom surface of the upper interconnection and exposes side surfaces of the upper interconnection. The lower barrier layer is under a bottom surface of the lower interconnection and covers side surfaces of the lower interconnection.

According to example embodiments, a semiconductor device includes a peripheral interconnection structure, a semiconductor pattern on the peripheral interconnection structure, and a memory array on the semiconductor pattern. The peripheral interconnection structure includes an upper interconnection structure on a lower interconnection structure. The lower interconnection structure includes a lower barrier layer that contacts a side surface of a lower contact plug, and a lower interconnection on the lower contact plug. The upper interconnection structure includes an upper interconnection on an upper contact plug and an upper barrier layer. The upper interconnection is on top of the upper barrier layer. The upper contact plug is one of spaced apart from a lower surface of the upper interconnection and protruding from the lower surface of the upper interconnection. The upper interconnection has a different stress characteristic than the lower contact plug.

In example embodiments, a side surface of the upper interconnection may have a positive slope and the side surface of the lower interconnection may have a negative slope.

In example embodiments, the upper interconnection may include a metal layer having a different stress characteristic than a metal layer in the lower interconnection.

In example embodiments, a thickness of the upper interconnection may be greater than a thickness of the lower interconnection.

In example embodiments, the memory array may be a three-dimensional memory array on the semiconductor pattern. The three-dimensional memory array may include a plurality of cell gate conductive patterns stacked on top of each other and a plurality of cell vertical structures penetrating the cell gate conductive patterns. The upper barrier layer may be arranged so it does not cover side surfaces of the upper interconnection. The lower interconnection may be on the lower barrier layer.

Details of example embodiments are included in detailed explanations and the drawings.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to the same (and/or or like) parts throughout the different views. The drawings are not necessarily to scale, emphasis instead being placed upon illustrating the features of inventive concepts. In the drawings.

DETAILED DESCRIPTION OF EXAMPLE EMBODIMENTS

Figure 1:
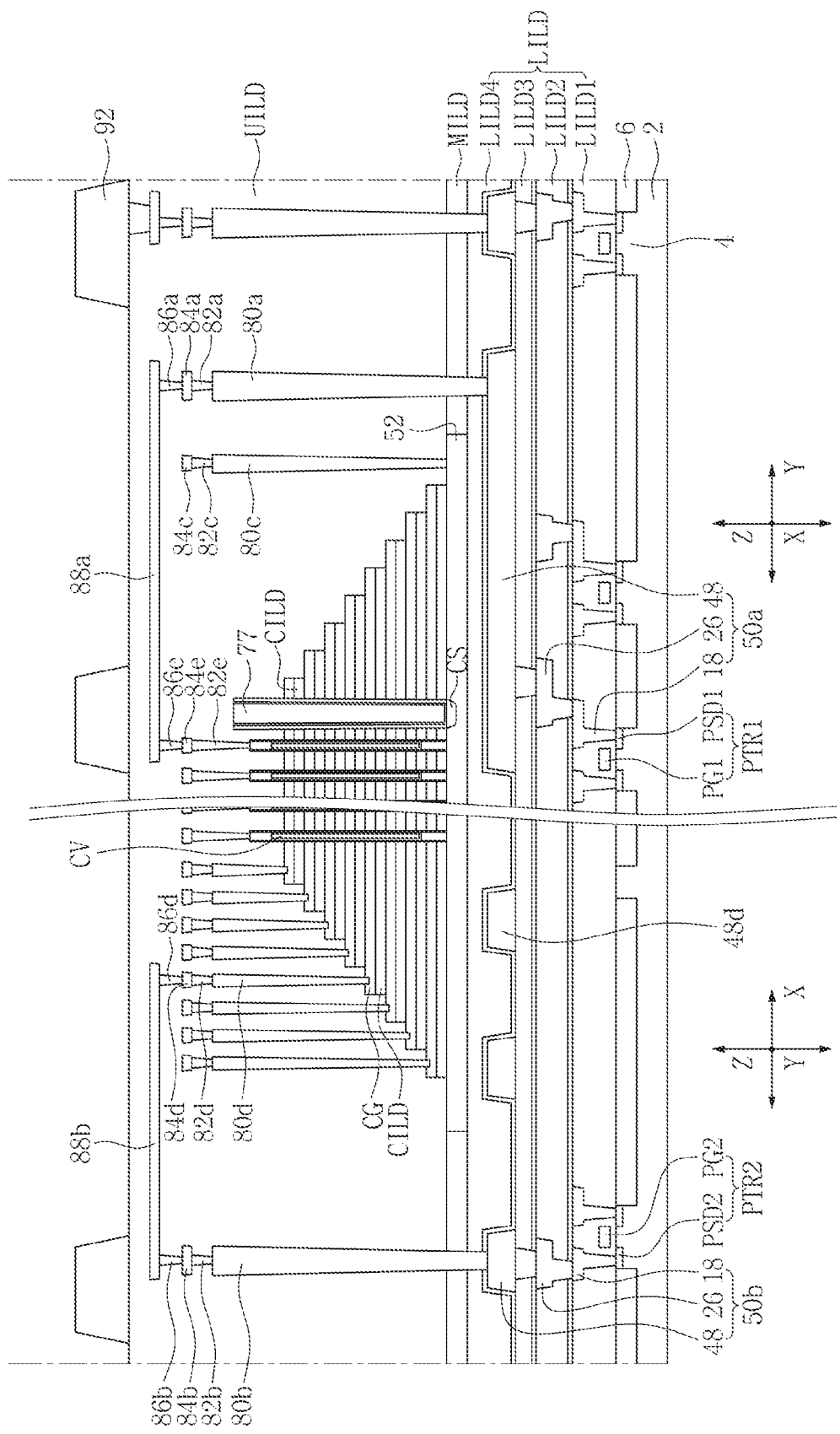
FIG. 1 is a cross-sectional view showing an example of a semiconductor device in accordance with example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

Further, it will be understood that when a layer is referred to as being "on" another layer or a substrate, the layer may be formed directly on the other layer or the substrate, or there may be an intervening layer therebetween. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of example embodiments of inventive concepts.

Furthermore, throughout this disclosure, directional terms such as "upper," "intermediate," "lower," and the like may be used herein to describe the relationship of one element or feature with another, and example embodiments of inventive concepts should not be limited by these terms. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Additionally, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of example embodiments of inventive concepts.

The terminology used herein to describe example embodiments of inventive concepts are not intended to limit the scope of example embodiments of inventive concepts. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Figure 2:
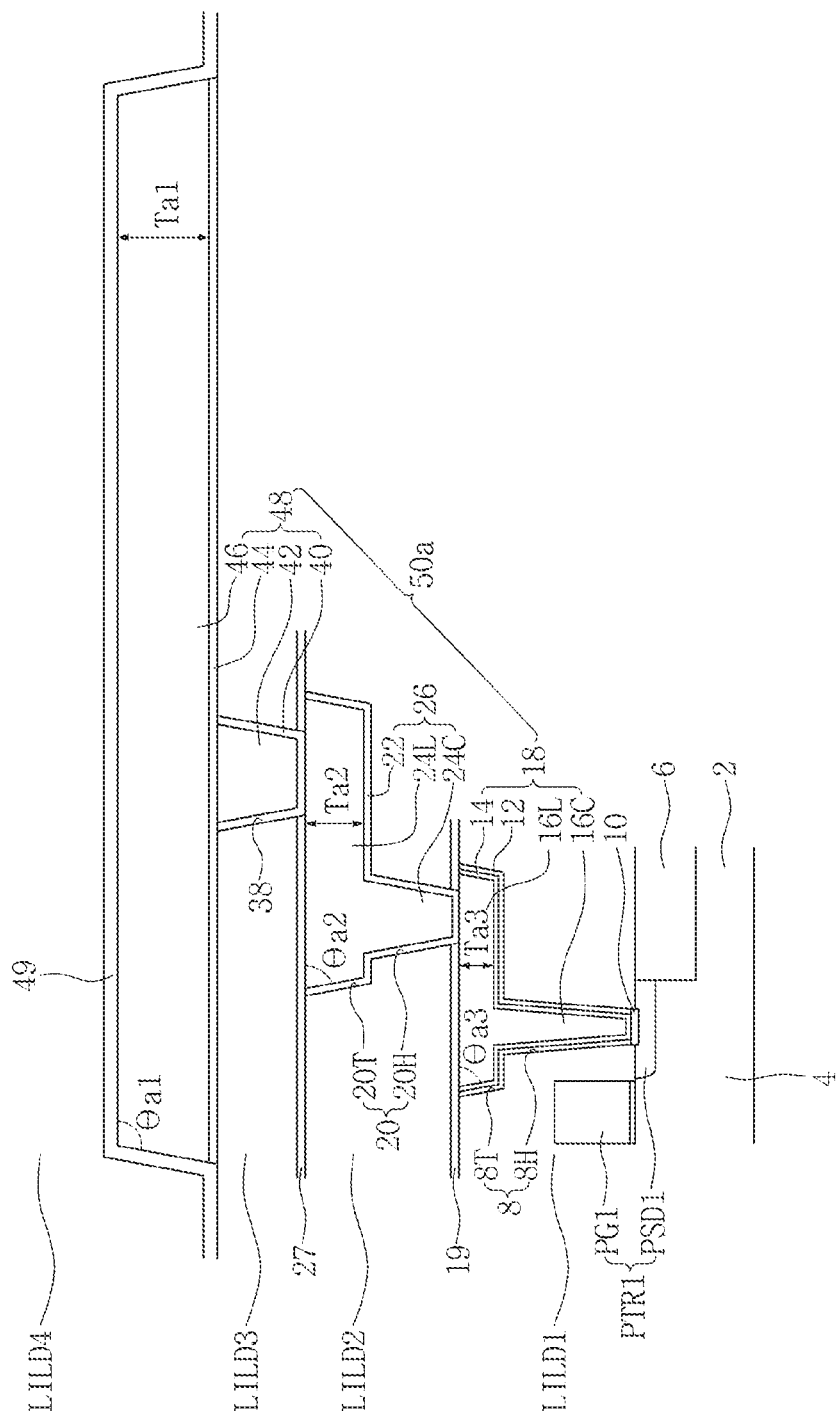
FIG. 2 is an enlarged cross-sectional view showing some components of FIG. 1.
Figure 3:
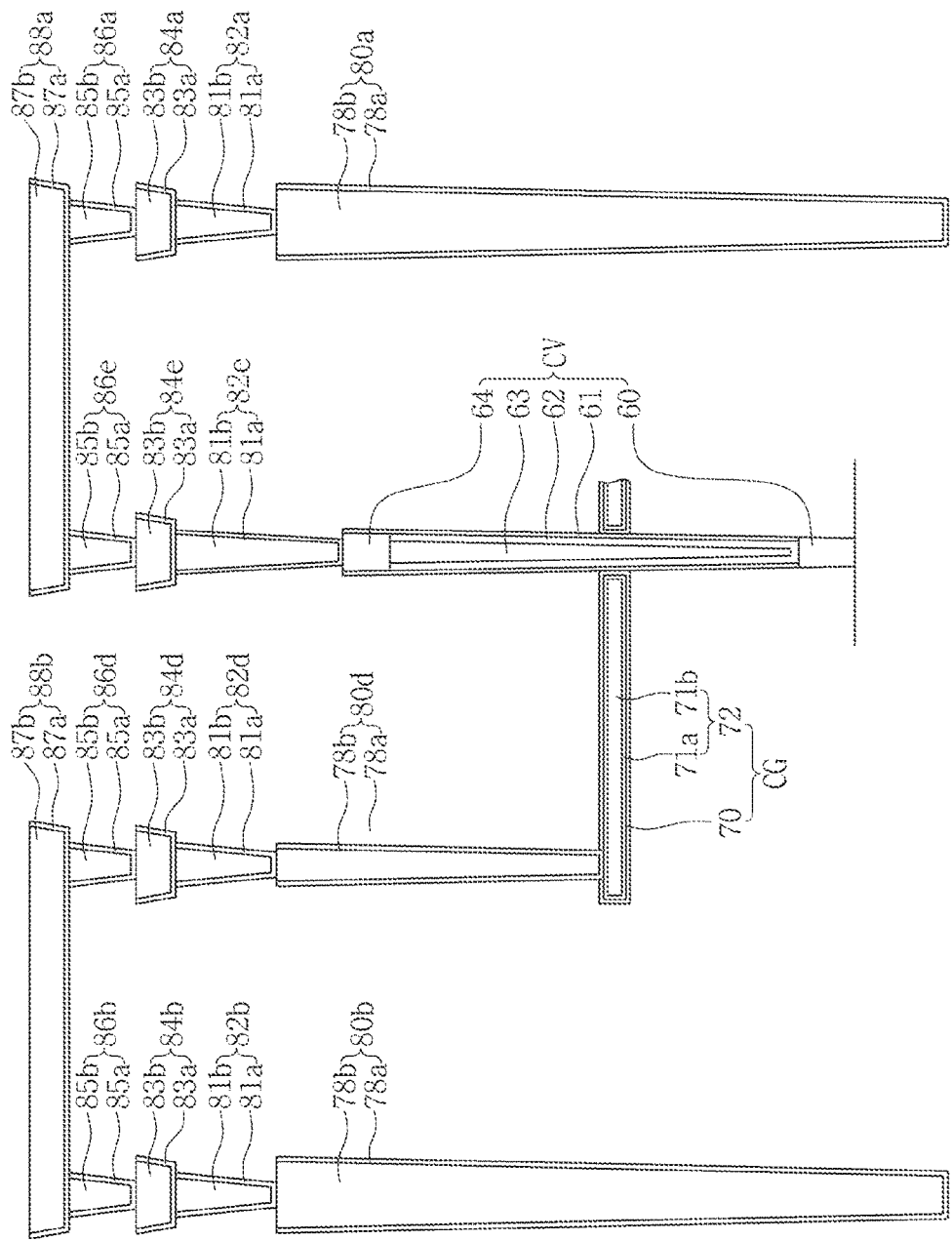
FIG. 3 is an enlarged cross-sectional view showing the other components of FIG. 1.

FIG. 1 is a cross-sectional view showing an example of a semiconductor device in accordance with example embodiments of inventive concepts, and FIGS. 2 and 3 are views showing some components of FIG. 1. First, the semiconductor device in accordance with example embodiments of inventive concepts will be described with reference to FIG. 1.

Referring to FIG. 1, a semiconductor substrate 2 may be provided. The semiconductor substrate 2 may be a semiconductor substrate formed of silicon, such as single crystal silicon, but not limited thereto. An isolation region 6, which defines an active region 4, may be disposed on the semiconductor substrate 2. The isolation region 6 may be a shallow trench isolation (STI).

A circuit may be disposed on the semiconductor substrate 2. The circuit may include a first peripheral transistor PTR1 and a second peripheral transistor PTR2. The first peripheral transistor PTR1 may include a first peripheral gate PG1 and a first source/drain region PSD1, and the second peripheral transistor PTR2 may include a second peripheral gate PG2 and a second source/drain region PSD2.

A lower interlayer insulating layer LILD may be disposed on the semiconductor substrate 2. The lower interlayer insulating layer LILD may be formed with a plurality of layers. For example, the lower interlayer insulating layer LILD may include a first lower interlayer insulating layer LILD1, a second lower interlayer insulating layer LILD2, a third lower interlayer insulating layer LILD3, and a fourth lower interlayer insulating layer LILD4, which are sequentially stacked in a direction Z perpendicular to the semiconductor substrate 2.

A lower capping layer 19 may be disposed between the first lower interlayer insulating layer LILD1 and the second lower interlayer insulating layer LILD2. An intermediate capping layer 27 may be disposed between the second lower interlayer insulating layer LILD2 and the third lower interlayer insulating layer LILD3. An upper capping layer 49 may be disposed between the third lower interlayer insulating layer LILD3 and the fourth lower interlayer insulating layer LILD4.

The lower interlayer insulating layer LILD may be formed with an oxide-based insulating layer, for example, a silicon oxide layer or a low-k dielectric material layer, and the lower, intermediate, and upper capping layers 19, 27, and 49 may be formed with a nitride-based insulating layer, for example, a silicon nitride layer.

A first peripheral interconnection structure 50a and a second peripheral interconnection structure 50b may be disposed on the semiconductor substrate 2. The first and second peripheral interconnection structures 50a and 50b may be disposed in the lower interlayer insulating layer LILD.

The first peripheral interconnection structure 50a may be electrically connected to the first peripheral transistor PTR1, and the second peripheral interconnection structure 50b may be electrically connected to the second peripheral transistor PTR2. For example, the first peripheral interconnection structure 50a may be electrically connected to the first source/drain region PSD1 of the first peripheral transistor PTR1, and the second peripheral interconnection structure 50b may be electrically connected to the second source/drain region PSD2 of the second peripheral transistor PTR2.

Each of the first and second peripheral interconnection structures 50a and 50b may include a lower interconnection structure 18, an upper interconnection structure 48 disposed on the lower interconnection structure 18, and an intermediate interconnection structure 26 disposed between the lower interconnection structure 18 and the upper interconnection structure 48.

Throughout this specification, terms such as "upper," "intermediate," "lower," and the like may be used herein to distinguish the relative locations of elements from one another, and example embodiments of inventive concepts should not be limited by these terms. Therefore, these terms such as "upper," "intermediate," "lower," and the like may be replaced by other terms such as "first," "second," "third," and the like to describe the elements. For example, terms such as "upper interconnection" and "intermediate interconnection" used to distinguish relative positions thereof may be replaced by terms such as "first interconnection" and "second connection" or terms such as "upper interconnection" and "lower interconnection."

The lower interconnection structure 18, the intermediate interconnection structure 26, and the upper interconnection structure 48, which constitute the first peripheral interconnection structure 50a will be described with reference to FIGS. 1 and 2.

Referring to FIGS. 1 and 2, the lower interconnection structure 18 may be a damascene interconnection structure which fills a lower opening 8 in the first lower interlayer insulating layer LILD1 with a conductive material. The lower opening 8 may include a lower contact hole 8H which exposes the first source/drain region PSD1 and a lower interconnection trench 8T disposed on the lower contact hole 8H.

The lower interconnection structure 18 may include a lower contact plug 16C, a lower interconnection 16L, a lower conductive layer 12, and a lower barrier layer 14. The lower interconnection 16L may be disposed on the lower contact plug 16C. The lower contact plug 16C may be disposed in the lower contact hole 8H and the lower interconnection 16L may be disposed in the lower interconnection trench 8T.

The lower contact plug 16C and the lower interconnection 16L may be integrally formed. The lower contact plug 16C and the lower interconnection 16L may be formed of the same material. For example, the lower contact plug 16C and the lower interconnection 16L may be formed of a refractory metal. The lower contact plug 16C and the lower interconnection 16L may be formed of a refractory metal having a tensile stress characteristic (e.g., tungsten) and the lower contact plug 16C and the lower interconnection 16L may be formed using a chemical vapor deposition (CVD) process.

The lower conductive layer 12 may be disposed on side surfaces of the lower contact plug 16C and may extend on a bottom surface and side surfaces of the lower interconnection 16L. The lower barrier layer 14 may be interposed between the lower conductive layer 12 and the lower contact plug 16C and between the lower conductive layer 12 and the lower interconnection 16L and may extend on a bottom surface of the lower contact plug 16C. The lower barrier layer 14 may cover the bottom surface and the side surfaces of the lower contact plug 16C and the bottom surface and the side surfaces of the lower interconnection 16L.

A metal-silicide layer 10 may be disposed under the lower interconnection structure 18. The metal-silicide layer 10 may be a material made of a metal material constituting the lower conductive layer 12 (e.g., Ti) and an element constituting the semiconductor substrate 2 (e.g., Si).

In example embodiments, the lower capping layer 19 may cover an upper surface of the lower interconnection 16L of the lower interconnection structure 18.

The intermediate interconnection structure 26 may be a damascene interconnection structure which fills an intermediate opening 20 in the second lower interlayer insulating layer LILD2 with a conductive material. The intermediate opening 20 may include an intermediate contact hole 20H which exposes the lower interconnection 16L and an intermediate interconnection trench 20T disposed on the intermediate contact hole 20H.

The intermediate interconnection structure 26 may include an intermediate contact plug 24C, an intermediate interconnection 24L, and an intermediate barrier layer 22. The intermediate contact plug 24C may be disposed in the intermediate contact hole 20H and the intermediate interconnection 24L may be disposed in the intermediate interconnection trench 20T.

The intermediate interconnection 24L may be disposed on the intermediate contact plug 24C. The intermediate contact plug 24C and the intermediate interconnection 24L may be integrally formed. The intermediate contact plug 24C and the intermediate interconnection 24L may be formed of the same material. For example, the intermediate contact plug 24C and the intermediate interconnection 24L may be formed of a refractory metal having a tensile stress characteristic, (e.g., tungsten). The refractory metal may be formed using a CVD process. The intermediate barrier layer 22 may be disposed on a bottom surface and side surfaces of the intermediate contact plug 24C and may extend on a bottom surface and side surfaces of the intermediate interconnection 24L. The intermediate barrier layer 22 located under the intermediate contact plug 24C may be in contact with the upper surface of the lower interconnection 16L.

In example embodiments, the intermediate capping layer 27 may cover an upper surface of the intermediate interconnection 24L of the intermediate interconnection structure 26.

The upper interconnection structure 48 may include an upper contact plug 42, an upper interconnection 46, an upper plug barrier layer 40, and an upper interconnection barrier layer 44.

The upper contact plug 42 may pass through the third lower interlayer insulating layer LILD3. The upper plug barrier layer 40 may cover a bottom surface and side surfaces of the upper contact plug 42. The upper plug barrier layer 40 located under the upper contact plug 42 may be in contact with the upper surface of the intermediate interconnection 24L. The upper plug barrier layer 40 may be formed of a conductive nitride (e.g., TiN). The upper contact plug 42 may be formed of a refractory metal having a tensile stress characteristic (e.g., tungsten). The refractory metal may be formed using a CVD process.

The upper interconnection 46 may be disposed on the third lower interlayer insulating layer LILD3 and may overlap the upper contact plug 42. The upper interconnection barrier layer 44 may be disposed under a bottom surface of the upper interconnection 46 and may not cover side surfaces of the upper interconnection 46. The upper interconnection barrier layer 44 may be disposed under the bottom surface of the upper interconnection 46 and may not extend on the side surfaces of the upper interconnection 46.

The upper interconnection barrier layer 44 may be formed of a conductive nitride, for example, TiN. The upper interconnection 46 may be formed of a refractory metal having a different stress characteristic from the lower and intermediate interconnections 16L and 24L having a tensile stress characteristic. For example, the upper interconnection 46 may be formed of tungsten, which may be formed by a physical vapor deposition (PVD) process capable of adjusting the stress.

The upper contact plug 42 and the upper interconnection 46 may be spaced apart from each other, and the upper interconnection barrier layer 44 may be interposed between the upper contact plug 42 and the upper interconnection 46.

In example embodiments, the upper capping layer 49 may cover an upper surface and the side surfaces of the upper interconnection 46 of the upper interconnection structure 48. Therefore, the bottom surface of the upper interconnection 46 may be covered by the upper interconnection barrier layer 44 capable of being formed of a conductive nitride (e.g., TiN), and the upper surface and the side surfaces of the upper interconnection 46 may be covered by the upper capping layer 49 capable of being formed of an insulating nitride (e.g., SiN).

A thickness Ta1 of the upper interconnection 46 may be greater than a thickness Ta2 of the intermediate interconnection 24L and a thickness Ta3 of the lower interconnection 16L. The thickness Ta2 of the intermediate interconnection 24L may be greater than the thickness Ta3 of the lower interconnection 16L.

An angle θa1 between the upper surface of the upper interconnection 46 and the side surface thereof may be greater than an angle θa2 between the upper surface of the intermediate interconnection 24L and the side surface thereof and an angle θa3 between the upper surface of the lower interconnection 16L and the side surface thereof. The angle θa1 between the upper surface of the upper interconnection 46 and the side surface thereof may be an obtuse angle, and the angle θa2 between the upper surface of the intermediate interconnection 24L and the side surface thereof and the angle θa3 between the upper surface of the lower interconnection 16L and the side surface thereof may be acute angles.

The side surfaces of the upper interconnection 46 may be positive slopes. The side surfaces of the lower and intermediate interconnections 16L and 24L may be negative slopes.

A stress adjustment pattern 48d, which may be formed of the same material and on the same plane as the upper interconnection 46, may be disposed on the third lower interlayer insulating layer LILD3. The stress adjustment pattern 48d may limit (and/or suppress) the warpage of the semiconductor substrate 2.

In example embodiments, the fourth lower interlayer insulating layer LILD4 may be disposed on the third lower interlayer insulating layer LILD3 and may cover the upper interconnection structure 48.

In example embodiments, the upper capping layer 49 may be disposed between the third and fourth lower interlayer insulating layers LILD3 and LILD4 and may cover the upper surface and the side surfaces of the upper interconnection 46.

Referring to FIGS. 1 and 3, a semiconductor pattern 52 may be disposed on the lower interlayer insulating layer LILD. The semiconductor pattern 52 may be formed of a silicon material. For example, the semiconductor pattern 52 may be formed of polysilicon. The semiconductor pattern 52 may be doped with impurities. For example, the semiconductor pattern 52 may be formed to be a P-type conductivity type.

An intermediate interlayer insulating layer MILD may be disposed on side surfaces of the semiconductor pattern 52. The intermediate interlayer insulating layer MILD may be formed of silicon oxide.

A three-dimensional memory array including a plurality memory cells may be disposed on the semiconductor pattern 52. The three-dimensional memory array may include a plurality of memory strings perpendicular to the semiconductor pattern 52. Each of the plurality memory cells may include a charge trap layer. The three-dimensional memory array may include a plurality of cell gates CG and a plurality of cell vertical structures CV.

The plurality of cell gates CG may be disposed on the semiconductor pattern 52. The cell gates CG may be spaced apart from each other in a vertical direction Z. Edges of the cell gates CG may be arranged in a step structure which descends stepwise from top to bottom. Cell interlayer insulating layers CILD each may be disposed under each of the cell gates CG. The cell interlayer insulating layers CILD may be formed of silicon oxide.

Each of the cell gates CG may include a cell gate conductive pattern 72 and a second cell dielectric 70. The second cell dielectric 70 may be disposed on an upper surface, lower surface, and side surfaces of the cell gate conductive pattern 72. The cell gate conductive pattern 72 may include a cell barrier layer 71a and a cell interconnection 71b. The cell barrier layer 71a may be disposed to surround the cell interconnection 71b. The cell barrier layer 71a may be formed of a conductive metal nitride.

The cell interconnections 71b of the cell gate conductive patterns 72 may include a tungsten material. For example, the cell interconnections 71b of the cell gate conductive patterns 72 may be formed of a refractory metal having a tensile stress characteristic, for example, tungsten formed using a CVD process.

A lowermost cell gate conductive pattern among the cell gate conductive patterns 72 may be a gate electrode of a ground select transistor, and an uppermost cell gate conductive pattern may be a gate electrode of a string select transistor. A plurality of patterns disposed in a center among the cell gate conductive patterns 72 may be cell word lines.

The plurality of cell vertical structures CV may be disposed on the semiconductor pattern 52 and may pass through the cell gates CG and the cell interlayer insulating layers CILD.

Each of the plurality of cell vertical structures CV may include a semiconductor epitaxial layer 60, a first cell dielectric 61, a cell semiconductor layer 62, a core insulating pattern 63, and a cell pad pattern 64. The cell pad pattern 64 may be disposed on the core insulating pattern 63. The cell semiconductor layer 62 may be disposed on the semiconductor epitaxial layer 60. The cell semiconductor layer 62 may be disposed on side surfaces and a bottom surface of the core insulating pattern 63. The first cell dielectric 61 may be disposed on an outer side of the cell semiconductor layer 62. The cell semiconductor layer 62 and the cell pad pattern 64 may be formed of silicon. For example, the cell semiconductor layer 62 and the cell pad pattern 64 may be formed of polysilicon.

Any one of the first and second cell dielectrics 61 and 70 may be an element capable of storing data. Any one of the first and second cell dielectrics 61 and 70 may include a charge trap layer. For example, the first cell dielectric 61 may include a tunnel dielectric layer (e.g., silicon oxide) and a data storage layer (e.g., a silicon nitride layer or the like capable of trapping charges), which are sequentially formed on the cell semiconductor layer 62. The second cell dielectric 70 may include a blocking dielectric. The first and second cell dielectrics 61 and 70 may have the same structure as a dielectric including an data storage layer disposed between a control gate of a NAND flash memory device and a body of a cell transistor of the NAND flash memory device. However, example embodiments of inventive concepts are not limited to the structure of the NAND flash memory device and may be used in various memory devices.

A source pattern 77 may be disposed on the semiconductor pattern 52 to pass through the cell gates CG and the cell interlayer insulating layers CILD and to be spaced apart from the cell vertical structures CV. The source pattern 77 may be formed of a conductive material (e.g., a material such as Ti, TiN, W, or the like). A source impurity region CS having a different conductive type from the semiconductor pattern 52 for example, an N-type conductivity type may be disposed in the semiconductor pattern 52 under the source pattern 77.

Peripheral bit line contact structures 80*a*, 82*a*, 84*a*, and 86*a* may be disposed on the upper interconnection structure 48 of the first peripheral interconnection structure 50*a*. The peripheral bit line contact structures 80*a*, 82*a*, 84*a*, and 86*a* may include a first peripheral bit line contact structure 80*a*, a second peripheral bit line contact structure 82*a*, a third peripheral bit line contact structure 84*a*, and a fourth peripheral bit line contact structure 86*a*, which are sequentially arranged in an upward direction Z.

Peripheral word line contact structures 80*b*, 82*b*, 84*b*, and 86*b* may be disposed on the upper interconnection structure 48 of the second peripheral interconnection structure 50*b*. The peripheral word line contact structures 80*b*, 82*b*, 84*b*, and 86*b* may include a first peripheral word line contact structure 80*b*, a second peripheral word line contact structure 82*b*, a third peripheral word line contact structure 84*b*, and a fourth peripheral word line contact structure 86*b*, which are sequentially arranged in the upward direction Z.

Well contact structures 80*c*, 82*c*, and 84*c* may be disposed on the semiconductor pattern 52. The well contact structures 80*c*, 82*c*, and 84*c* may include a first well contact structure 80*c*, a second well contact structure 82*c*, and a third well contact structure 84*c*, which are sequentially arranged in the upward direction Z.

Cell gate contact structures 80*d*, 82*d*, 84*d*, and 86*d* may be disposed on the cell gates CG to be electrically connected to the cell gates CG. The cell gate contact structures 80*d*, 82*d*, 84*d*, and 86*d* may include a first cell gate contact structure 80*d*, a second cell gate contact structure 82*d*, a third cell gate contact structure 84*d*, and a fourth cell gate contact structure 86*d*, which are sequentially arranged in the upward direction Z.

Cell bit line contact structures 82*e*, 84*e*, and 86*e* may be disposed to be electrically connected to the cell vertical structures CV. The cell bit line contact structures 82*e*, 84*e*, and 86*e* may include a first cell bit line contact structure 82*e*, a second cell bit line contact structure 84*e*, and a third cell bit line contact structure 86*e*, which are sequentially arranged in the upward direction Z.

A bit line connection structure 88*a* may be disposed to electrically connect the cell bit line contact structures 82*e*, 84*e*, and 86*e* to the peripheral bit line contact structures 80*a*, 82*a*, 84*a*, and 86*a*. A word line connection structure 88*b* may be disposed to electrically connect the cell gate contact structures 80*d*, 82*d*, 84*d*, and 86*d* to the peripheral word line contact structures 80*b*, 82*b*, 84*b*, and 86*b*.

Each of the first peripheral bit line contact structure 80*a*, the first peripheral word line contact structure 80*b*, and the first cell gate contact structure 80*d* may include a contact plug 78*b* and a barrier layer 78*a* which covers side surfaces and a bottom surface of the contact plug 78*b*.

Each of the second peripheral bit line contact structure 82*a*, the second peripheral word line contact structure 82*b*, the second well contact structure 82*c*, the second cell gate contact structure 82*d*, and the first cell bit line contact structure 82*e* may include a contact plug 81*b* and a barrier layer 81*a* which covers side surfaces and a bottom surface of the contact plug 81*b*.

Each of the third peripheral bit line contact structure 84*a*, the third peripheral word line contact structure 84*b*, the third cell gate contact structure 84*d*, and the second cell bit line contact structure 84*e* may include an intermediate interconnection layer 83*b* and a barrier layer 83*a* which covers side surfaces and a bottom surface of the intermediate interconnection layer 83*b*.

Each of the fourth peripheral bit line contact structure 86*a*, the fourth peripheral word line contact structure 86*b*, the fourth cell gate contact structure 86*d*, and the third cell bit line contact structure 86*e* may include a contact plug 85*b* and a barrier layer 85*a* which covers side surfaces and a bottom surface of the contact plug 85*b*.

Each of the bit line connection structure 88*a* and the word line connection structure 88*b* may include a connection interconnection layer 87*b* and a barrier layer 87*a* which covers side surfaces and a bottom surface of the connection interconnection layer 87*b*.

An upper interlayer insulating layer UILD may be disposed on the semiconductor pattern 52 and the intermediate interlayer insulating layer MILD. The upper interlayer insulating layer UILD may cover the cell gates CG, the cell vertical structures CV, the cell bit line contact structures 82*e*, 84*e*, and 86*e*, the peripheral bit line contact structures 80*a*, 82*a*, 84*a*, and 86*a*, the bit line connection structure 88*a*, the cell gate contact structures 80*d*, 82*d*, 84*d*, and 86*d*, the peripheral word line contact structures 80*b*, 82*b*, 84*b*, and 86*b*, and the word line connection structure 88*b*.

A metal interconnection 92 may be disposed on the upper interlayer insulating layer UILD. An angle between an upper surface of the metal interconnection 92 and a side surface thereof may be an obtuse angle.

The lower interconnection 16L or the intermediate interconnection 24L may be formed of a refractory metal having a tensile stress characteristic, for example, tungsten formed using a CVD process. Further, the cell interconnections 71*b* of the cell gate conductive patterns 72 of the cell gates CG may be formed of a refractory metal having a tensile stress characteristic, for example, tungsten formed using a CVD process.

The upper interconnection 46 of the upper interconnection structure 48 may be formed of a metal material having a different stress characteristic from the lower interconnection 16L, the intermediate interconnection 24L, and the cell gate conductive patterns 72. For example, the upper interconnection 46 may be formed to have stress capable of preventing or minimizing the warpage of the semiconductor substrate 2 in consideration of the warpage of the semiconductor substrate 2 including the lower interconnection 16L, the intermediate interconnection 24L, and the cell gate conductive pattern 72. The upper interconnection 46 may be formed of a refractory metal having a different stress characteristic from the tensile stress of the lower interconnection 16L, the intermediate interconnection 24L, and the cell gate conductive patterns 72, for example, a compressive stress characteristic. For example, the upper interconnection 46 may be formed of a PVD tungsten material formed by adjusting the stress. The PVD tungsten material may be a tungsten material formed using a PVD process.

The upper interconnection 46 of the upper interconnection structure 48 may be formed of a refractory metal formed using a PVD process and the upper contact plug 42 may be formed of a refractory metal formed using a CVD process. However, example embodiments are not limited thereto.

Another example of the upper interconnection structure 48 will be described with reference to FIGS. 4 and 5.

Figure 4:
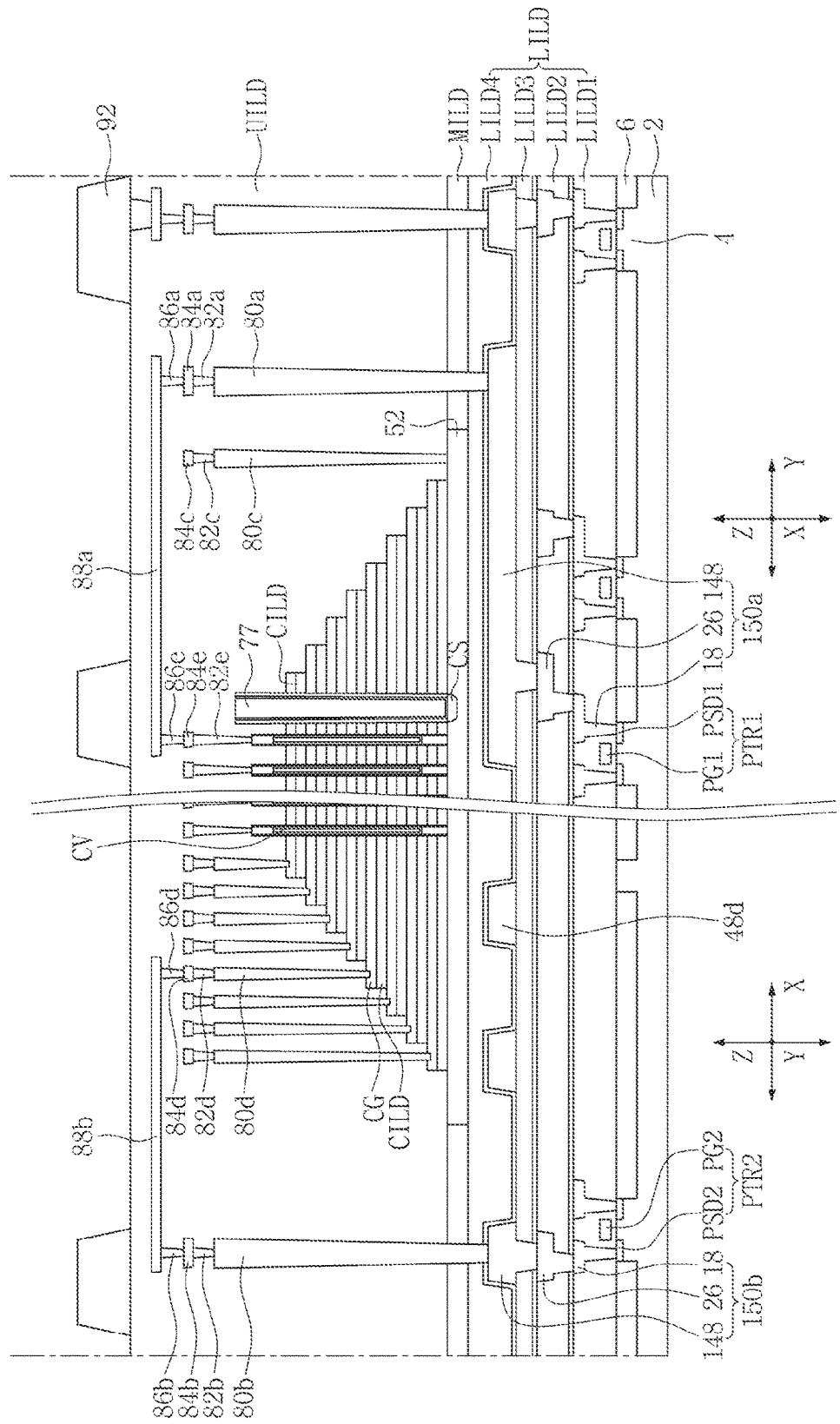
FIGS. 4 and 5 are cross-sectional views showing a modified example of a semiconductor device in accordance with example embodiments of inventive concepts.
Figure 5:
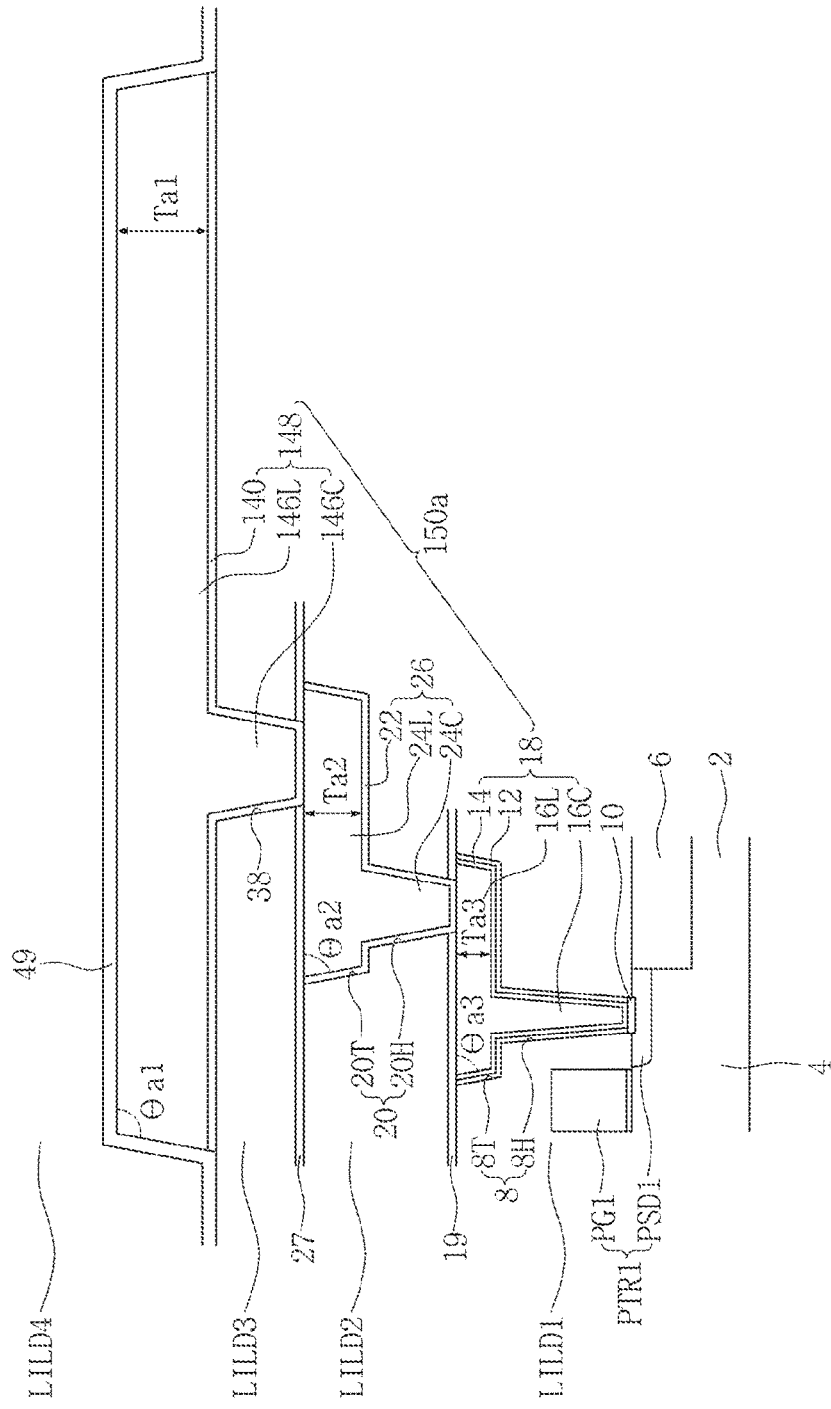

Referring to FIGS. 4 and 5, an upper interconnection structure 148 may include an upper contact plug 146C, an upper interconnection 146L, and an upper barrier layer 140. The upper contact plug 146C and the upper interconnection 146L may be integrally formed. The upper barrier layer 140 may cover a bottom surface and side surfaces of the upper contact plug 146C and a bottom surface of the upper interconnection 146L. The upper barrier layer 140 may not cover side surfaces of the upper interconnection 146L.

The upper barrier layer 140 may be formed of a conductive metal nitride, for example, TiN. The upper interconnection 146L and the upper contact plug 146C may be formed of tungsten, which is formed by a PVD process capable of adjusting the stress.

An angle θa1 between an upper surface of the upper interconnection 146L and the side surface thereof may be an obtuse angle similar to the upper interconnection 46 in FIGS. 1 and 2. Further, the upper interconnection 146L may have a greater thickness Ta1 than a thickness Ta2 of an intermediate interconnection 24L and a thickness Ta3 of a lower interconnection 16L similar to the upper interconnection 46 in FIGS. 1 and 2.

The intermediate interconnection structure 26 and the lower interconnection structure 18 described in FIGS. 1 and 2 and the upper interconnection structure 148 may constitute first and second peripheral interconnection structures 150a and 150b.

Next, a modified example of a semiconductor device in accordance with example embodiments of inventive concepts will be described with reference to FIGS. 6A, 6B, 7A, 7B, and 8.

Figure 6A:
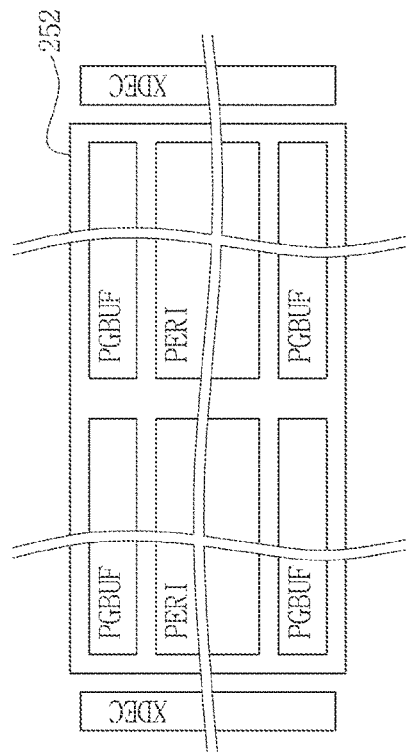
FIG. 6A is a layout showing a modified example of a semiconductor device in accordance with example embodiments of inventive concepts.
Figure 6B:
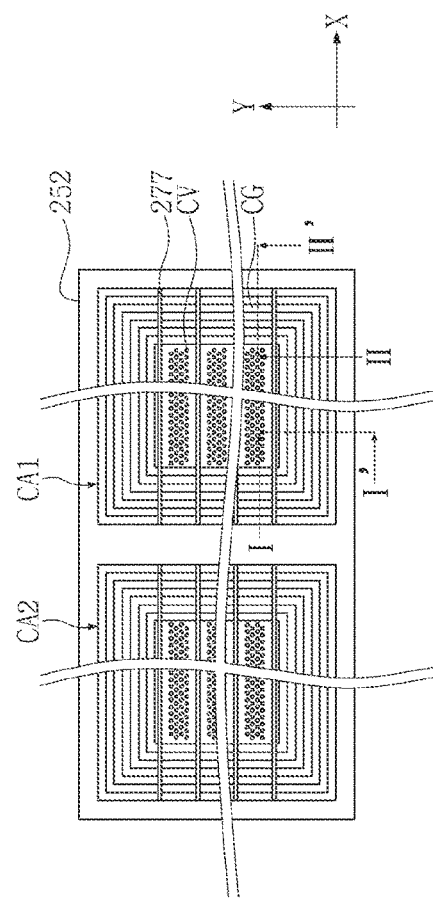
FIG. 6B is a plan view showing a modified example of a semiconductor device in accordance with example embodiments of inventive concepts.
Figure 7A:
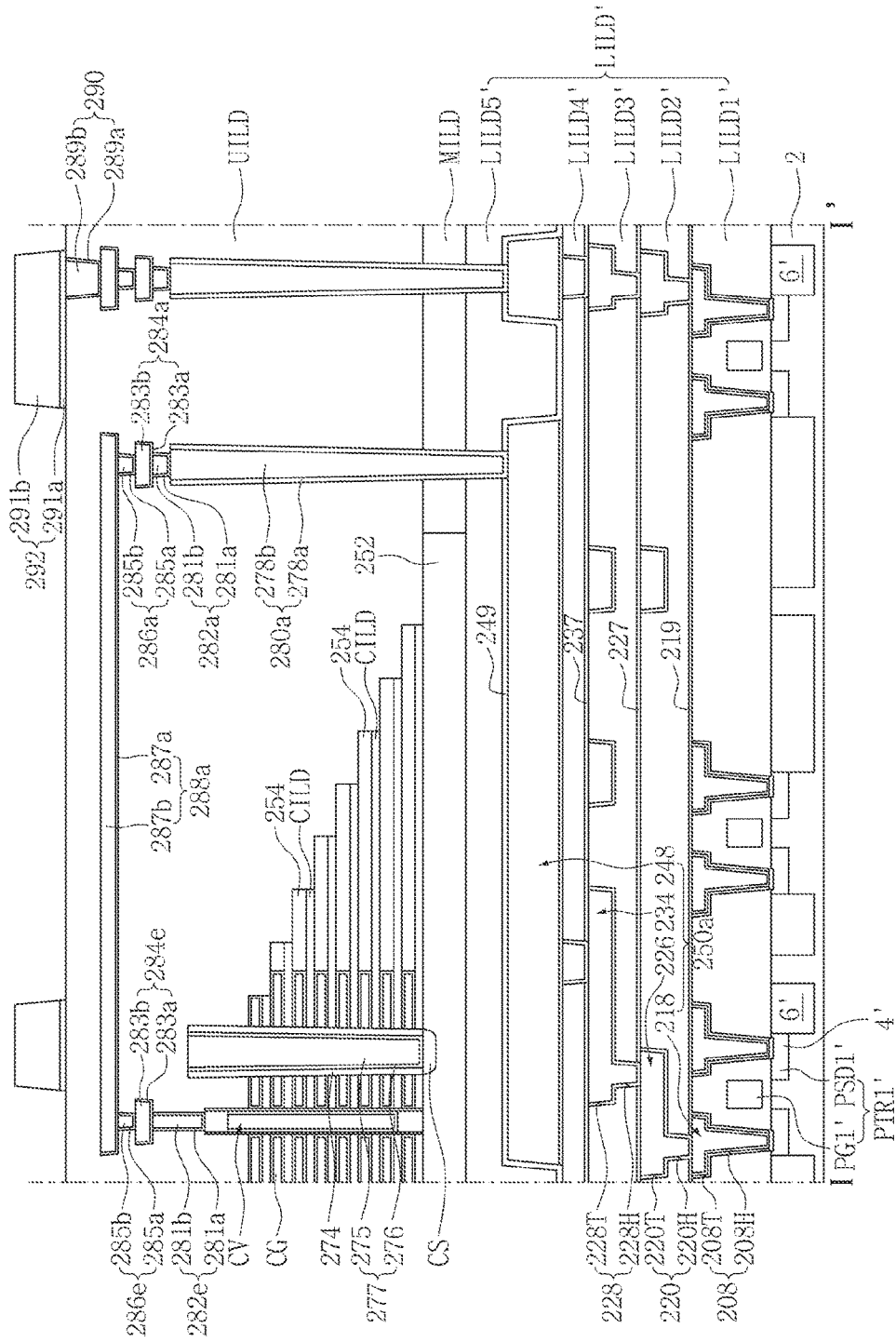
FIGS. 7A and 7B are cross-sectional views showing a modified example of a semiconductor device in accordance with example embodiments of inventive concepts.
Figure 7B:
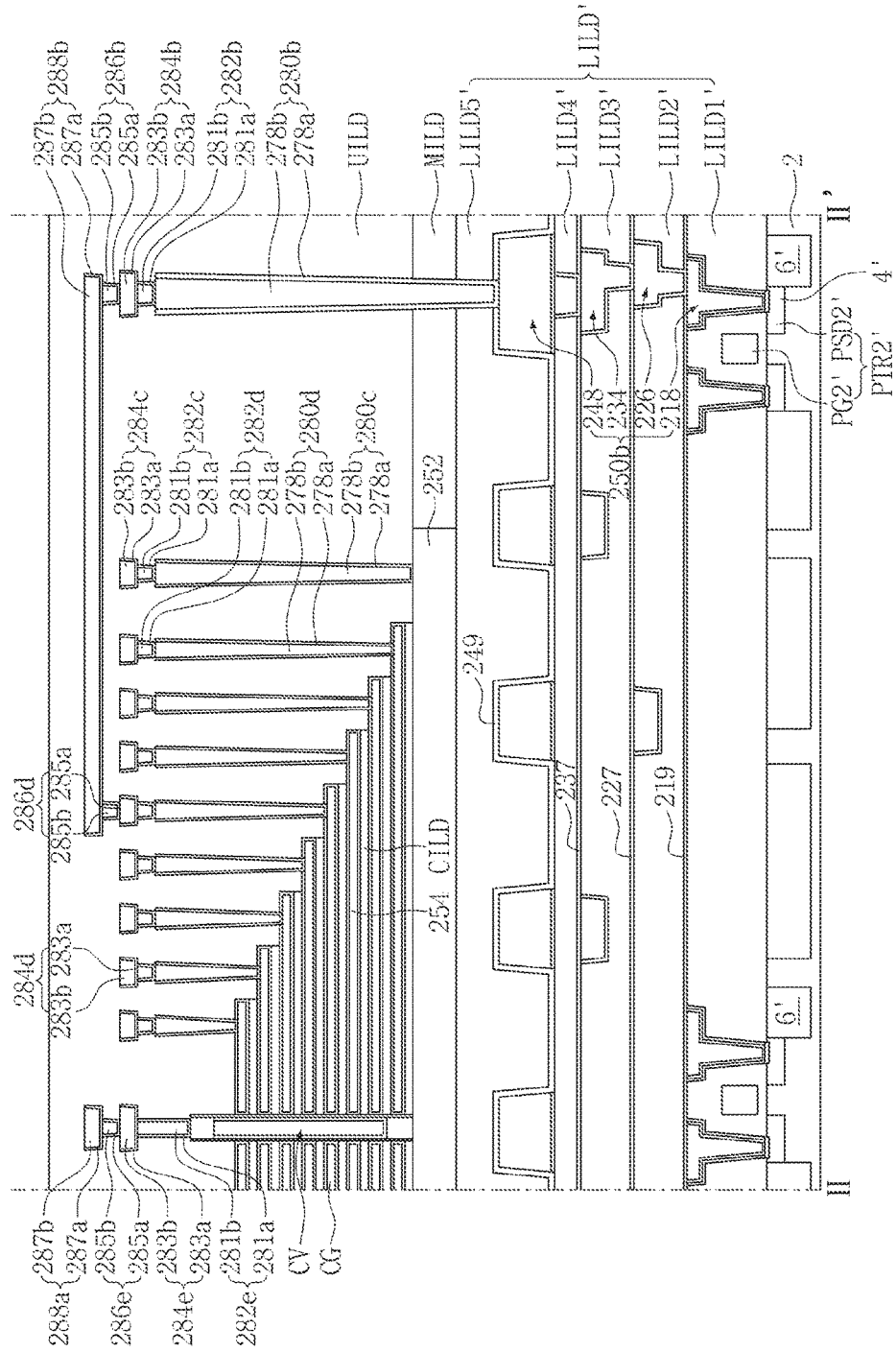
Figure 8:
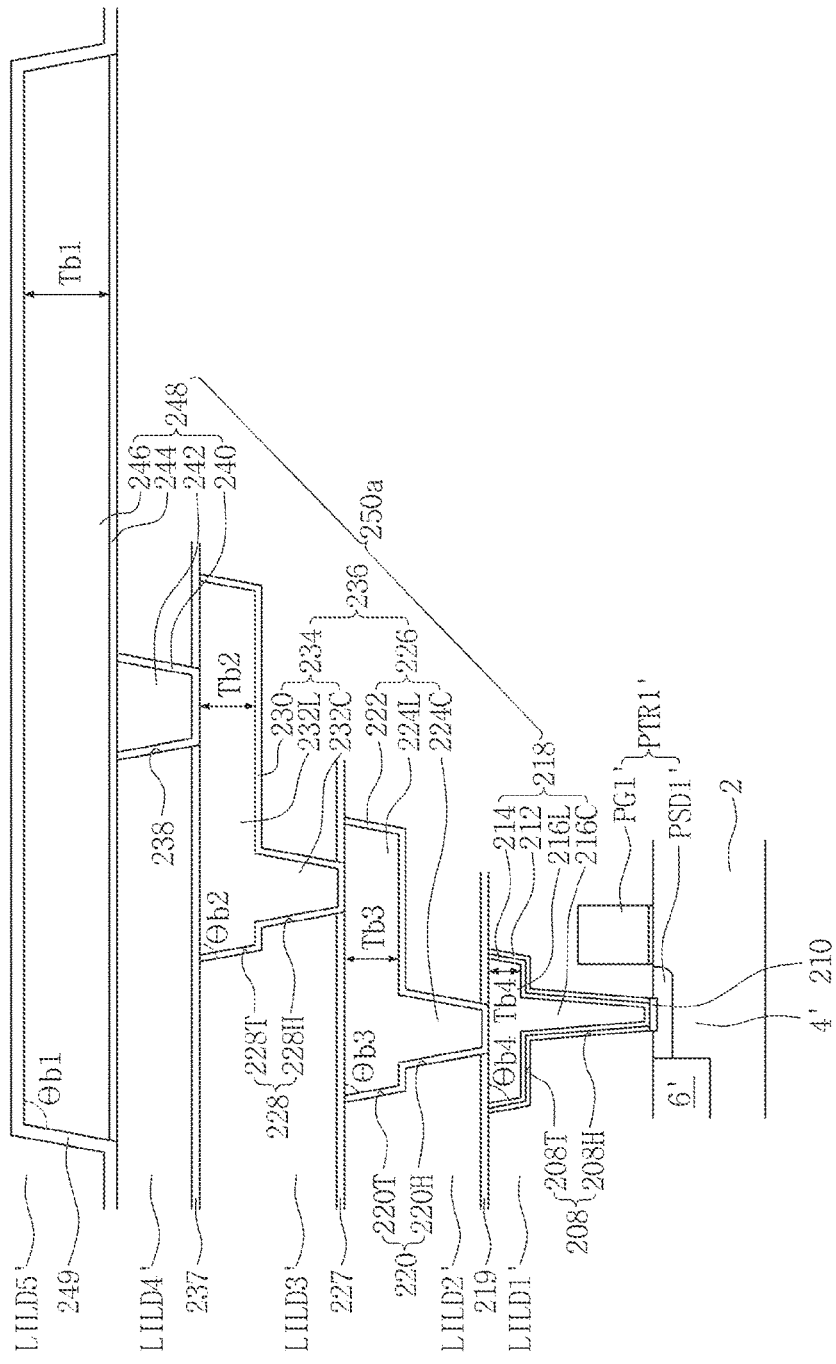
FIG. 8 is an enlarged cross-sectional view showing some components of FIG. 7A.

FIG. 6A is a layout showing a modified example of a semiconductor device in accordance with example embodiments of inventive concepts. FIG. 6B is a plan view showing a modified example of a semiconductor device in accordance with example embodiments of inventive concepts. FIG. 7A is a cross-sectional view showing a region taken along line I-I' of FIG. 6B and FIG. 7B is a cross-sectional view showing a region taken along line II-II' of FIG. 6B. FIG. 8 is an enlarged cross-sectional view showing some components of FIG. 7A.

Referring to FIGS. 6A, 6B, 7A, 7B, and 8, a semiconductor substrate 2 may be provided. The semiconductor substrate 2 may be a semiconductor substrate formed of single crystal silicon. An isolation region 6' which defines an active region 4' may be disposed on the semiconductor substrate 2.

Circuits such as X decoders XDEC, peripheral circuits PERI, page buffers PGBUF, and the like may be disposed on the semiconductor substrate 2.

A semiconductor pattern 252 may be disposed on the semiconductor substrate 2. The semiconductor pattern 252 may be formed of silicon. For example, the semiconductor pattern 252 may be formed of polysilicon.

In example embodiments, the peripheral circuit PERI and the page buffer PGBUF may be disposed between the semiconductor pattern 252 and the semiconductor substrate 2.

In example embodiments, the X decoder XDEC may not overlap the semiconductor pattern 252. However, example embodiments are not limited thereto. For example, the X decoder XDEC may overlap the semiconductor pattern 252.

A first peripheral transistor PTR1' and a second peripheral transistor PTR2' may be disposed on the semiconductor substrate 2. The first peripheral transistor PTR1' may include a first peripheral gate PG1' and a first source/drain region PSD1', and the second peripheral transistor PTR2' may include a second peripheral gate PG2' and a second source/drain region PSD2'.

In example embodiments, the first peripheral transistor PTR1' may be a transistor constituting the peripheral circuit PERI, and the second peripheral transistor PTR2' may be a transistor constituting the X decoder XDEC. The first peripheral transistor PTR1' may overlap the semiconductor pattern 252 and the second peripheral transistor PTR2' may not overlap the semiconductor pattern 252.

A lower interlayer insulating layer LILD' may be disposed on the semiconductor substrate 2.

The lower interlayer insulating layer LILD' may be formed with a plurality of layers. For example, the lower interlayer insulating layer LILD' may include a first lower interlayer insulating layer LILD1', a second lower interlayer insulating layer LILD2', a third lower interlayer insulating layer LILD3', a fourth lower interlayer insulating layer LILD4', and a fifth lower interlayer insulating layer LILD5', which are sequentially stacked.

A lower capping layer 219 may be disposed between the first lower interlayer insulating layer LILD1' and the second lower interlayer insulating layer LILD2'. A first intermediate capping layer 227 may be disposed between the second lower interlayer insulating layer LILD2' and the third lower interlayer insulating layer LILD3'. A second intermediate capping layer 237 may be disposed between the third lower interlayer insulating layer LILD3' and the fourth lower interlayer insulating layer LILD4'. An upper capping layer 249 may be disposed between the fourth lower interlayer insulating layer LILD4' and the fifth lower interlayer insulating layer LILD5'.

The lower interlayer insulating layer LILD' may be formed with an oxide-based insulating layer (e.g., a silicon oxide layer or a low dielectric material layer), and the lower, first intermediate, second intermediate, and upper capping layers 219, 227, 237, and 249 may be formed with a nitride-based insulating layer (e.g., a silicon nitride layer).

First and second peripheral interconnection structures 250a and 250b may be disposed on the semiconductor substrate 2. The first and second peripheral interconnection structures 250a and 250b may be disposed in the lower interlayer insulating layer LILD'.

The first peripheral interconnection structure 250a may be electrically connected to the first peripheral transistor PTR1' and the second peripheral interconnection structure 250b may be electrically connected to the second peripheral transistor PTR2'. For example, the first peripheral interconnection structure 250a may be electrically connected to the first source/drain region PSD1' of the first peripheral transistor PTR1', and the second peripheral interconnection structure 250b may be electrically connected to the second source/drain region PSD2' of the second peripheral transistor PTR2'.

Each of the first and second peripheral interconnection structures 250a and 250b may include a lower interconnection structure 218, an intermediate interconnection structure 236 disposed on the lower interconnection structure 218, and an upper interconnection structure 248 disposed on the intermediate interconnection structure 236. The intermediate interconnection structure 236 may include a first intermediate interconnection structure 226 and a second intermediate interconnection structure 234 disposed on the first intermediate interconnection structure 226.

The lower interconnection structure 218 may be a damascene interconnection structure which fills a lower opening 208 in the first lower interlayer insulating layer LILD1' with a conductive material. The lower opening 208 may include a lower contact hole 208H which exposes the first source/drain region PSD1' and a lower interconnection trench 208T disposed on the lower contact hole 208H.

The lower interconnection structure 218 may include a lower contact plug 216C, a lower interconnection 216L, a lower conductive layer 212, and a lower barrier layer 214. The lower contact plug 216C, the lower interconnection 216L, the lower conductive layer 212, and the lower barrier layer 214 may correspond to the lower contact plug 16C, the lower interconnection 16L, the lower conductive layer 12, and the lower barrier layer 14 described in FIGS. 1 and 2, respectively, and may be formed of the same material in the same structure. For example, the lower contact plug 216C and the lower interconnection 216L may be integrally formed. Further, the lower contact plug 216C and the lower interconnection 216L may be formed of a material having a tensile stress characteristic, for example, tungsten formed using a CVD process.

A metal-silicide layer 210 may be disposed under the lower interconnection structure 218. The metal-silicide layer 210 may be a material made of a metal material constituting the lower conductive layer 212, for example, Ti, and an element constituting the semiconductor substrate 2, for example, Si.

In example embodiments, the lower capping layer 219 may cover an upper surface of the lower interconnection 216L of the lower interconnection structure 218.

The intermediate interconnection structure 236 may include the first intermediate interconnection structure 226 and the second intermediate interconnection structure 234.

The first intermediate interconnection structure 226 may be a damascene interconnection structure which fills a first intermediate opening 220 in the second lower interlayer insulating layer LILD2' with a conductive material. The first intermediate opening 220 may include a first intermediate contact hole 220H which exposes the lower interconnection 216L, and a first intermediate interconnection trench 220T disposed on the first intermediate contact hole 220H.

The first intermediate interconnection structure 226 may include a first intermediate contact plug 224C, a first intermediate interconnection 224L, and a first intermediate barrier layer 222. The first intermediate contact plug 224C may be disposed in the first intermediate contact hole 220H, and the first intermediate interconnection 224L may be disposed in the first intermediate interconnection trench 220T.

The first intermediate interconnection 224L may be disposed on the first intermediate contact plug 224C. The first intermediate contact plug 224C and the first intermediate interconnection 224L may be integrally formed. The first intermediate contact plug 224C and the first intermediate interconnection 224L may be formed of a refractory metal. The first intermediate contact plug 224C and the first intermediate interconnection 224L may be formed of a material having a tensile stress characteristic, for example, tungsten formed using a CVD process.

The first intermediate barrier layer 222 may be disposed on a bottom surface and side surfaces of the first intermediate contact plug 224C and may extend on a bottom surface and side surfaces of the first intermediate interconnection 224L. The first intermediate barrier layer 222 may be formed of a metal nitride.

In example embodiments, the first intermediate capping layer 227 may cover an upper surface of the first intermediate interconnection 224L of the first intermediate interconnection structure 226.

The second intermediate interconnection structure 234 may be a damascene interconnection structure which fills a second intermediate opening 228 in the third lower interlayer insulating layer LILD3' with a conductive material. The second intermediate opening 228 may include a second intermediate contact hole 228H which exposes the first intermediate interconnection 224L, and a second intermediate interconnection trench 228T disposed on the second intermediate contact hole 228H.

The second intermediate interconnection structure 234 may include a second intermediate contact plug 232C, a second intermediate interconnection 232L, and a second intermediate barrier layer 230. The second intermediate contact plug 232C may be disposed in the second intermediate contact hole 228H, and the second intermediate interconnection 232L may be disposed in the second intermediate interconnection trench 228T.

The second intermediate contact plug 232C and the second intermediate interconnection 232L may be integrally formed. The second intermediate contact plug 232C and the second intermediate interconnection 232L may be formed of a refractory metal. The second intermediate contact plug 232C and the second intermediate interconnection 232L may be formed of a material having a tensile stress characteristic, for example, tungsten formed using a CVD process.

The second intermediate barrier layer 230 may be disposed on a bottom surface and side surfaces of the second intermediate contact plug 232C and may extend on a bottom surface and side surfaces of the second intermediate interconnection 232L. The second intermediate barrier layer 230 may be formed of a metal nitride.

In example embodiments, the second intermediate capping layer 237 may cover an upper surface of the second intermediate interconnection 232L.

The upper interconnection structure 248 may include an upper contact plug 242, an upper interconnection 246, an upper plug barrier layer 240, and an upper interconnection barrier layer 244.

The upper contact plug 242 may pass through the fourth lower interlayer insulating layer LILD4'. The upper plug barrier layer 240 may cover a bottom surface and side surfaces of the upper contact plug 242. The upper plug barrier layer 240 may be formed of a metal nitride. The upper contact plug 242 may be formed of a refractory metal having a tensile stress characteristic, for example, tungsten formed using a CVD process.

The upper interconnection 246 may be disposed on the fourth lower interlayer insulating layer LILD4' and may overlap the upper contact plug 242. The upper interconnection barrier layer 244 may be disposed under a bottom surface of the upper interconnection 246 and may not be disposed on side surfaces of the upper interconnection 246. The upper interconnection barrier layer 244 may be disposed under the bottom surface of the upper interconnection 246 and may not extend on the side surfaces of the upper interconnection 246. The upper interconnection barrier layer 244 may cover the bottom surface of the upper interconnection 246 and may not cover the side surfaces of the upper interconnection 246. The upper contact plug 242 and the upper interconnection 246 may be spaced apart from each other, and the upper interconnection barrier layer 244 may be interposed between the upper contact plug 242 and the upper interconnection 246.

The upper interconnection barrier layer 244 may be formed of a metal nitride. The upper interconnection 246 may be formed of a refractory metal having a different stress characteristic from the lower, first intermediate, and second intermediate interconnections 216L, 224L, and 232L having a tensile stress characteristic. For example, the upper interconnection 246 may be formed of tungsten, which is formed by a PVD process capable of adjusting the stress.

In example embodiments, the upper capping layer 249 may cover an upper surface and the side surfaces of the upper interconnection 246 of the upper interconnection structure 248.

A thickness Tb1 of the upper interconnection 246 may be greater than a thickness Tb3 of the first intermediate interconnection 224L, a thickness Tb2 of the second intermediate interconnection 232L, and a thickness Tb4 of the lower interconnection 216L. The thicknesses Tb2 and Tb3 of the first and second intermediate interconnections 224L and 232L may be greater than the thickness Tb4 of the lower interconnection 216L.

An angle θb1 between the upper surface of the upper interconnection 246 and the side surface thereof may be greater than an angle θb3 between the upper surface of the first intermediate interconnection 224L and the side surface thereof, an angle θb2 between the upper surface of the second intermediate interconnection 232L and the side surface thereof, and an angle θb4 between the upper surface of the lower interconnection 216L and the side surface thereof. The angle θb1 between the upper surface and the side surface of the upper interconnection 246 may be an obtuse angle, and the angles θb2 and θb3 between the upper surfaces of the first and second intermediate interconnections 224L and 232L and the side surfaces thereof and the angle θb4 between the upper surface and the side surface of the lower interconnection 216L may be acute angles.

In example embodiments, the fifth lower interlayer insulating layer LILD5' may be disposed on the fourth lower interlayer insulating layer LILD4' and may cover the upper interconnection structure 248.

In example embodiments, the upper capping layer 249 may be disposed between the fourth and fifth lower interlayer insulating layers LILD4' and LILD5' and may cover the upper surface and the side surfaces of the upper interconnection 246.

An intermediate interlayer insulating layer MILD may be disposed on side surfaces of the semiconductor pattern 252.

First and second three-dimensional memory arrays CA1 and CA2 may be disposed on the semiconductor pattern 252 to be spaced apart from each other. Each of the first and second three-dimensional memory arrays CA1 and CA2 may include a plurality of memory strings perpendicular the semiconductor pattern 252. Each of the first and second three-dimensional memory arrays CA1 and CA2 may include cell gates CG and cell vertical structures CV.

In example embodiments, the cell gates CG and the cell vertical structures CV may be the same as the cell gates CG and the cell vertical structures CV described in FIG. 3. For example, each of the cell gates CG may include the cell gate conductive pattern 72 (shown in FIG. 3) and the second cell dielectric 70 (shown in FIG. 3) described in FIG. 3. Further, each of the cell vertical structures CV may include the semiconductor epitaxial layer 60 (shown in FIG. 3), the first cell dielectric 61 (shown in FIG. 3), the cell semiconductor layer 62 (shown in FIG. 3), the core insulating pattern 63 (shown in FIG. 3), and the cell pad pattern 64 (shown in FIG. 3) described in FIG. 3. Each of the first and second three-dimensional memory arrays CA1 and CA2 may include three-dimensionally arranged a plurality memory cells. Each of the plurality memory cells may include a charge trap layer.

The cell vertical structures CV may be disposed between source patterns 277, which are spaced apart from each other and parallel to each other. Each of the source patterns 277 may be a line shape which extends in a first direction X. Each of the source patterns 277 may include a source conductive layer 275 and a source barrier layer 276 which surrounds side surfaces and a bottom surface of the source conductive layer 275.

A source impurity region CS having a different conductive type from the semiconductor pattern 252 may be disposed in the semiconductor pattern 252 under the source pattern 277. The semiconductor pattern 252 may be a P-type conductivity type and the source impurity region CS may be an N-type conductivity type.

In example embodiments, edges of the cell gates CG may be arranged between the source patterns 277 in a step structure which descends stepwise from top to bottom.

Cell interlayer insulating layers CILD may be disposed under each of the cell gates CG. The cell interlayer insulating layers CILD may be formed of silicon oxide.

In example embodiments, cell molding layers 254 may be disposed to extend from ends of the cell gates CG disposed in a second direction Y perpendicular to the first direction X in a horizontal direction. Therefore, the cell gates CG may be disposed in a step structure in the first direction X, and the cell molding layers 254 may be disposed in a step structure in the second direction Y.

The cell interlayer insulating layers CILD may be disposed on the semiconductor pattern 252. The cell interlayer insulating layers CILD may be disposed under the cell gates CG and may extend under the cell molding layers 254. The cell interlayer insulating layers CILD may be formed of silicon oxide.

Peripheral bit line contact structures 280a, 282a, 284a, and 286a may be disposed on the upper interconnection structure 248 of the first peripheral interconnection structure 250a. The peripheral bit line contact structures 280a, 282a, 284a, and 286a may have the same structure as the peripheral bit line contact structure 80a, 82a, 84a, and 86a described in FIGS. 1 and 3. For example, each of the peripheral bit line contact structure 280a, 282a, 284a, and 286a may include contact plugs 278b, 281b, 283b, and 285b and barrier layers 278a, 281a, 283a, and 285a which cover side surfaces and bottom surfaces of the contact plugs 278b, 281b, 283b, and 285b. The contact plugs 278b, 281b, 283b, and 285b may correspond to the contact plugs 78b, 81b, 83b, and 85b described in FIGS. 1 and 3 and the barrier layers 278a, 281a, 283a, and 285a may correspond to the barrier layers 78a, 81a, 83a, and 85a described in FIGS. 1 and 3.

Peripheral word line contact structures 280b, 282b, 284b, and 286b may be disposed on the upper interconnection structure 248 of the second peripheral interconnection structure 250b. The peripheral word line contact structures 280b, 282b, 284b, and 286b may have the same structure as the peripheral word line contact structures 80b, 82b, 84b, and 86b described in FIGS. 1 and 3. Each of the peripheral word line contact structures 280b, 282b, 284b, and 286b may include contact plugs 278b, 281b, 283b, and 285b, and barrier layers 278a, 281a, 283a, and 285a which cover side surfaces and bottom surfaces of the contact plugs 278b, 281b, 283b, and 285b.

Well contact structures 280c, 282c, and 284c having the same structure as the well contact structures 80c, 82c, and 84c described with reference to FIG. 1 may be disposed on the semiconductor pattern 252.

Cell gate contact structures 280d, 282d, 284d, and 286d may be disposed on the cell gates CG to be electrically connected to the cell gates CG. The cell gate contact structures 280d, 282d, 284d, and 286d may have the same structure as the cell gate contact structures 80d, 82d, 84d, and 86d described in FIGS. 1 and 3.

Cell bit line contact structures 282e, 284e, and 286e may be disposed to be electrically connected to the cell vertical structures CV. The cell bit line contact structures 282e, 284e, and 286e may have the same structure as the cell bit line contact structures 82e, 84e, and 86e described in FIGS. 1 and 3.

A bit line connection structure 288a may be disposed to electrically connect the cell bit line contact structures 282e, 284e, and 286e to the peripheral bit line contact structures 280a, 282a, 284a, and 286a. A word line connection structure 288b may be disposed to electrically connect the cell gate contact structures 280d, 282d, 284d, and 286d to the peripheral word line contact structures 280b, 282b, 284b, and 286b. Each of the bit line connection structure 288a and the word line connection structure 288b may include a connection interconnection layer 287b and a barrier layer 287a which covers a bottom surface and side surfaces of the connection interconnection layer 287b.

An upper interlayer insulating layer UILD may be disposed on the semiconductor pattern 252 and the intermediate interlayer insulating layer MILD. The upper interlayer insulating layer UILD may cover the cell gates CG, the cell vertical structures CV, the cell bit line contact structures 282e, 284e, and 286e, the peripheral bit line contact structures 280a, 282a, 284a, and 286a, the bit line connection structure 288a, the cell gate contact structures 280d, 282d, 284d, and 286d, the peripheral word line contact structures 280b, 282b, 284b, and 286b, and the word line connection structure 288b.

A metal interconnection 292 may be disposed on the upper interlayer insulating layer UILD. The metal interconnection 292 may include a barrier layer 291a and a metal layer 291b disposed on the barrier layer 291a. An angle between an upper surface of the metal interconnection 292 and a side surface thereof may be an obtuse angle.

A contact structure 290 including a contact plug 289b and a barrier layer 289a which covers side surfaces and a bottom surface of the contact plug 289b may be disposed under the metal interconnection 292.

In example embodiments, at least one or all of the lower interconnection 216L, the first intermediate interconnection 224L, and the second intermediate interconnection 232L may be formed of a refractory metal having a tensile stress characteristic, for example, tungsten formed using a CVD process. The cell gates CG may include a refractory metal having a tensile stress characteristic, for example, tungsten formed using a CVD process.

The upper interconnection 246 of the upper interconnection structure 248 may be formed of a metal material having a different stress characteristic from the lower interconnection 216L, the first intermediate interconnection 224L, the second intermediate interconnection 232L, and the cell gates CG. For example, the upper interconnection 246 may be formed to have stress capable of limiting (and/or suppressing) the warpage of the semiconductor substrate 2 in consideration of the warpage of the semiconductor substrate 2 including the lower interconnection 216L, the first intermediate interconnection 224L, the second intermediate interconnection 232L, and the cell gates CG. The upper interconnection 246 may be formed of a refractory metal having a different stress characteristic from the tensile stress of the lower interconnection 216L, the first intermediate interconnection 224L, the second intermediate interconnection 232L, and the cell gates CG, for example, a compressive stress characteristic. For example, the upper interconnection 246 may be formed of tungsten, which is formed by a PVD process capable of adjusting the stress.

The upper interconnection 246 of the upper interconnection structure 248 may be formed of a refractory metal formed using a PVD process, and the upper contact plug 242 may be formed of a refractory metal formed using a CVD process. However, example embodiments of inventive concepts are not limited thereto.

Another example of the upper interconnection structure 248 will be described with reference to FIGS. 9A, 9B, and 10.

Figure 9A:
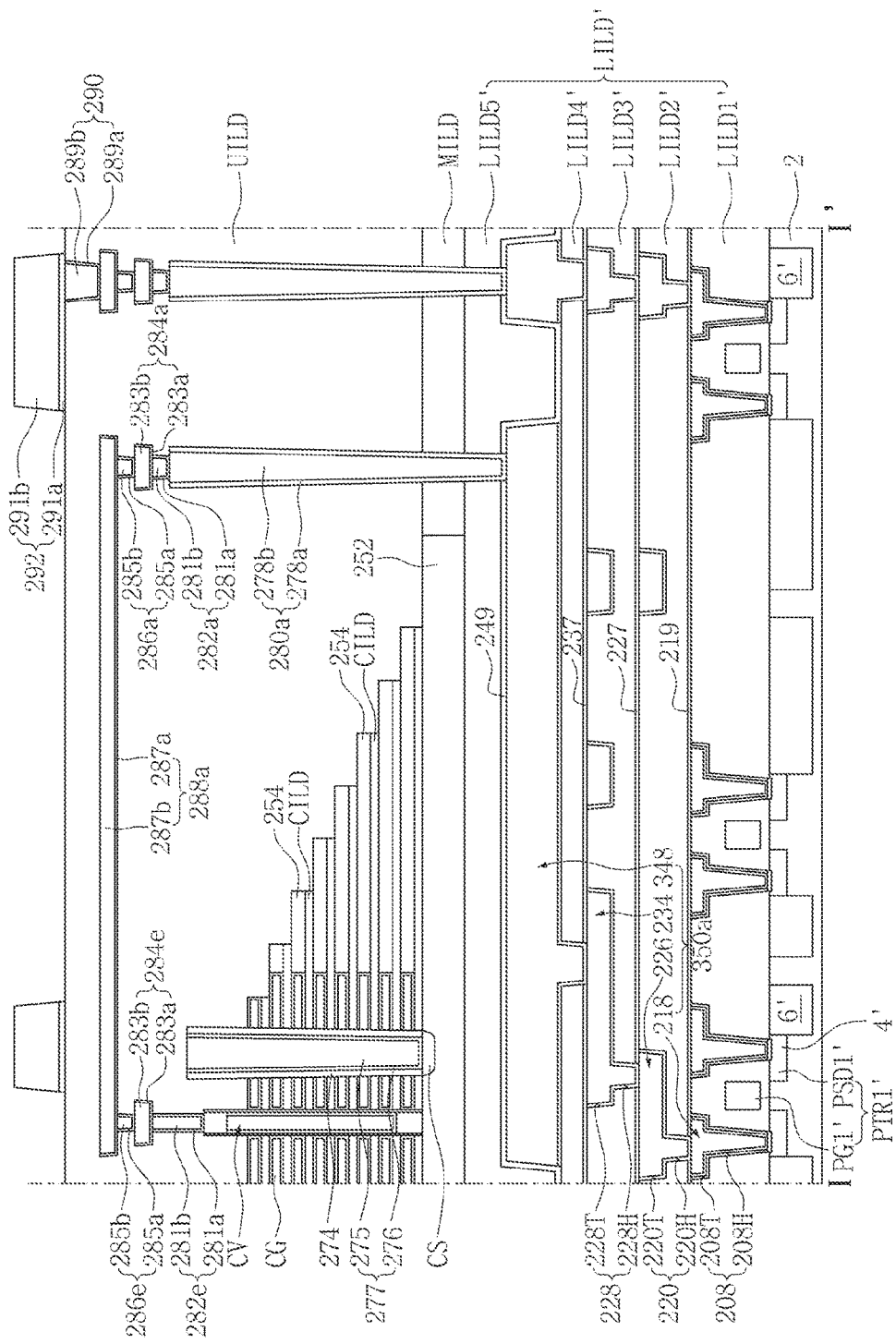
FIGS. 9A and 9B are cross-sectional views showing a modified example of a semiconductor device in accordance with example embodiments of inventive concepts.
Figure 9B:
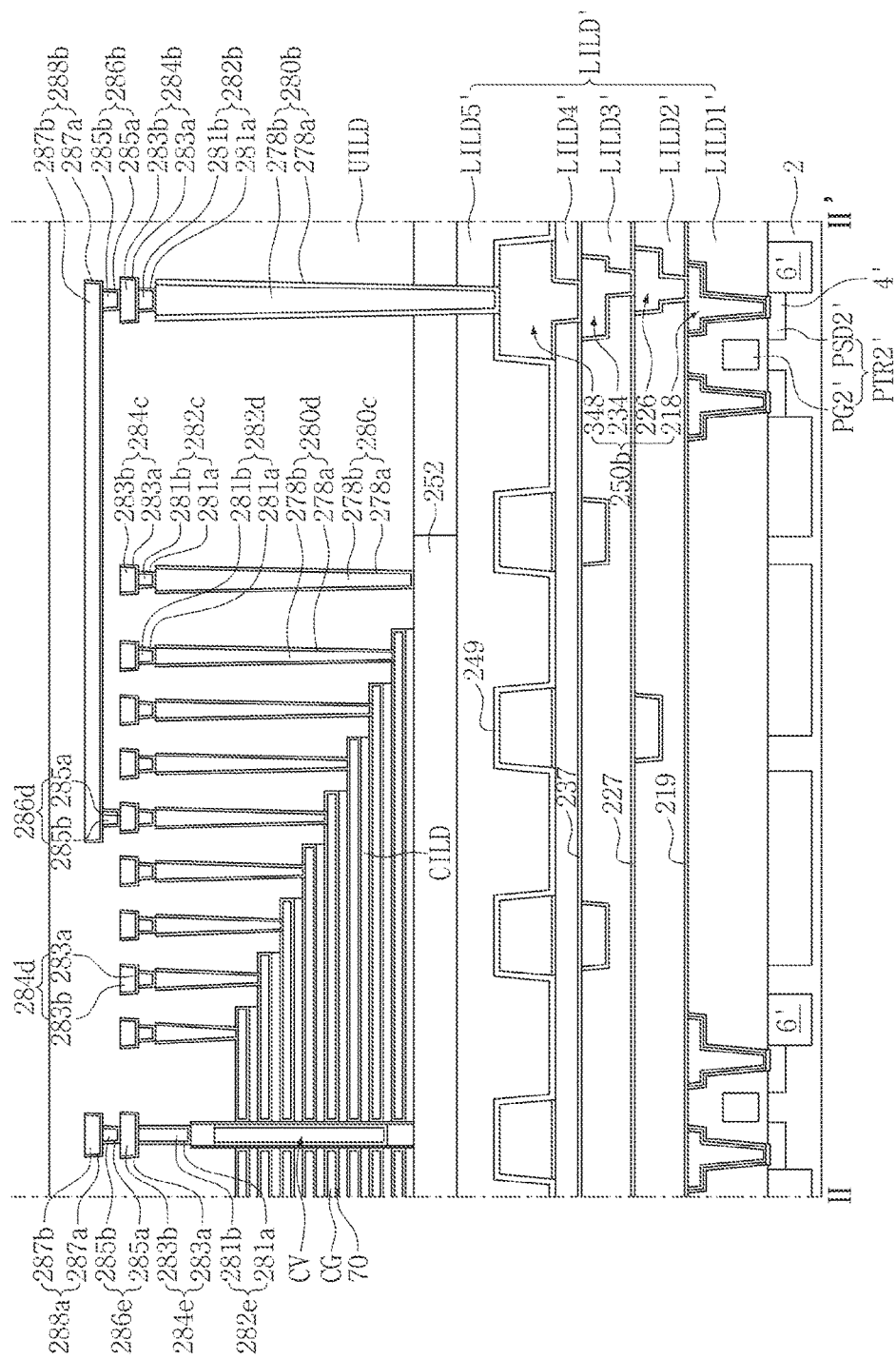
Figure 10:
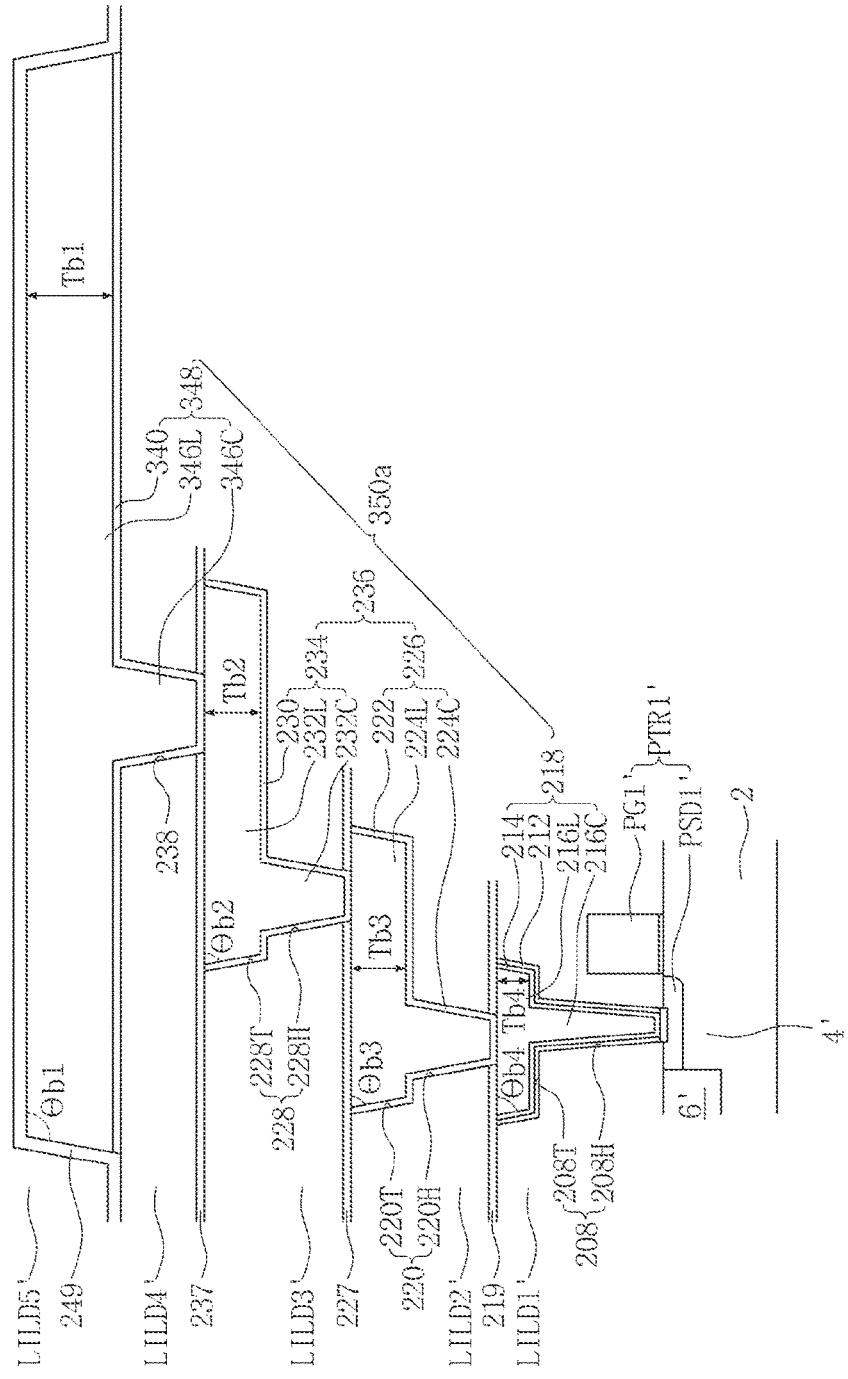
FIG. 10 is an enlarged cross-sectional view showing some components of FIG. 9A.
Figure 11A:
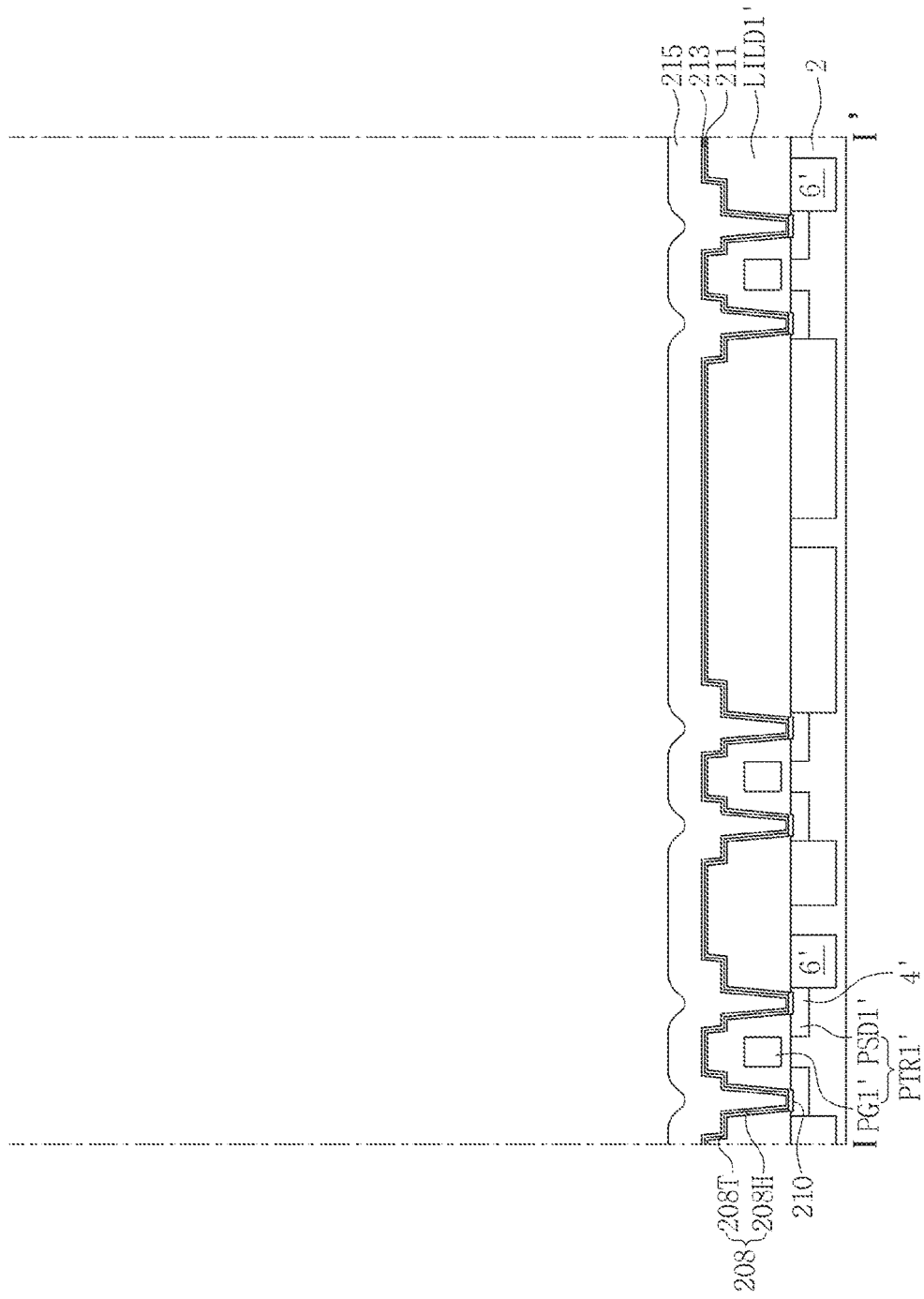
FIGS. 11A to 20B are cross-sectional views showing an example of a method of forming a semiconductor device in accordance with example embodiments of inventive concepts.
Figure 11B:
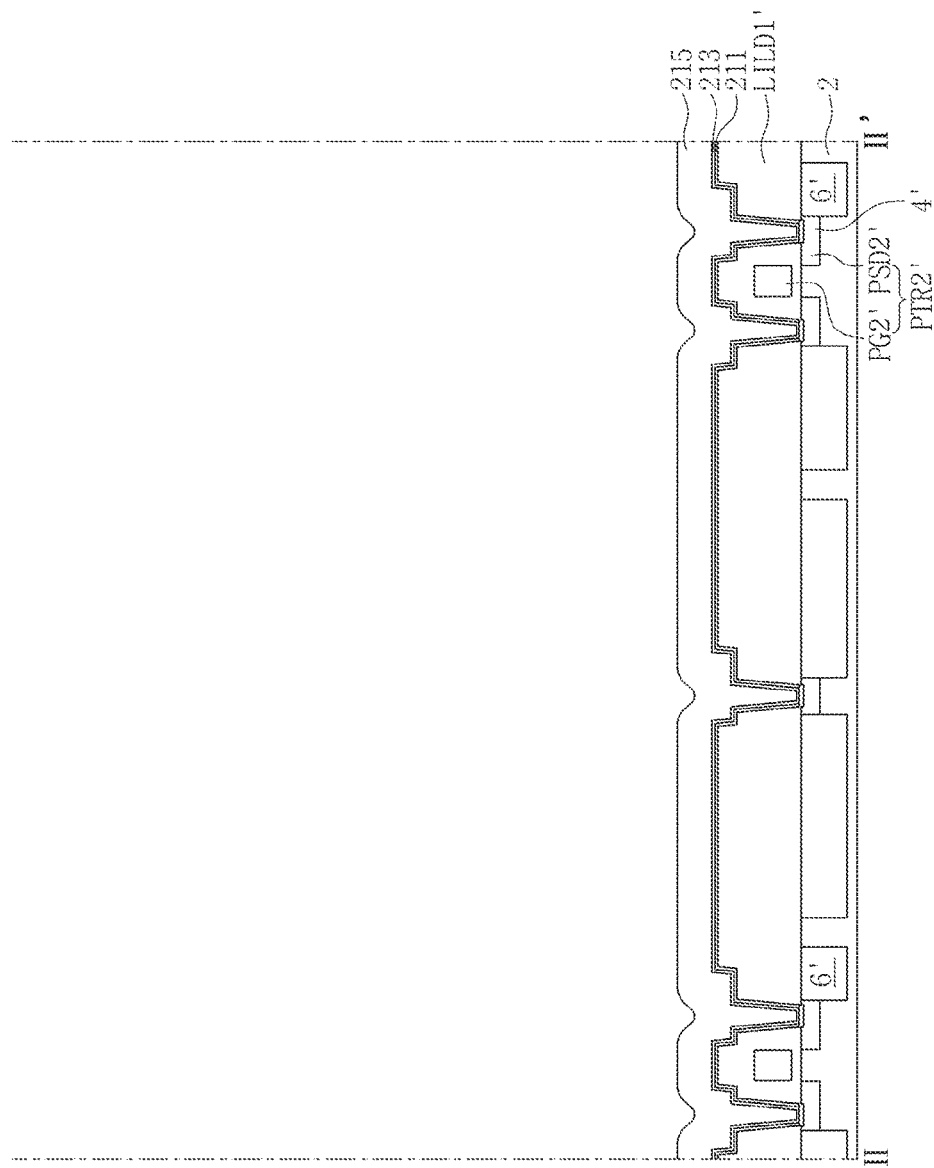
Figure 12A:
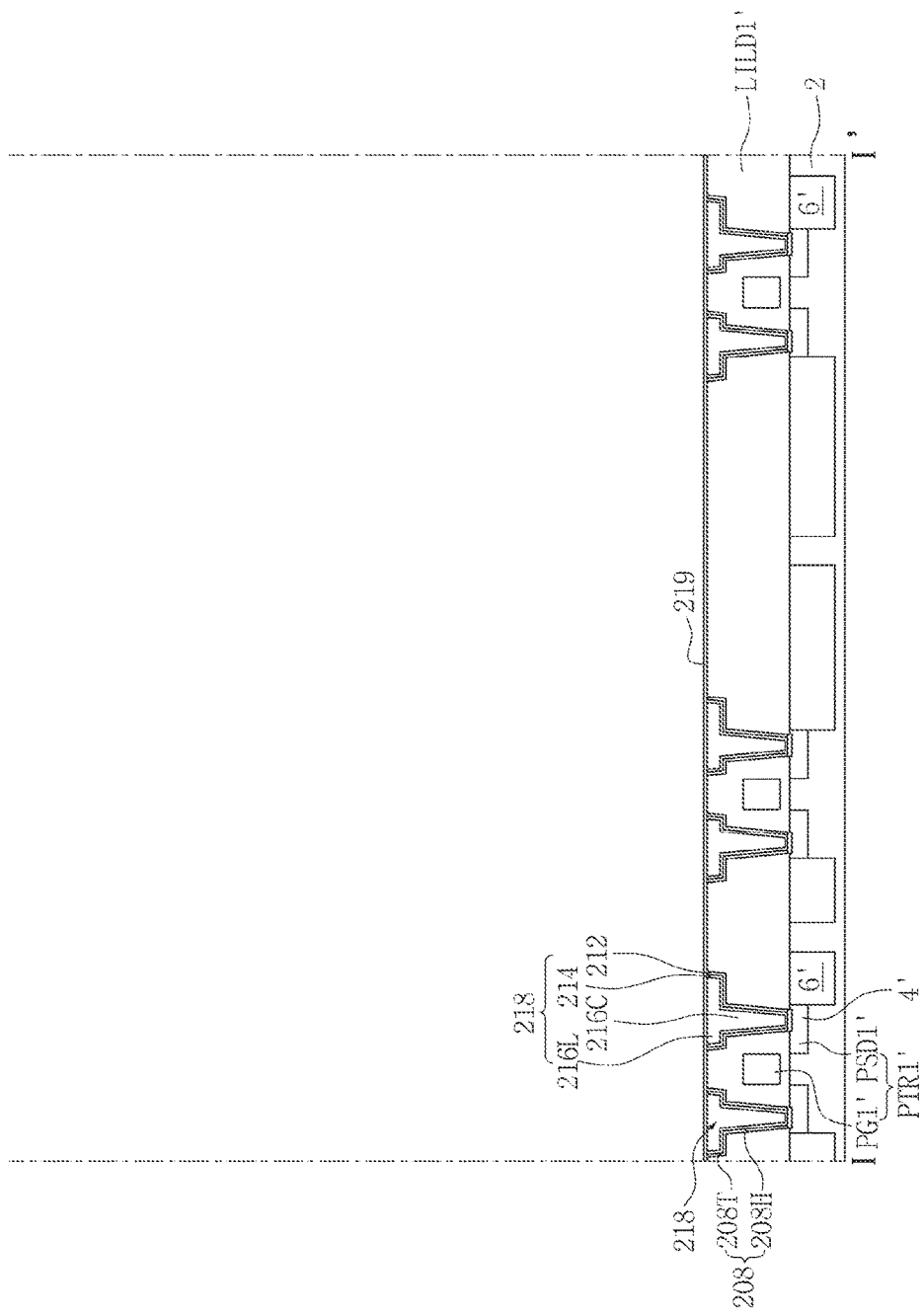
Figure 12B:
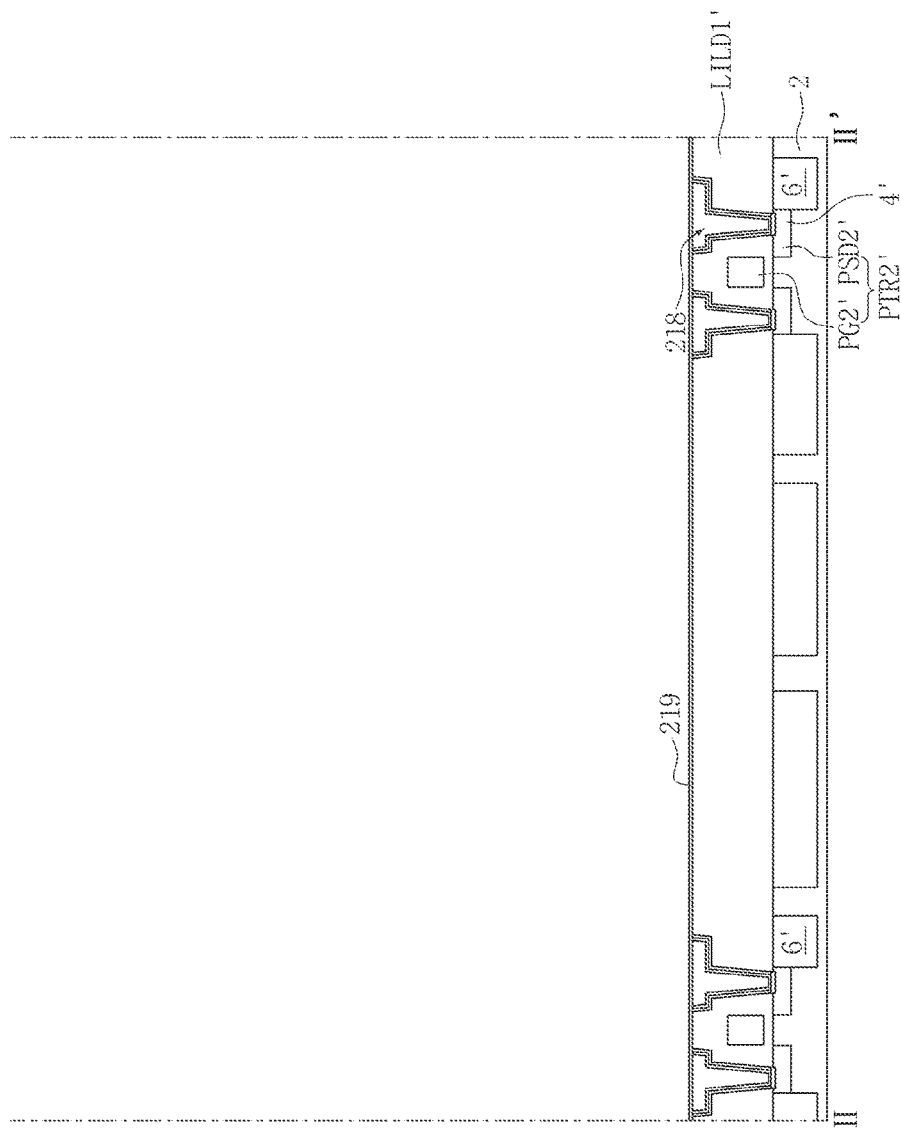
Figure 13A:
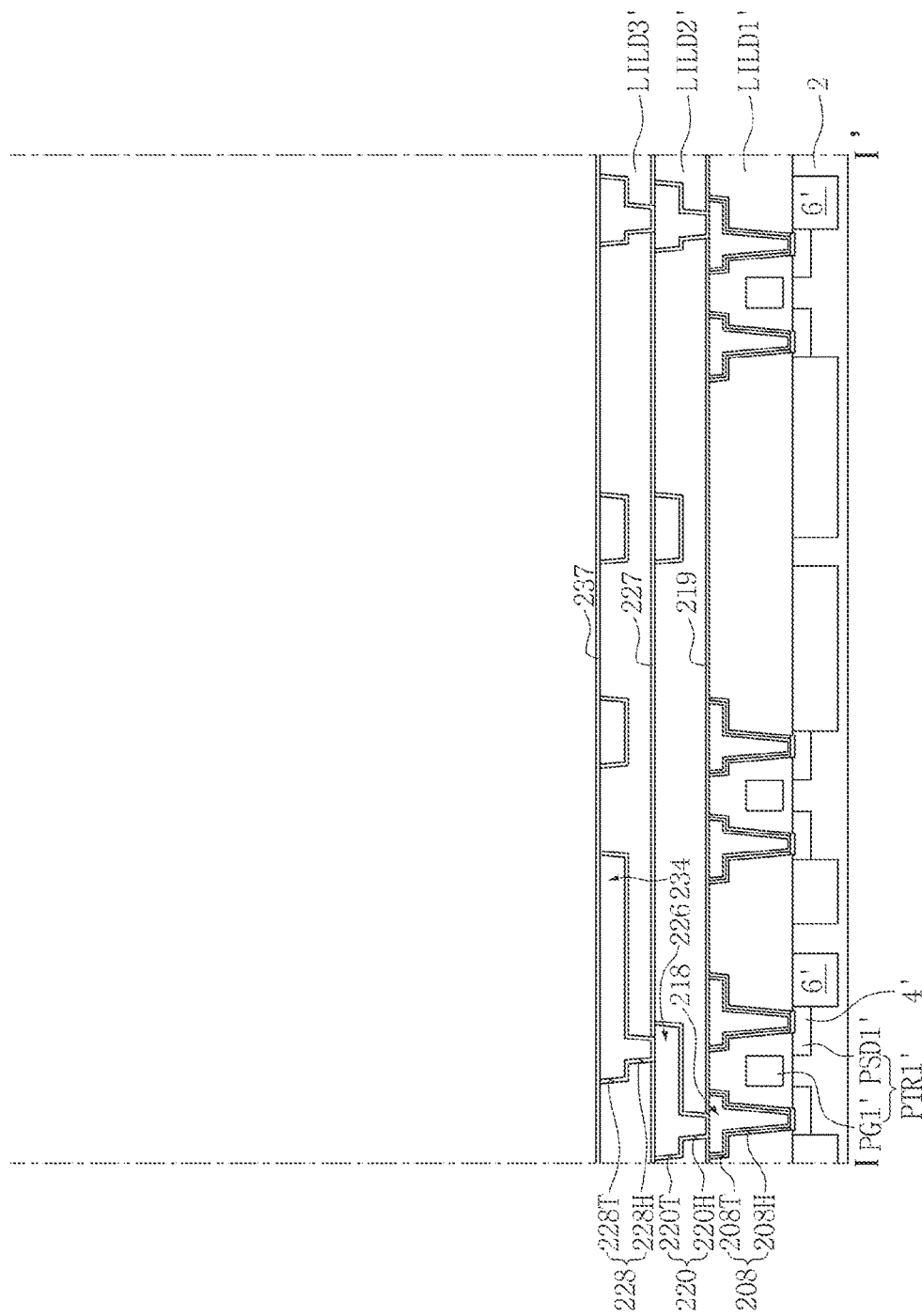
Figure 13B:
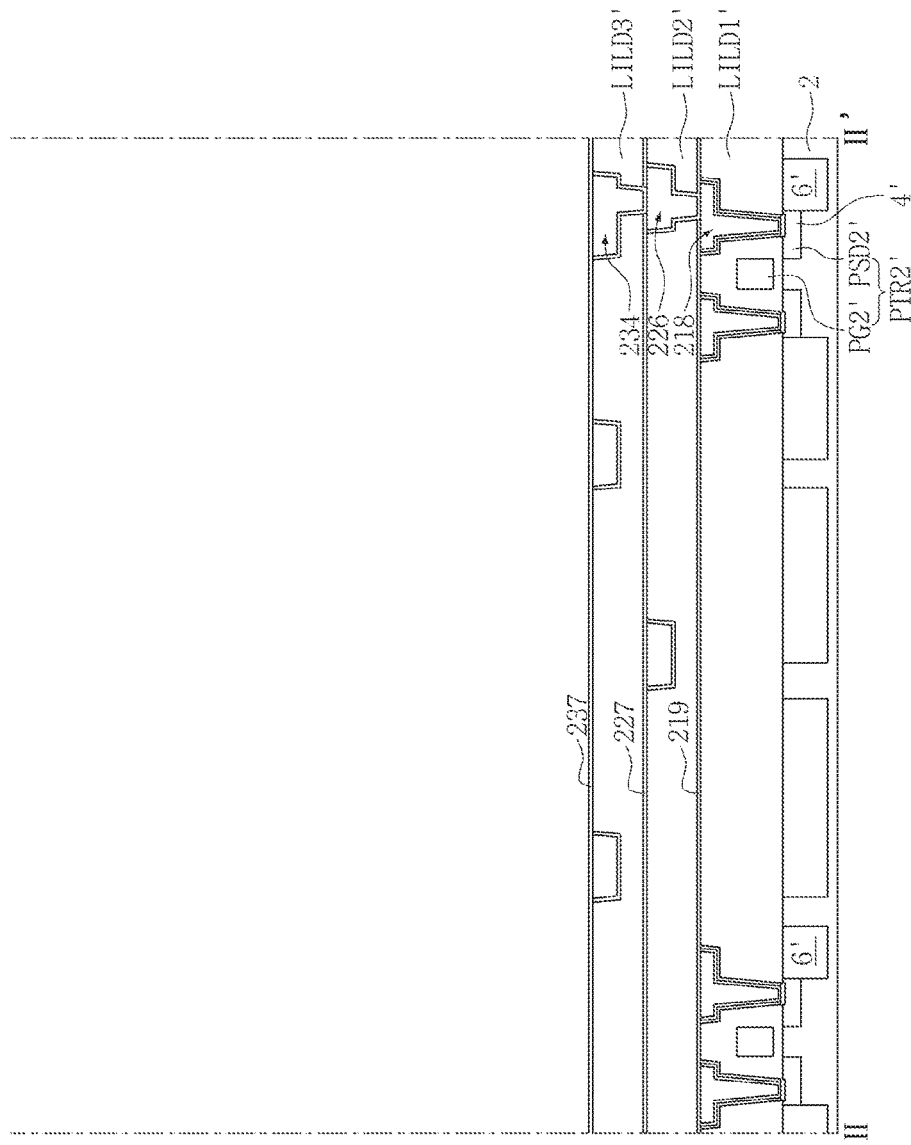
Figure 14A:
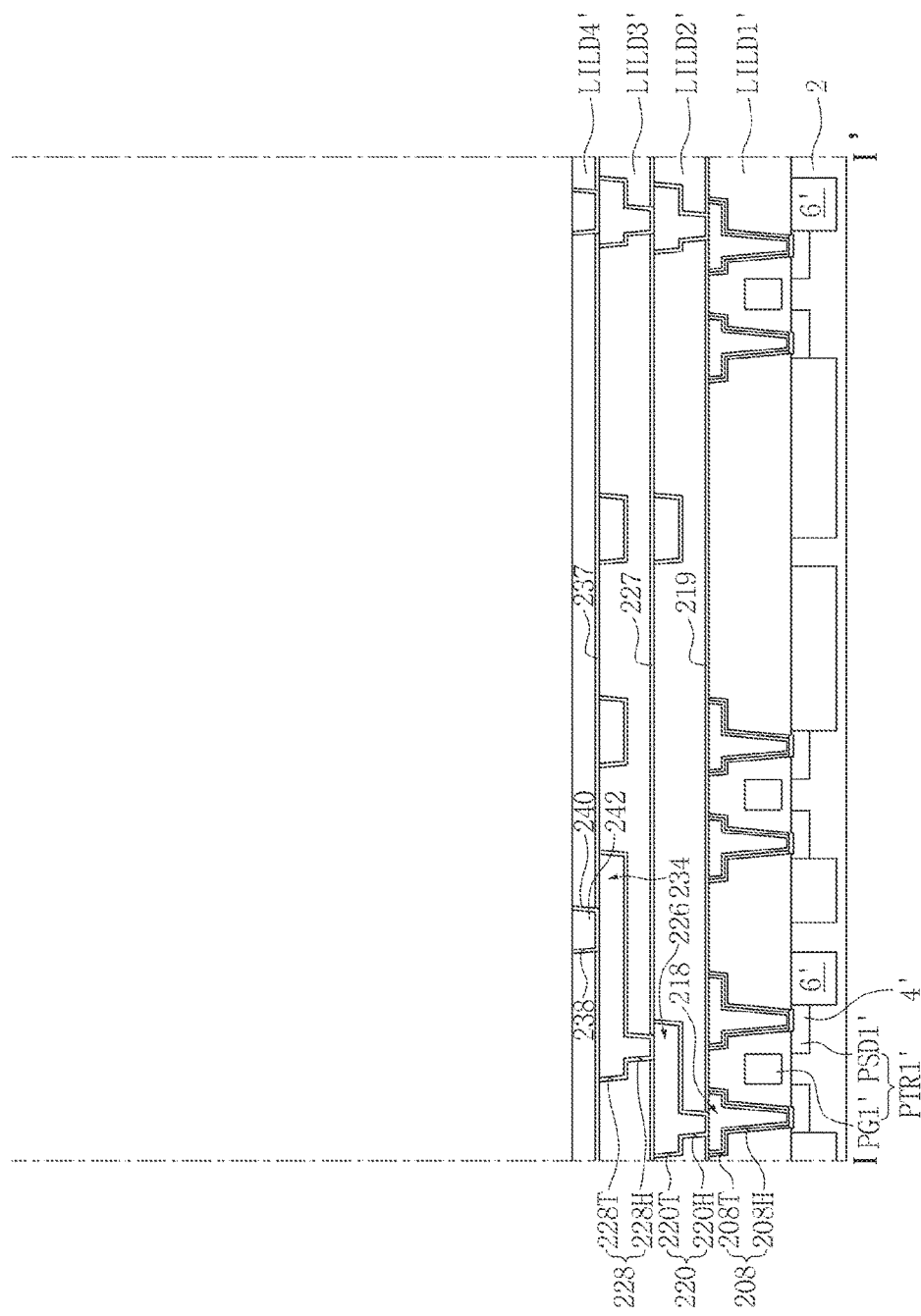
Figure 14B:
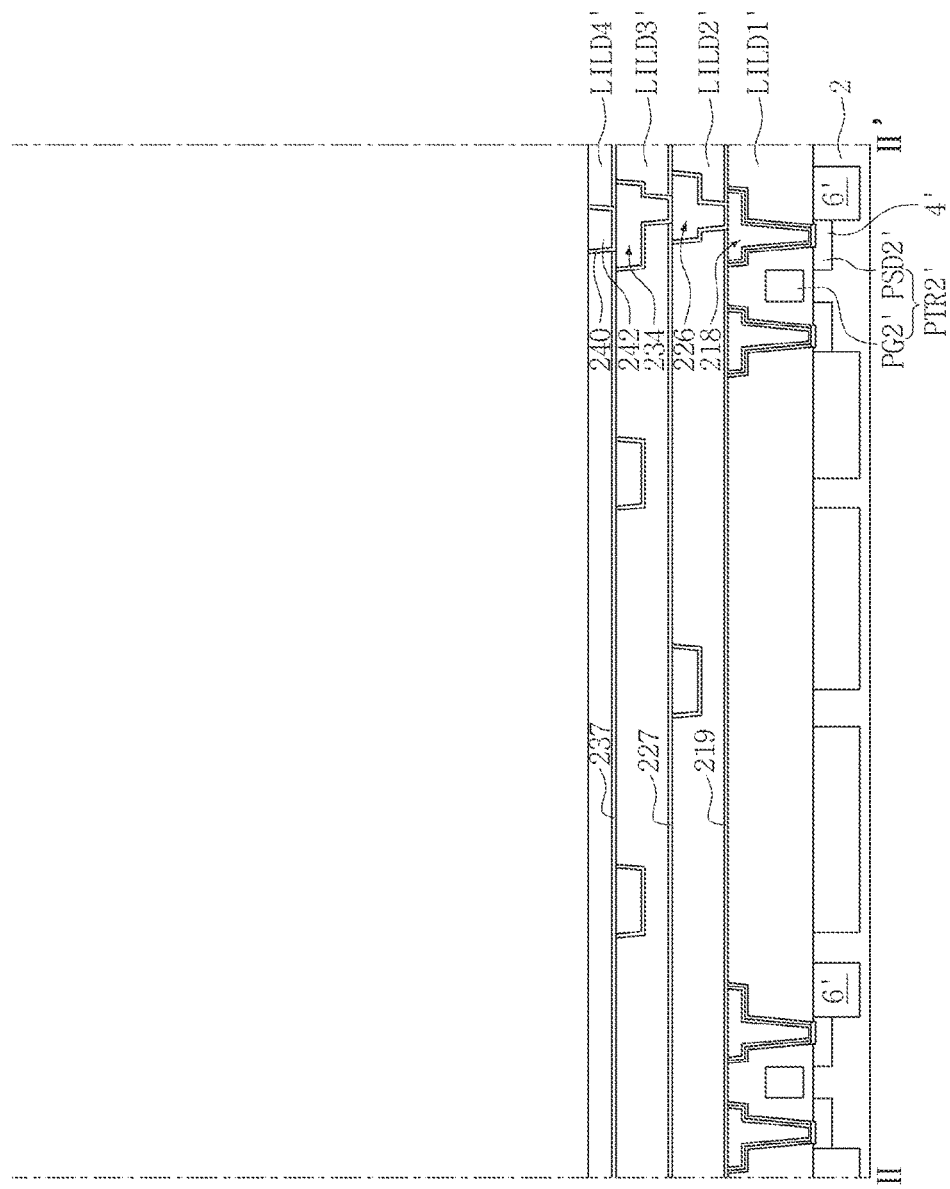
Figure 15A:
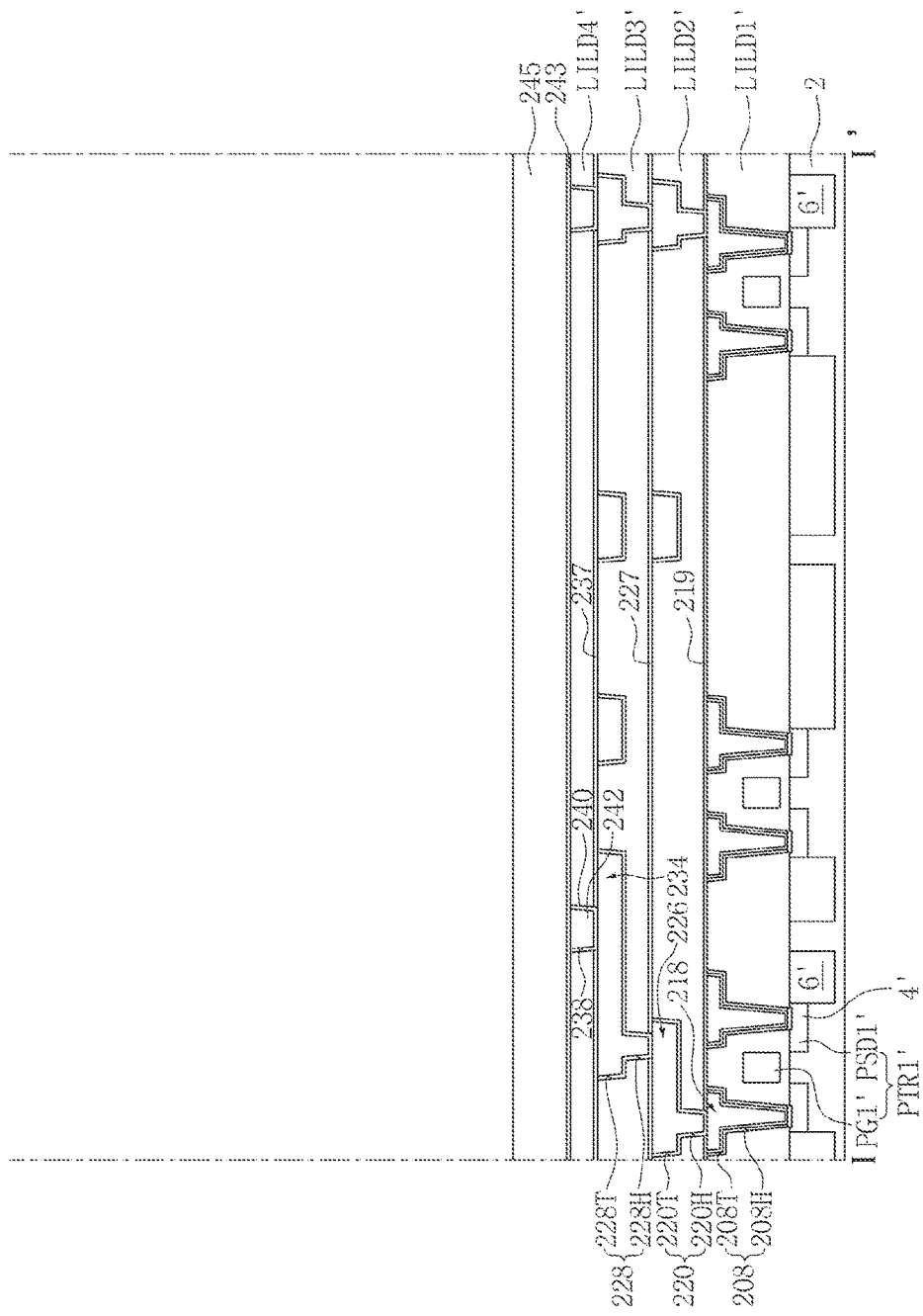
Figure 15B:
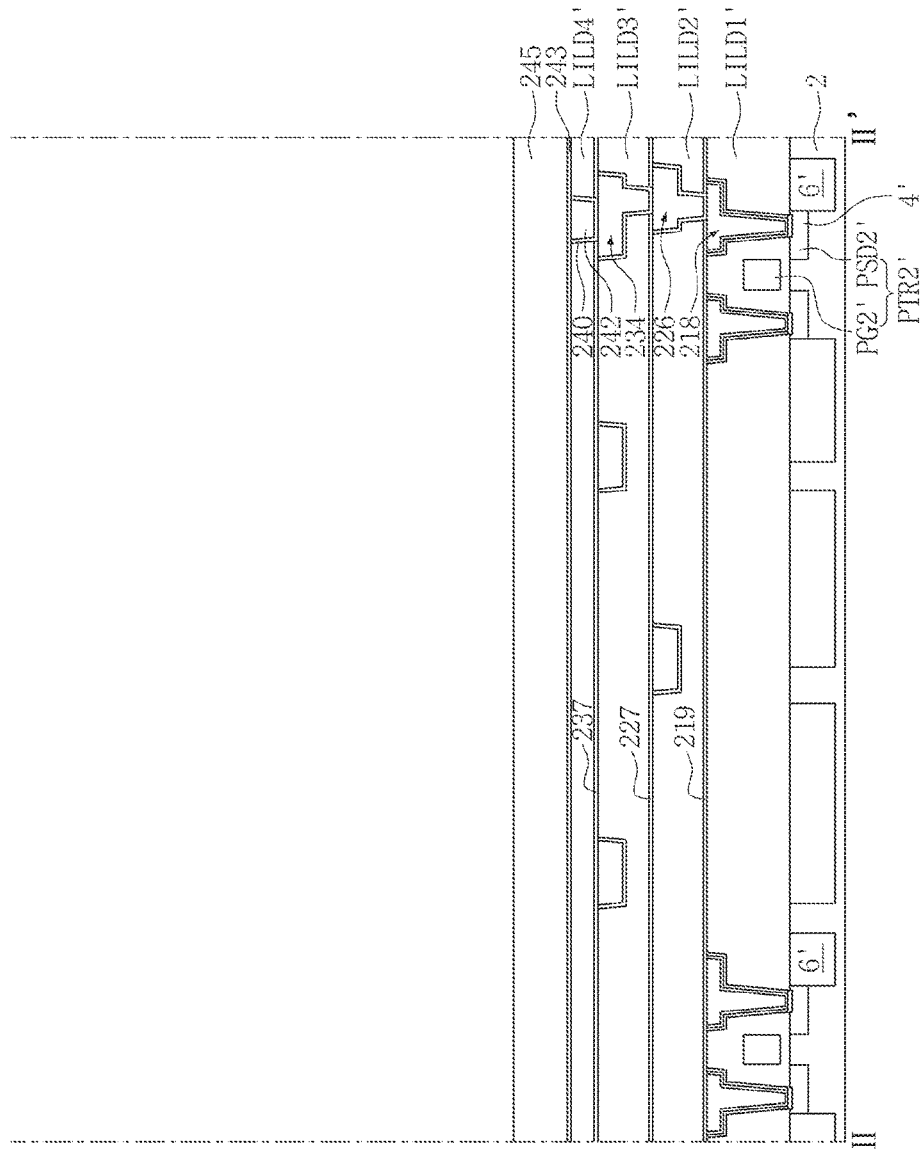
Figure 16A:
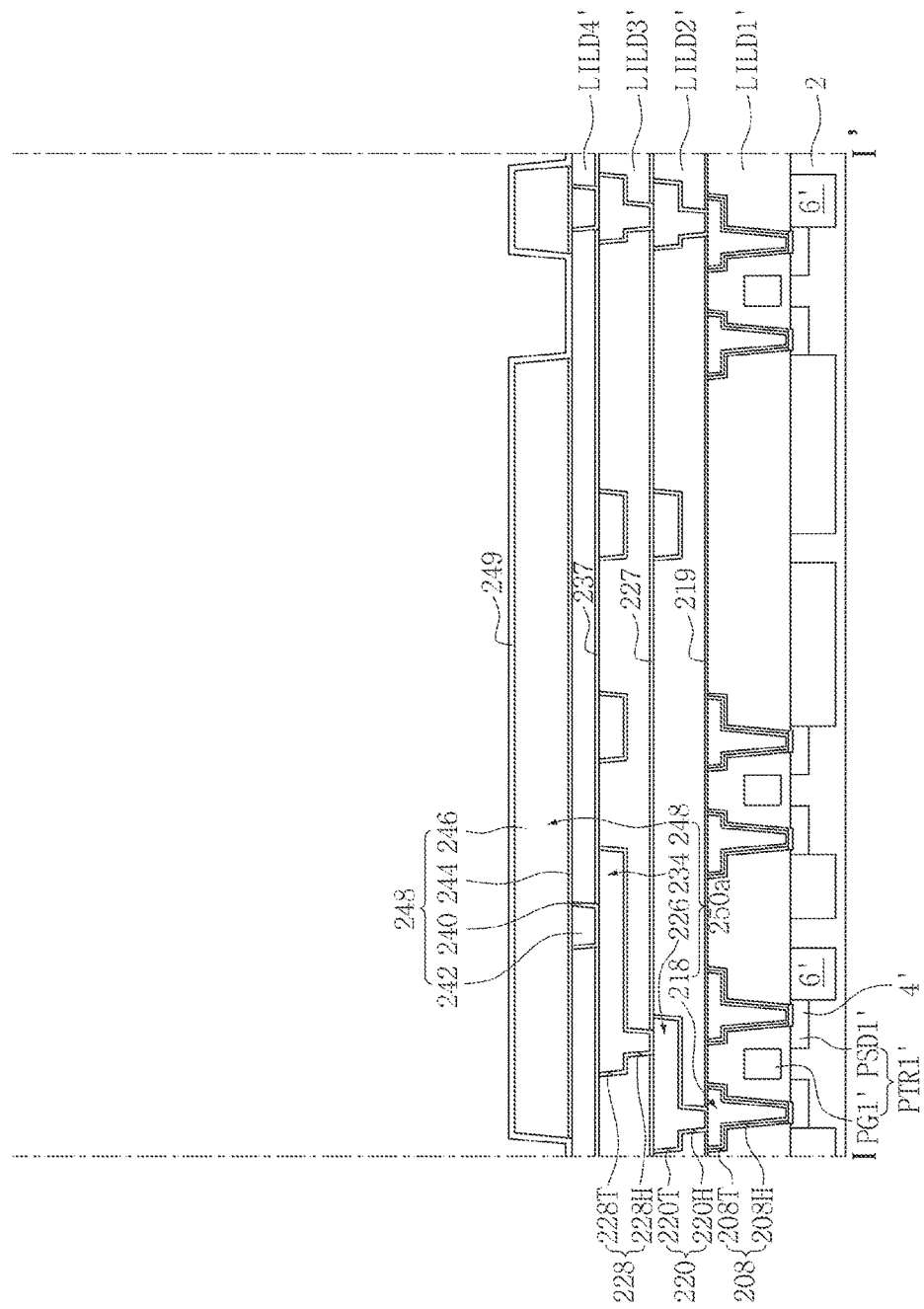
Figure 16B:
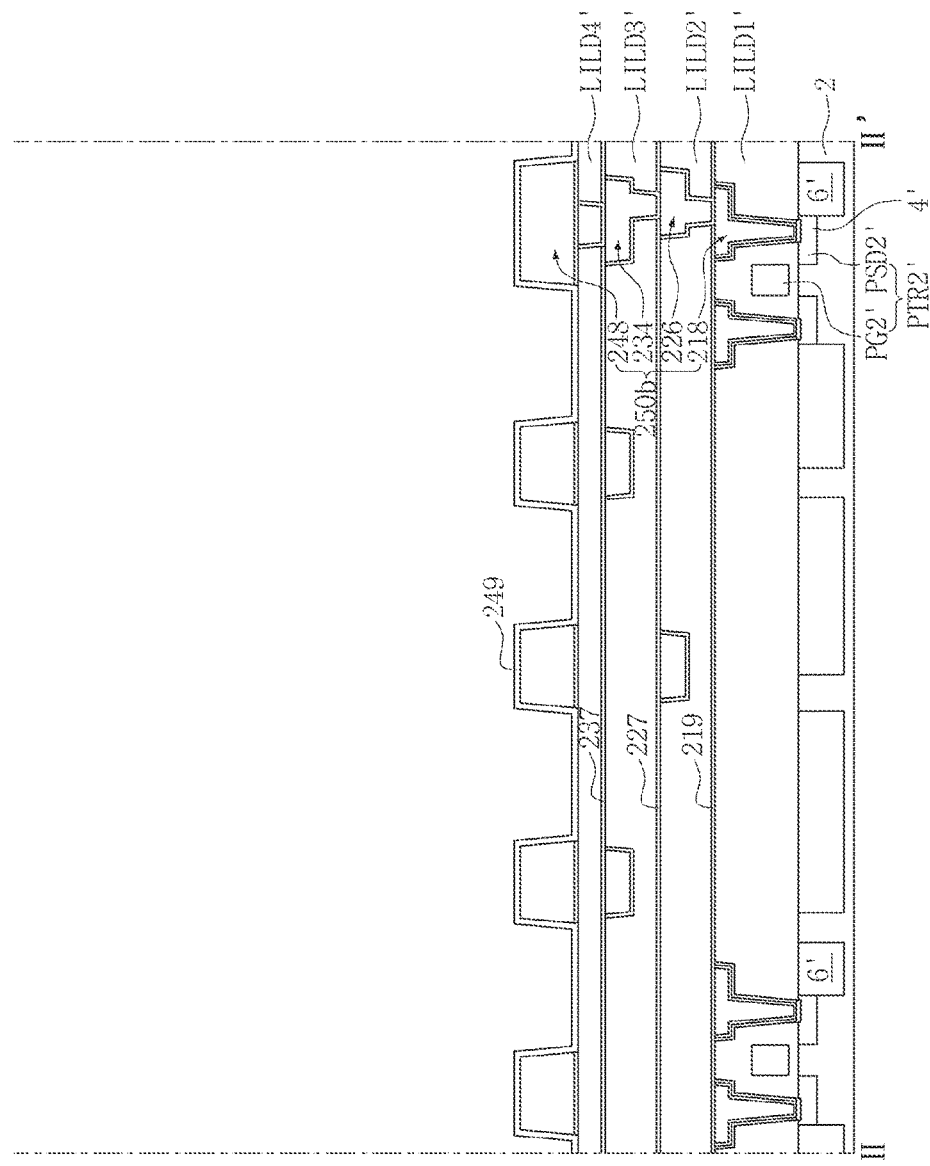
Figure 17A:
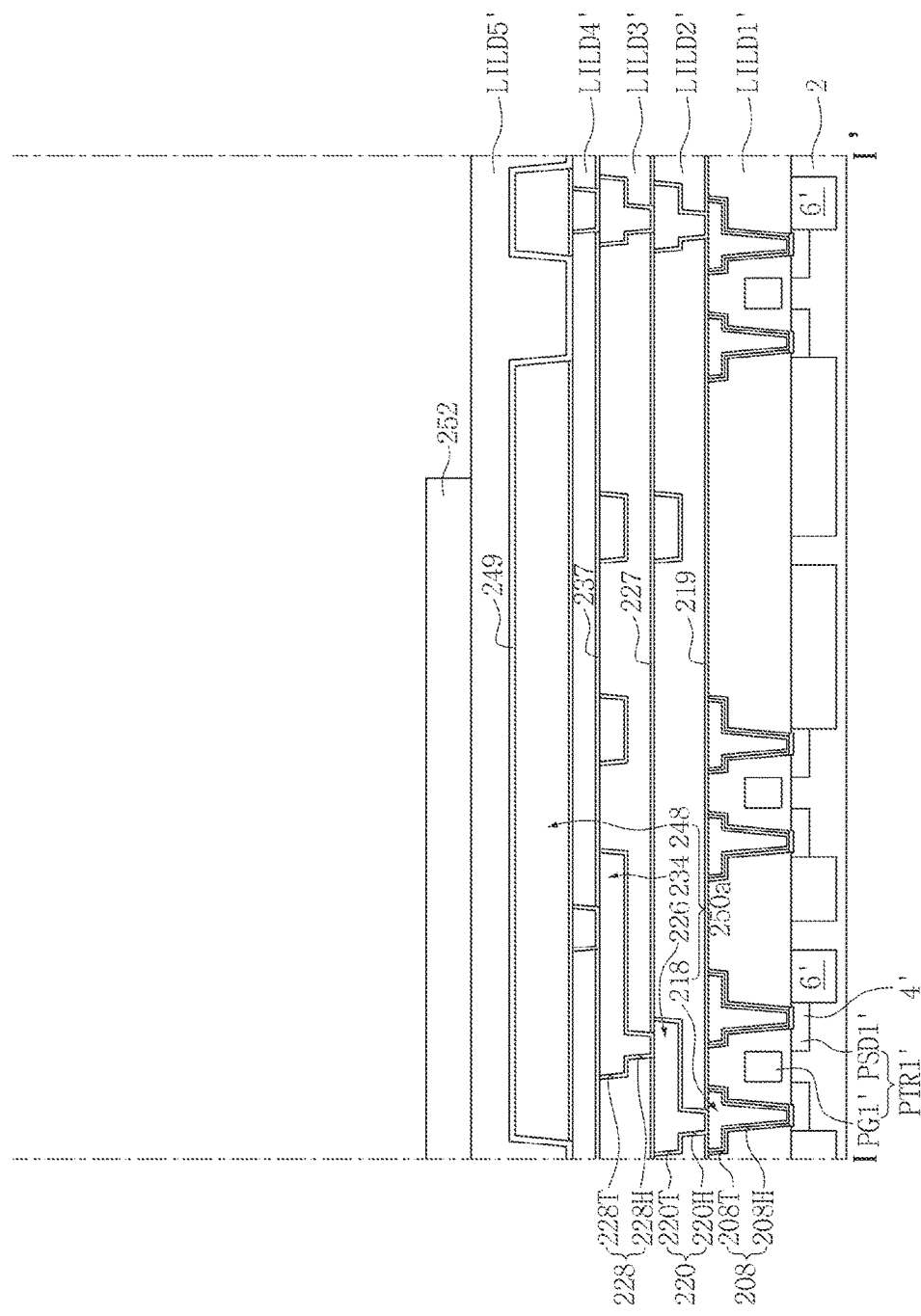
Figure 17B:
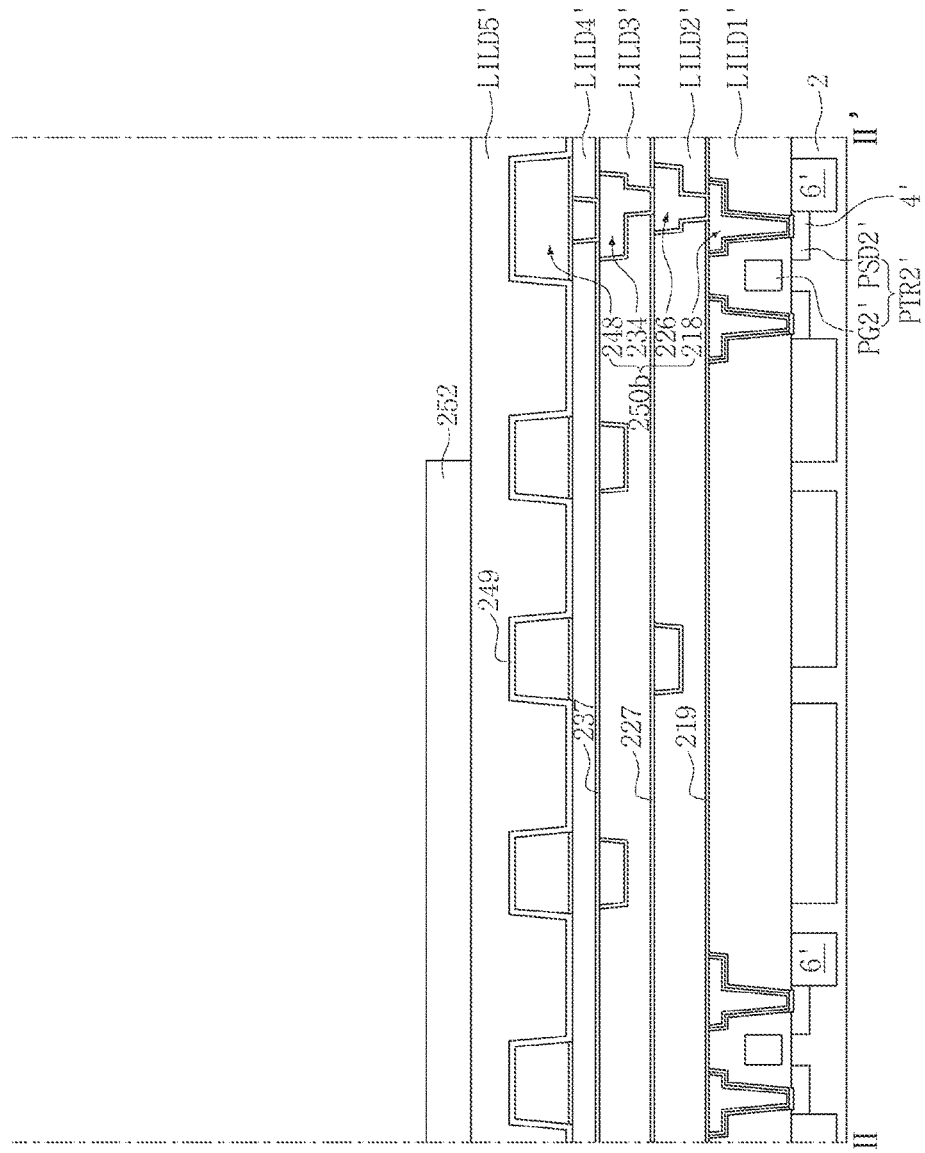
Figure 18A:
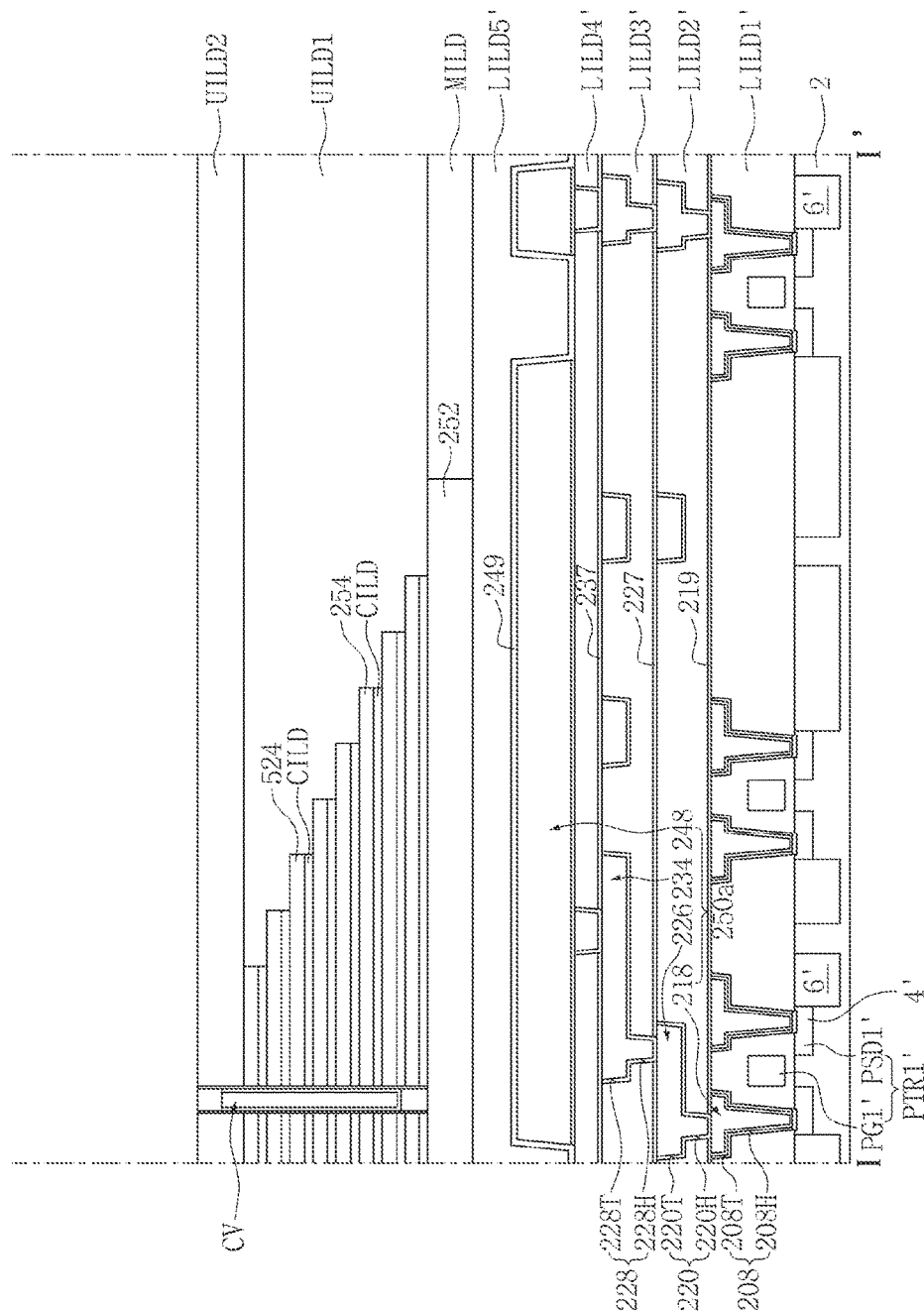
Figure 18B:
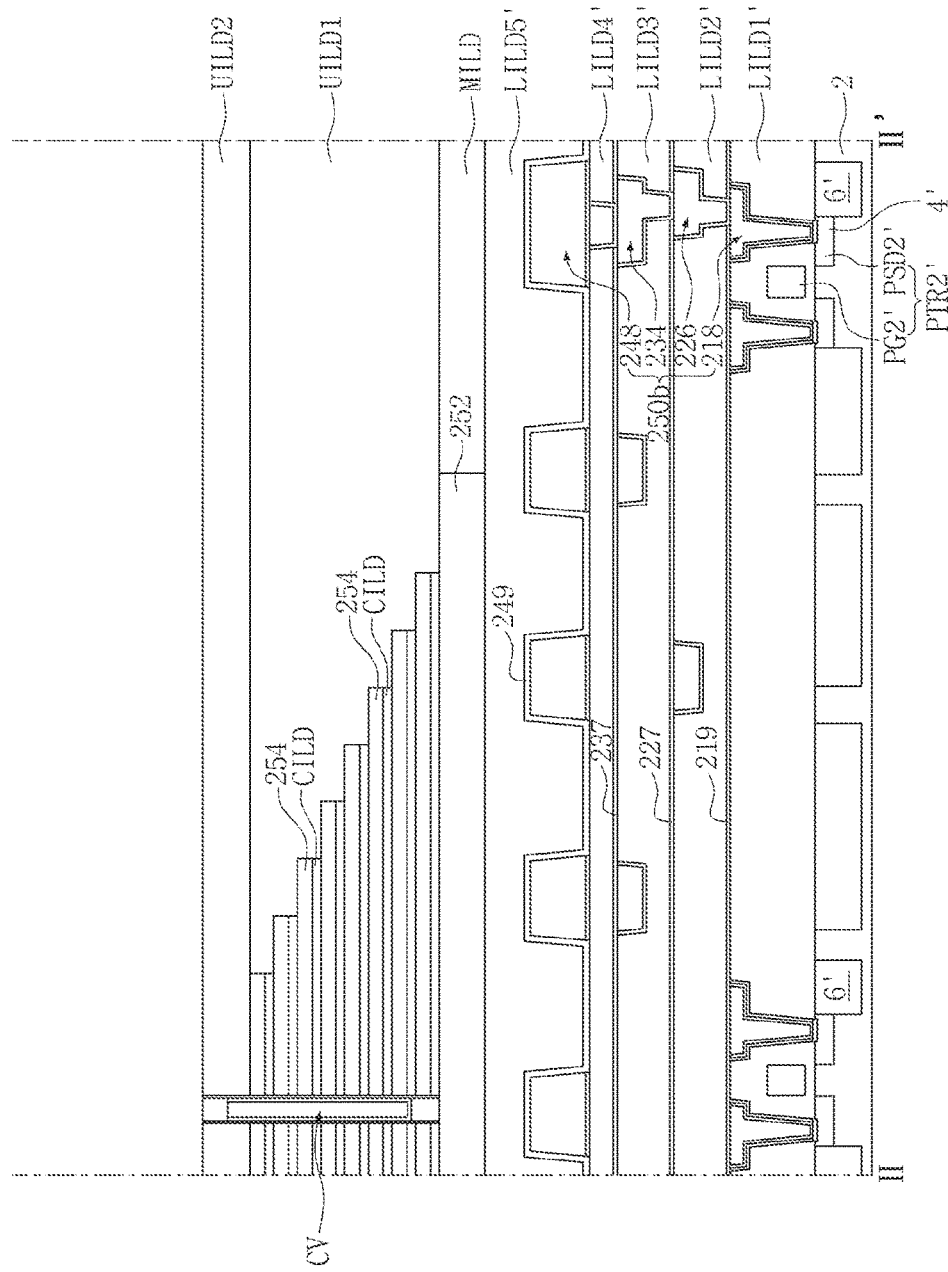
Figure 19A:
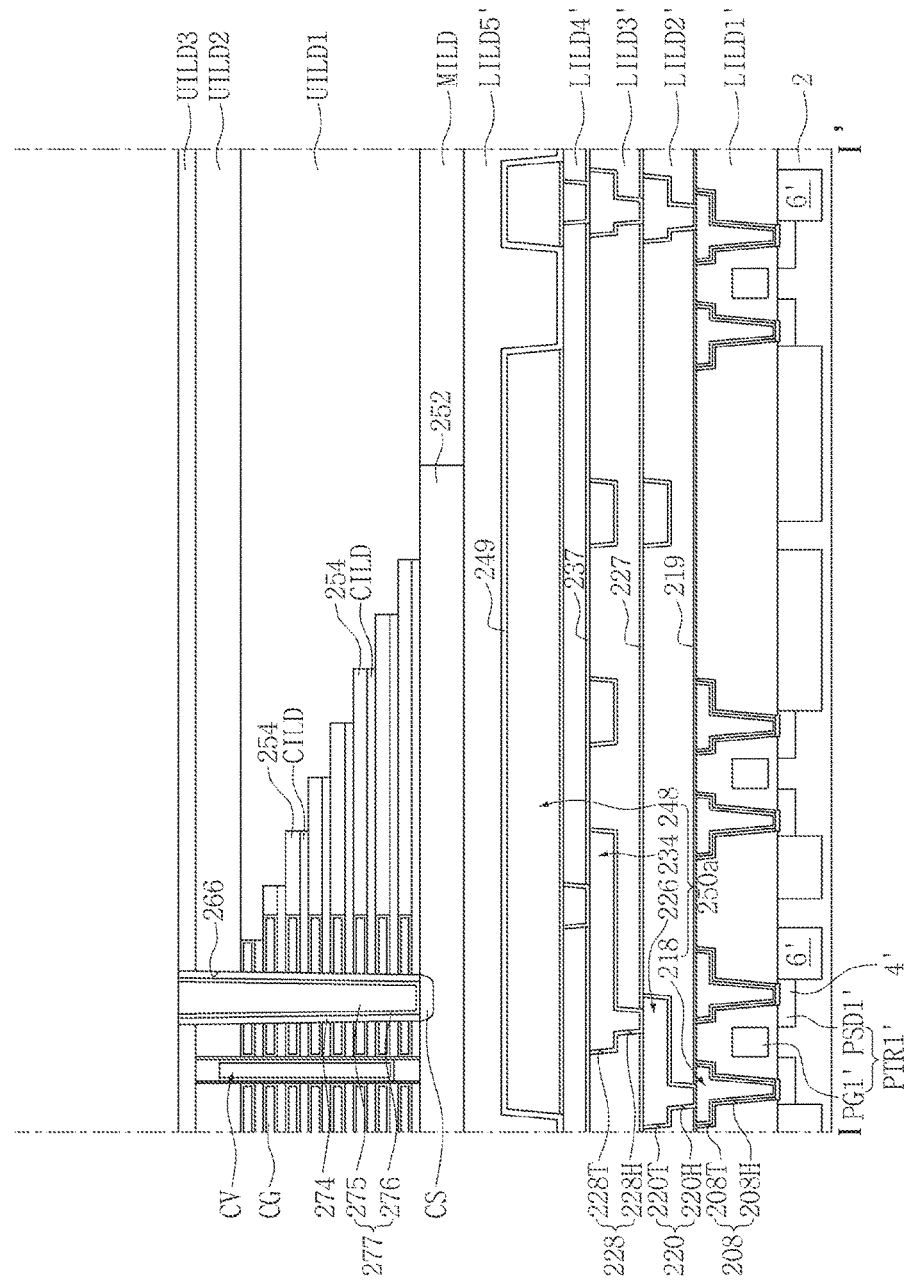
Figure 19B:
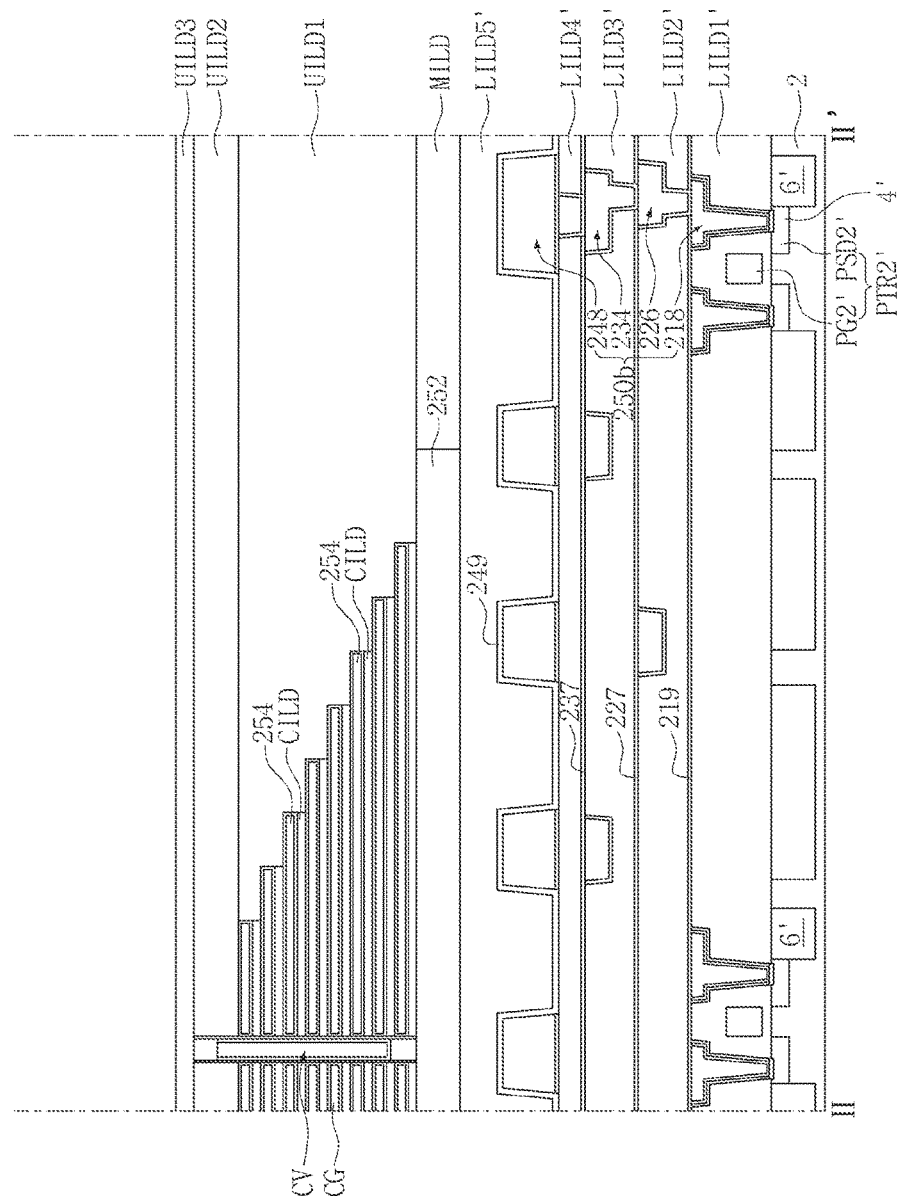
Figure 20A:
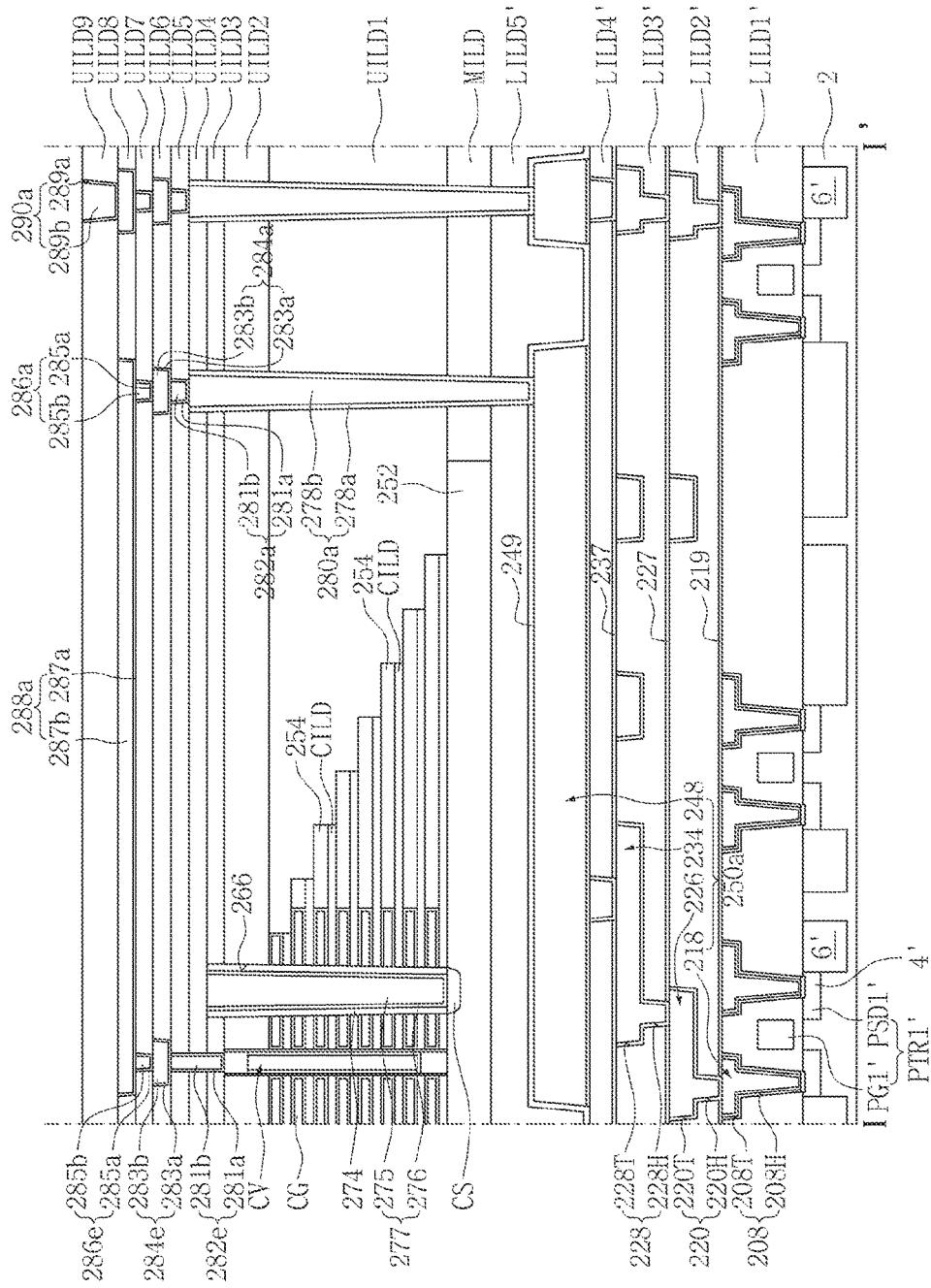
Figure 20B:
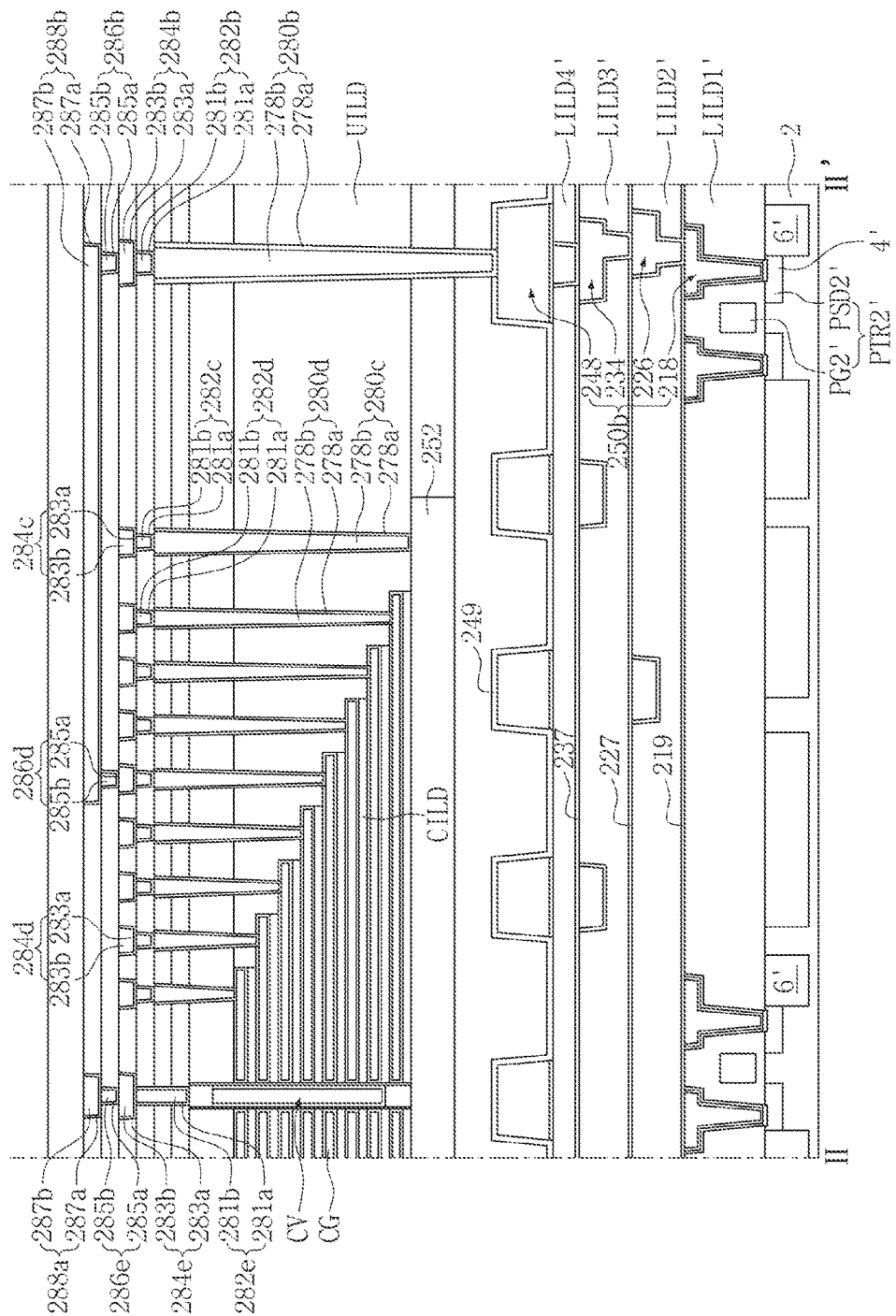

Referring to FIGS. 9A, 9B, and 10, an upper interconnection structure 348 may include an upper contact plug 346C, an upper interconnection 346L, and an upper barrier layer 340. The upper contact plug 346C and the upper interconnection 346L may be integrally formed. The upper barrier layer 340 may cover a bottom surface and side surfaces of the upper contact plug 346C and a bottom surface of the upper interconnection 346L. The upper barrier layer 340 may not cover side surfaces of the upper interconnection 346L.

The lower interconnection structure 218 and the intermediate interconnection structure 236 described in FIGS. 7A, 7B, and 8 and the upper interconnection structure 348 may constitute first and second peripheral interconnection structures 350a and 350b.

An angle θb1 between an upper surface of the upper interconnection 346L and a side surface thereof may be an obtuse angle similar to the upper interconnection 246 described in FIGS. 7A, 7B, and 8. Further, the upper interconnection 346L may have a greater thickness Tb1 than the thicknesses Tb2 and Tb3 of the first and second intermediate interconnections 224L and 232L and the thickness Tb4 of the lower interconnection 216L similar to the upper interconnection 246 described in FIGS. 7A, 7B, and 8.

Next, a method of forming a semiconductor device in accordance with example embodiments of inventive concepts will be described with reference to FIGS. 6A, 6B, and 11A to 20B. FIGS. 11A to 20B are cross-sectional views showing an example of a method of forming a semiconductor device in accordance with example embodiments of inventive concepts. FIGS. 11A, 12A, 13A, 14A, 15A, 16A, 17A, 18A, 19A, and 20A are cross-sectional views showing regions taken along line I-I' of FIGS. 6B, and 11B, 12B, 13B, 14B, 15B, 16B, 17B, 18B, 19B, and 20B are cross-sectional views showing regions taken along line II-II' of FIG. 6B.

Referring to FIGS. 6A, 6B, 11A, and 11B, a semiconductor substrate 2 may be provided. The semiconductor substrate 2 may be a single crystal silicon substrate. An isolation region 6' which defines an active region 4' may be formed on the semiconductor substrate 2.

Individual elements constituting circuits may be formed on the semiconductor substrate 2. The circuits may be X decoders XDEC, peripheral circuits PERI, and page buffers PGBUF.

The individual elements constituting the circuits may include a first peripheral transistor PTR1' and a second peripheral transistor PTR2'. The first peripheral transistor PTR1' may include a first peripheral gate PG1' and a first source/drain region PSD1', and the second peripheral transistor PTR2' may include a second peripheral gate PG2' and a second source/drain region PSD2'.

In example embodiments, the first peripheral transistor PTR1' may be a transistor constituting the peripheral circuit PERI, and the second peripheral transistor PTR2' may be a transistor constituting the X decoder XDEC.

A first lower interlayer insulating layer LILD1' may be formed on the semiconductor substrate 2 having the first and second peripheral transistors PTR1' and PTR2'. The first lower interlayer insulating layer LILD1' may be formed of an insulating material such as a silicon oxide-based insulating material.

A lower opening 208 including a lower contact hole 208H passing through the first lower interlayer insulating layer LILD1' and a lower interconnection trench 208T crossing an upper portion of the lower contact hole 208H may be formed using a dual damascene process.

A conductive layer 211 and a barrier layer 213 may be sequentially formed on the semiconductor substrate 2 having the lower opening 208. The conductive layer 211 may be formed of a metal material, for example, Ti, and the barrier layer 213 may be formed of a metal nitride, for example, TiN. By performing a thermal treatment process, a metal-silicide layer 210 may be formed by reaction of the conductive layer 211 and the semiconductor substrate 2. The metal-silicide layer 210 may be formed on the source/drain regions PSD1' and PSD2'. An interconnection material layer 215 may be formed on the barrier layer 213. The interconnection material layer 215 may be formed of a refractory metal having a tensile stress characteristic (e.g., tungsten) and may be formed using a CVD process.

Referring to FIGS. 6A, 6B, 12A, and 12B, a lower interconnection structure 218 may be formed to be defined in the lower opening 208 by planarizing the interconnection material layer 215, the barrier layer 213, and the conductive layer 211 until an upper surface of the first lower interlayer insulating layer LILD1' is exposed. The lower interconnection structure 218 may include a lower conductive layer 212 formed by planarizing the conductive layer 211, a lower barrier layer 214 formed by planarizing the barrier layer 213, and a lower interconnection 216L and a lower contact plug 216C formed by planarizing the interconnection material layer 215.

A lower capping layer 219 may be formed to cover the lower interconnection structure 218 and the first lower interlayer insulating layer LILD1'. The lower capping layer 219 may be formed of silicon nitride.

Referring to FIGS. 6A, 6B, 13A, and 13B, a second lower interlayer insulating layer LILD2' may be formed on the lower capping layer 219. A first intermediate opening 220 including a first intermediate contact hole 220H, which passes through the second lower interlayer insulating layer LILD2' and the lower capping layer 219 and exposes the lower interconnection structure 218, and a first intermediate interconnection trench 220T crossing an upper portion of the first intermediate contact hole 220H may be formed using a dual damascene process.

A barrier layer and an interconnection material layer may be sequentially deposited on the substrate having the first intermediate opening 220, and a first intermediate interconnection structure 226 may be formed by planarizing the interconnection material layer and the barrier layer until an upper surface of the second lower interlayer insulating layer LILD2' is exposed. The first intermediate interconnection structure 226 may include the first intermediate contact plug 224C (shown in FIG. 8), the first intermediate interconnection 224L (shown in FIG. 8) which is integrally formed with the first intermediate contact plug 224C (shown in FIG. 8), and the first intermediate barrier layer 222 (shown in FIG. 8) which covers the bottom surface and the side surfaces of the first intermediate contact plug 224C (shown in FIG. 8) and the bottom surface and the side surfaces of the first intermediate interconnection 224L (shown in FIG. 8).

A first intermediate capping layer 227 may be formed to cover the first intermediate interconnection structure 226 and the second lower interlayer insulating layer LILD2'. The first intermediate capping layer 227 may be formed of silicon nitride.

A third lower interlayer insulating layer LILD3' may be formed on the first intermediate capping layer 227. A second intermediate opening 228 including a second intermediate contact hole 228H, which passes through the third lower interlayer insulating layer LILD3' and the first intermediate capping layer 227 and exposes the first intermediate interconnection structure 226, and a second intermediate interconnection trench 228T crossing an upper portion of the second intermediate contact hole 228H may be formed using a dual damascene process.

A barrier layer and an interconnection material layer may be sequentially deposited on the substrate having the second intermediate opening 228, and a second intermediate interconnection structure 234 may be formed by planarizing the interconnection material layer and the barrier layer until an upper surface of the third lower interlayer insulating layer LILD3' is exposed. The second intermediate interconnection structure 234 may include a second intermediate contact plug 232C (shown in FIG. 8), a first intermediate interconnection 232L (shown in FIG. 8) which is integrally formed with the second intermediate contact plug 232C (shown in FIG. 8), and a second intermediate barrier layer 230 (shown in FIG. 8) which covers the bottom surface and the side surfaces of the second intermediate contact plug 232C (shown in FIG. 8) and the bottom surface and the side surfaces of the second intermediate interconnection 232L (shown in FIG. 8).

A second intermediate capping layer 237 may be formed to cover the second intermediate interconnection structure 234 and the third lower interlayer insulating layer LILD3'. The second intermediate capping layer 237 may be formed of silicon nitride.

Referring to FIGS. 6A, 6B, 14A, and 14B, a fourth lower interlayer insulating layer LILD4' may be formed on the second intermediate capping layer 237.

An upper contact hole 238 may be formed to pass through the fourth lower interlayer insulating layer LILD4' and the second intermediate capping layer 237. A barrier layer and an interconnection material layer may be formed on the substrate having the upper contact hole 238, and an upper plug barrier layer 240 and an upper contact plug 242 may be formed by planarizing the interconnection material layer and the barrier layer until an upper surface of the fourth lower interlayer insulating layer LILD4' is exposed.

Referring to FIGS. 6A, 6B, 15A, and 15B, a barrier material layer 243 and an upper interconnection material layer 245 may be formed on the semiconductor substrate having the upper plug barrier layer 240 and the upper contact plug 242. The barrier material layer 243 may be formed of a metal nitride such as TiN, etc.

The upper interconnection material layer 245 may be formed of a material having a different stress characteristic from the lower interconnection 216L and the first and second intermediate interconnections 224L and 232L. For example, the lower interconnection 216L and the first and second intermediate interconnections 224L and 232L may be formed of a refractory metal formed by performing a CVD process, for example, CVD tungsten and thus may have tensile stress, and the upper interconnection material layer 245 may be formed of a refractory metal formed by performing a PVD process, for example, PVD tungsten. The stress of PVD tungsten may be adjusted according to a PVD process condition. For example, the PVD tungsten may have compressive stress.

Referring to FIGS. 6A, 6B, 16A, and 16B, an upper barrier layer 244 and an upper interconnection 246 which are sequentially stacked may be formed by patterning the upper interconnection material layer 245 and the barrier material layer 243.

An upper capping layer 249 may be formed to cover the upper barrier layer 244 and the upper interconnection 246. The upper capping layer 249 may be formed of silicon nitride.

Referring to FIGS. 6A, 6B, 17A, and 17B, a fifth lower interlayer insulating layer LILD5' may be formed on the upper capping layer 249. The fifth lower interlayer insulating layer LILD5' may be formed of silicon oxide. A semiconductor pattern 252 may be formed on the fifth lower interlayer insulating layer LILD5'. The semiconductor pattern 252 may be formed of polysilicon having a P-type conductivity type.

Referring to FIGS. 6A, 6B, 18A, and 18B, an insulating layer may be formed on the semiconductor substrate having the semiconductor pattern 252, and an intermediate interlayer insulating layer MILD may be formed by planarizing the insulating layer until an upper surface of the semiconductor pattern 252 is exposed.

Cell interlayer insulating layers CILD and molding layers 254 may be alternately and repeatedly formed on the semiconductor pattern 252. The cell interlayer insulating layers CILD may have an etch selectivity with respect to the molding layers 254. For example, the cell interlayer insulating layers CILD may be formed of silicon oxide, and the molding layers 254 may be formed of silicon nitride. The cell interlayer insulating layers CILD and the molding layers 254 may be patterned and edges thereof may be formed in a step structure.

An insulating layer may be formed on the substrate having the cell interlayer insulating layers CILD and the molding layers 254, and a first upper interlayer insulating layer UILD1 may be formed by planarizing the insulating layer. A second upper interlayer insulating layer UILD2 may be formed on the cell interlayer insulating layers CILD, the molding layers 254, and the first upper interlayer insulating layer UILD1.

A plurality of cell structures CV may be formed to pass through the second upper interlayer insulating layer UILD2, the cell interlayer insulating layers CILD, and the molding layers 254 and to be connected to the semiconductor pattern 252.

The formation of the cell vertical structures CV may include forming holes passing through the second upper interlayer insulating layer UILD2, the cell interlayer insulating layers CILD, and the molding layers 254, forming the semiconductor epitaxial layer 60 (shown in FIG. 3) on the semiconductor pattern 252 exposed by the holes, conformally forming the first cell dielectric 61 (shown in FIG. 3) on side walls of the holes, conformally forming the semiconductor layer 62 (shown in FIG. 3) on the first cell dielectric 61 (shown in FIG. 3), forming the core insulating pattern 63 (shown in FIG. 3), which partially fills the holes, on the semiconductor layer 62 (shown in FIG. 3), and forming the cell pad pattern 64 (shown in FIG. 3) on the core insulating pattern 63 (shown in FIG. 3).

Referring to FIGS. 6A, 6B, 19A, and 19B, a third upper interlayer insulating layer UILD3 may be formed to cover the cell vertical structures CV and the second upper interlayer insulating layer UILD2.

Trenches 266 may be formed to pass through the third upper interlayer insulating layer UILD3, the second upper interlayer insulating layer UILD2, the cell interlayer insulating layers CILD, and the molding layers 254. Empty spaces may be formed by removing the molding layers 254 adjacent to the trenches 266, and cell gates CG may be formed in the empty spaces. The cell gates CG may be formed to surround side surfaces of the cell vertical structures CV.

An insulating spacer 274 may be formed on side walls of the trenches 266. A source impurity region CS having a different conductive type from the semiconductor pattern 252, for example, an N-type conductivity type, may be formed in the semiconductor pattern 252 under the trenches 266. Source patterns 277 may be formed to fill the trenches 266. Each of the source patterns 277 may include a source conductive layer 276, and a source barrier layer 275 which surrounds side surfaces and a bottom surface of the source conductive layer 276. The source conductive layer 276 may be formed of a refractory metal formed using a CVD process.

Referring to FIGS. 6A, 6B, 20A, and 20B, a fourth upper interlayer insulating layer UILD4 may be formed on the third upper interlayer insulating layer UILD3. A first peripheral bit line contact structure 280a, a first peripheral word line contact structure 280b, a first well contact structure 280c, and a first cell gate contact structure 280d may be formed.

Each of the first peripheral bit line contact structure 280a, the first peripheral word line contact structure 280b, the first well contact structure 280c, and the first cell gate contact structure 280d may include a contact plug 278b and a barrier layer 278a which covers a bottom surface and side surfaces of the contact plug 278b.

The first peripheral bit line contact structure 280a may pass through the first to fourth upper interlayer insulating layers UILD1 to UILD4, the intermediate interlayer insulating layer MILD, and the fifth lower interlayer insulating layer LILD5' and may be formed on an upper interconnection structure 248 of the first peripheral interconnection structure 250a.

The first peripheral word line contact structure 280b may pass through the first to fourth upper interlayer insulating layers UILD1 to UILD4, the intermediate interlayer insulating layer MILD, and the fifth lower interlayer insulating layer LILD5' and may be formed on the upper interconnection structure 248 of the second peripheral interconnection structure 250b.

The first well contact structure 280c may pass through the first to fourth upper interlayer insulating layers UILD1 to UILD4 and may be formed on the semiconductor pattern 252, and the first cell gate contact structure 280d may pass through the first to fourth upper interlayer insulating layers UILD1 to UILD4 and may be formed on the edges of the cell gates CG.

A fifth upper interlayer insulating layer UILD5 may be formed on the fourth upper interlayer insulating layer UILD4. A second peripheral bit line contact structure 282a, a second peripheral word line contact structure 282b, a second well contact structure 282c, a second cell gate contact structure 282d, and a first cell bit line contact structure 282e may be formed. The second peripheral bit line contact structure 282a may be formed on the first peripheral bit line contact structure 280a and may pass through the fifth upper interlayer insulating layer UILD5.

The second peripheral word line contact structure 282b may be formed on the first peripheral word line contact structure 280b and may pass through the fifth upper interlayer insulating layer UILD5. The second well contact structure 282c may be formed on the first well contact structure 280c and may pass through the fifth upper interlayer insulating layer UILD5. The second cell gate contact structure 282d may be formed on the first cell gate contact structure 280d and may pass through the fifth upper interlayer insulating layer UILD5. The first cell bit line contact structure 282e may be formed on the cell vertical structure CV and may pass through the third to fifth upper interlayer insulating layers UILD3 to UILD5.

Each of the second peripheral bit line contact structure 282a, the second peripheral word line contact structure 282b, the second well contact structure 282c, the second cell gate contact structure 282d, and the first cell bit line contact structure 282e may include a contact plug 281b and a barrier layer 281a which covers side surfaces and a bottom surface of the contact plug 281b.

A sixth upper interlayer insulating layer UILD6 may be formed on the fifth upper interlayer insulating layer UILD5. A third peripheral bit line contact structure 284a disposed on the second peripheral bit line contact structure 282a, a third peripheral word line contact structure 284b disposed on the second peripheral word line contact structure 282b, a third cell gate contact structure 284d disposed on the second cell gate contact structure 282d, and a second cell bit line contact structure 284e disposed on the first cell bit line contact structure 282e may be formed to pass through the sixth upper interlayer insulating layer UILD6.

Each of the third peripheral bit line contact structure 284a, the third peripheral word line contact structure 284b, the third cell gate contact structure 284d, and the second cell bit line contact structure 284e may include an intermediate interconnection 283b and a barrier layer 283a which covers side surfaces and a bottom surface of the intermediate interconnection 283b.

A seventh upper interlayer insulating layer UILD7 may be formed on the sixth upper interlayer insulating layer UILD6. A fourth peripheral bit line contact structure 286a disposed on the third peripheral bit line contact structure 284a, a fourth peripheral word line contact structure 286b disposed on the third peripheral word line contact structure 284b, a fourth cell gate contact structure 286d disposed on the third cell gate contact structure 284d, and a third cell bit line contact structure 286e disposed on the second cell bit line contact structure 284e may be formed to pass through the seventh upper interlayer insulating layer UILD7.

Each of the fourth peripheral bit line contact structure 286a, the fourth peripheral word line contact structure 286b, the fourth cell gate contact structure 286d, and the third cell bit line contact structure 286e may include a contact plug 285b and a barrier layer 285a which covers side surfaces and a bottom surface of the contact plug 285b.

An eighth upper interlayer insulating layer UILD8 may be formed on the seventh upper interlayer insulating layer UILD7. A bit line connection structure 288a and a word line connection structure 288b may be formed to pass through the eighth upper interlayer insulating layer UILD8. The bit line connection structure 288a may be electrically connected to the fourth peripheral bit line contact structure 286a and the third cell bit line contact structure 286e. The word line connection structure 288b may be electrically connected to the fourth peripheral word line contact structure 286b and the fourth cell gate contact structure 286d.

A ninth upper interlayer insulating layer UILD9 may be formed on the eighth upper interlayer insulating layer UILD8.

A contact structure 290 may be formed to pass through the ninth upper interlayer insulating layer UILD9. The contact structure 290 may include a contact plug 289b and a barrier layer 289a which covers a bottom surface and side surfaces of the contact plug 289b.

Referring again to FIGS. 6A, 6B, 7A, and 7B, a metal interconnection 292 may be formed on the ninth upper interlayer insulating layer UILD9. The metal interconnection 292 may include a barrier layer 291a and a metal layer 291b disposed on the barrier layer 291a. An angle between an upper surface of the metal interconnection 292 and a side surface thereof may be an obtuse angle.

Figure 21A:
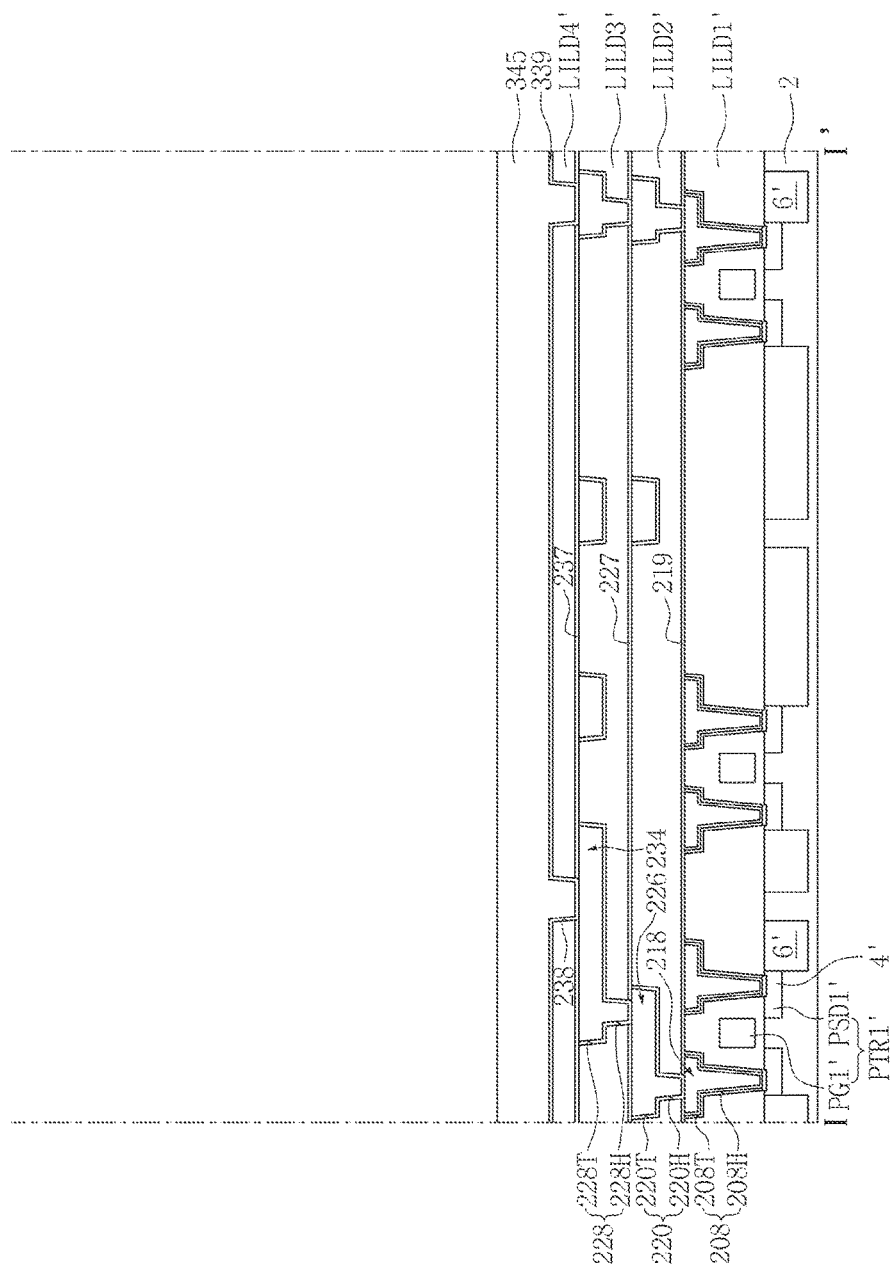
FIGS. 21A to 22B are cross-sectional views showing a modified example of a method of forming a semiconductor device in accordance with example embodiments of inventive concepts.
Figure 21B:
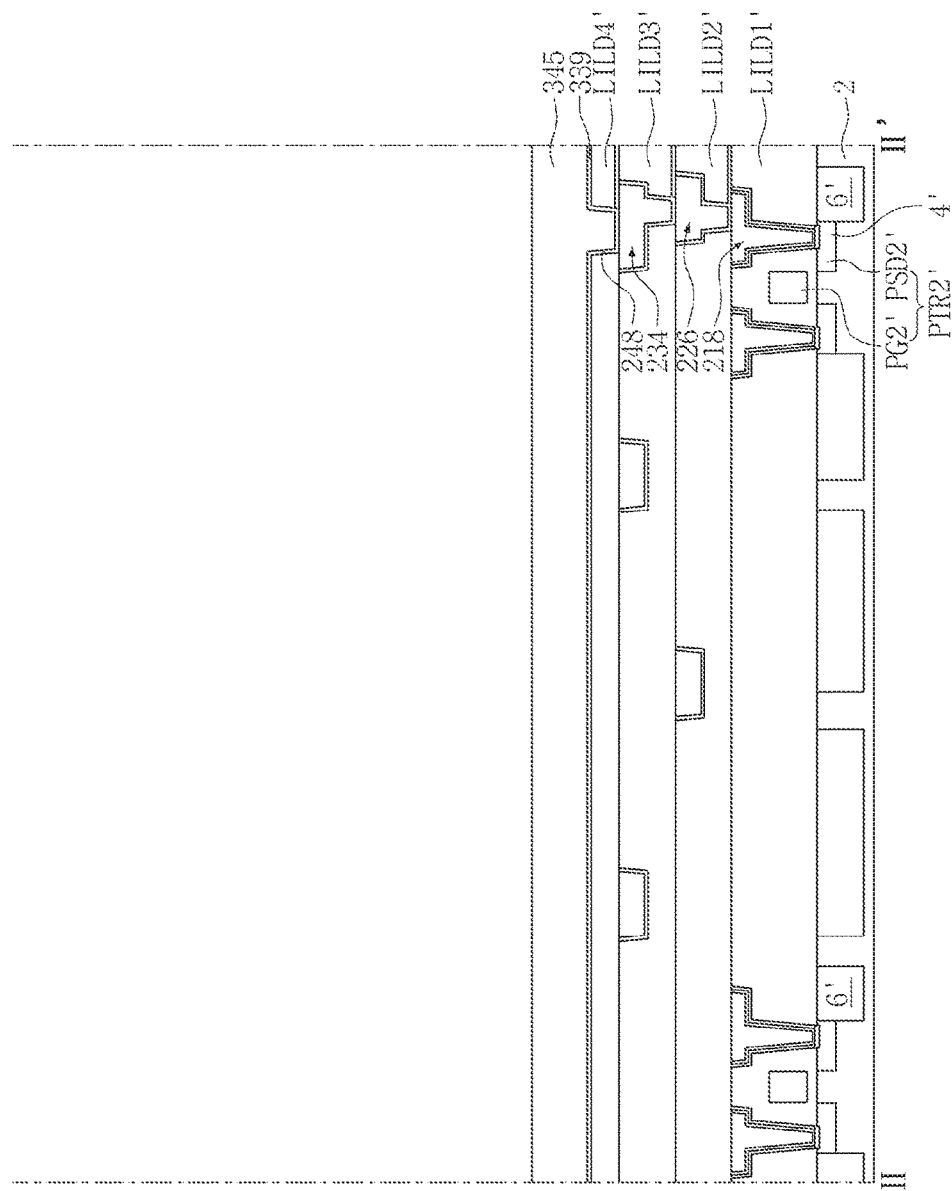
Figure 22A:
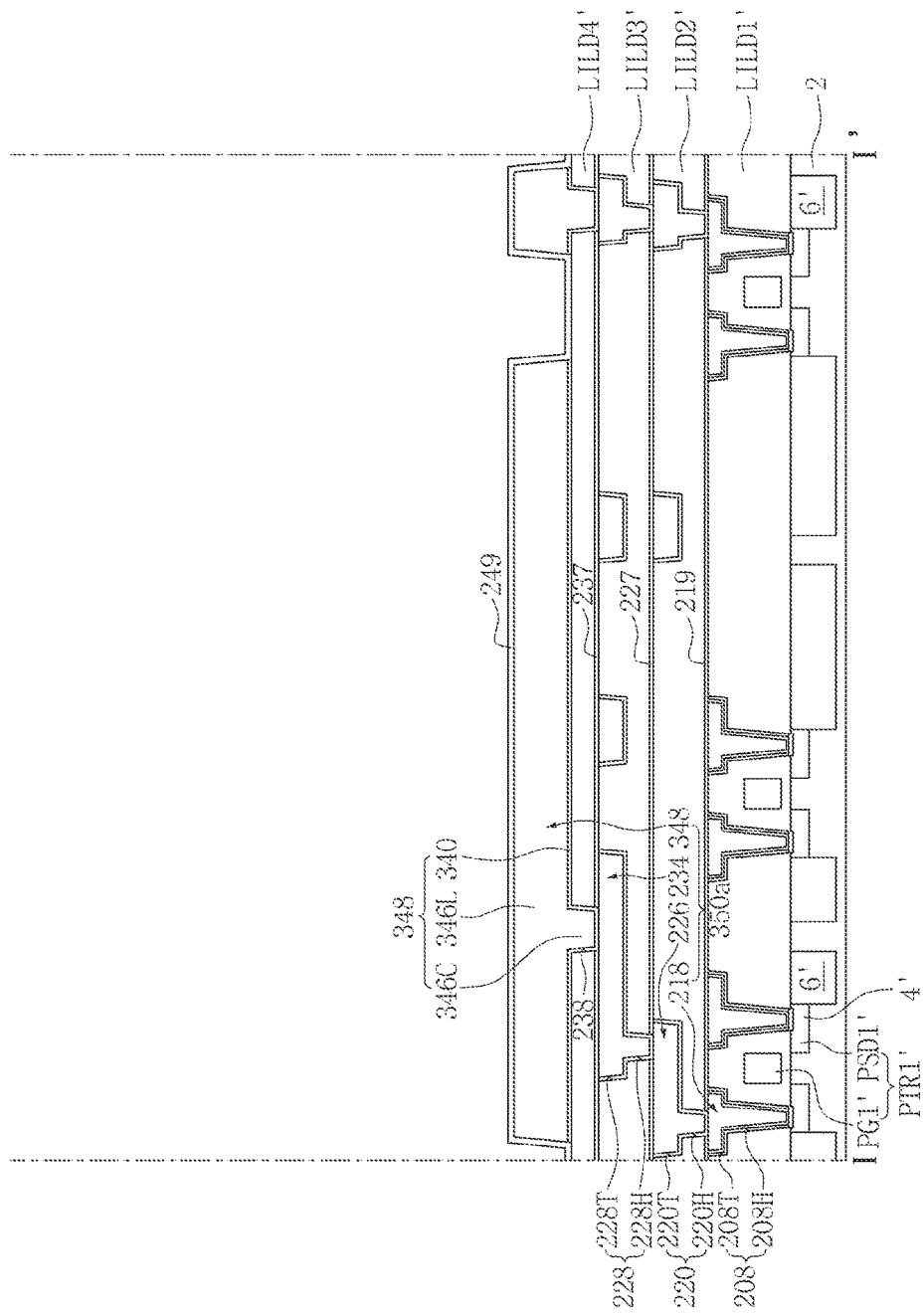
Figure 22B:
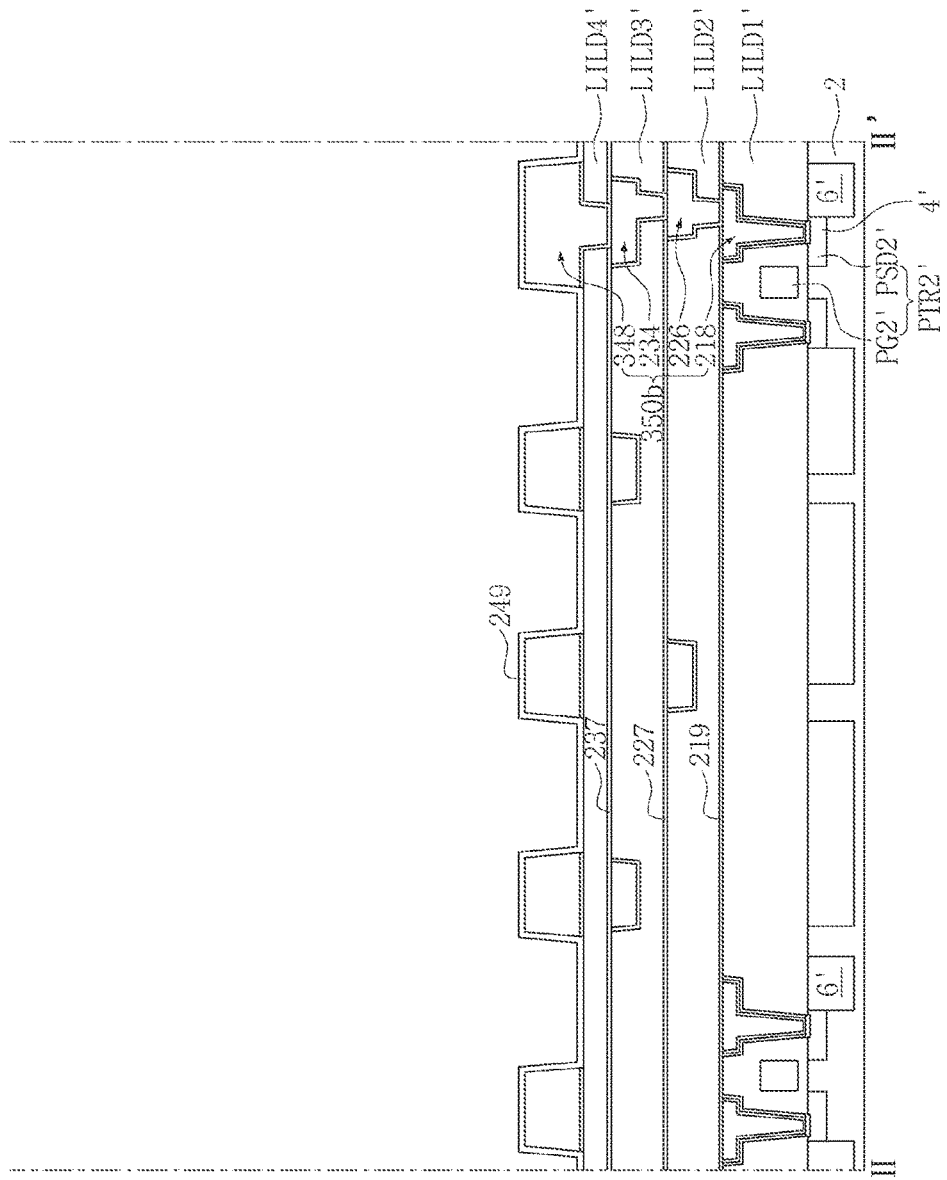

Next, a modified example of a method of forming a semiconductor device in accordance with example embodiments of inventive concepts will be described with reference to FIGS. 6A, 6B, 21A, and 21B. FIGS. 21A to 22B are cross-sectional views showing a modified example of a method of forming a semiconductor device in accordance with example embodiments of inventive concepts. FIGS. 21A and 22A are cross-sectional views showing regions taken along line I-I' of FIG. 6B, and FIGS. 21B and 22B are cross-sectional views showing regions taken along line II-II' of FIG. 6B.

Referring to FIGS. 6A, 6B, 21A, and 21B, the same first and second peripheral transistors PTR1' and PTR2', first lower interlayer insulating layer LILD1', lower interconnection structure 218, and lower capping layer 219 as described in FIGS. 11A to 12B may be sequentially formed on the semiconductor substrate 2. The same second lower interlayer insulating layer LILD2', first intermediate interconnection structure 226, first intermediate capping layer 227, third lower interlayer insulating layer LILD3', second intermediate interconnection structure 234, and second intermediate capping layer 237 as described in FIGS. 13A and 13B may be sequentially formed.

A fourth lower interlayer insulating layer LILD4' may be formed on the second intermediate capping layer 237. An upper contact hole 238 may be formed to pass through the fourth lower interlayer insulating layer LILD4' and the second intermediate capping layer 237.

A barrier material layer 339 and an interconnection material layer 345 may be sequentially formed on the substrate having the upper contact hole 238. The barrier material layer 339 may be formed of a metal nitride. The interconnection material layer 345 may be formed of a refractory metal (e.g., a tungsten material) and may be formed using a PVD process.

Referring to FIGS. 22A, and 22B, an upper interconnection structure 348 may be formed by patterning the barrier material layer 339 and the interconnection material layer 345.

The upper interconnection structure 348 may include an upper contact plug 346C formed in the upper contact hole 238, an upper interconnection 346L formed on the fourth lower interlayer insulating layer LILD4', and an upper barrier layer 340 which covers a bottom surface and side surfaces of the upper contact plug 346C and a bottom surface of the upper interconnection 346L. The upper contact plug 346C and the upper interconnection 346L may be integrally formed. The upper barrier layer 340 may not cover side surfaces of the upper interconnection 346L.

Then, an upper capping layer 249 may be formed to cover the upper interconnection structure 348 and the fourth lower interlayer insulating layer LILD4'. Therefore, the first peripheral interconnection structure 350a as described in FIG. 10 may be formed.

Then, the same process as described in FIGS. 17A to 20B may be performed.

Figure 23:
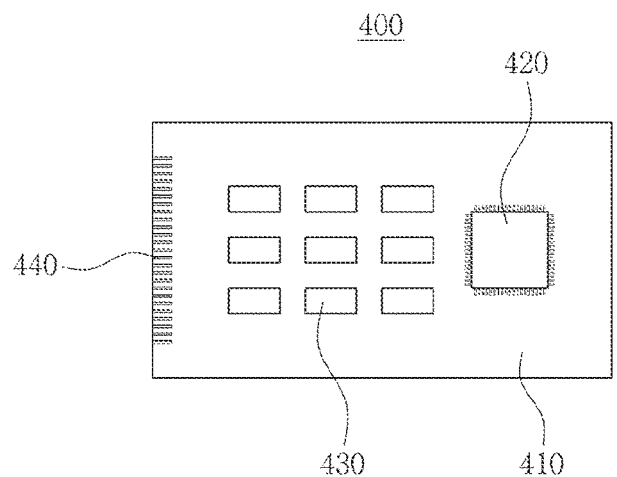
FIG. 23 is a schematic view showing a semiconductor module according to example embodiments of inventive concepts.

FIG. 23 is a schematic view showing a semiconductor module 400 according to example embodiments of inventive concepts.

Referring to FIG. 23, the semiconductor module 400 may include memory devices 430 formed on a module substrate 410. The semiconductor module 400 may include a semiconductor device 420 mounted on the module substrate 410.

The memory device 430 may include one of the above-described semiconductor devices formed according to example embodiments of inventive concepts. Input/output terminals 440 may be disposed on at least one side of the module substrate 410.

Figure 24:
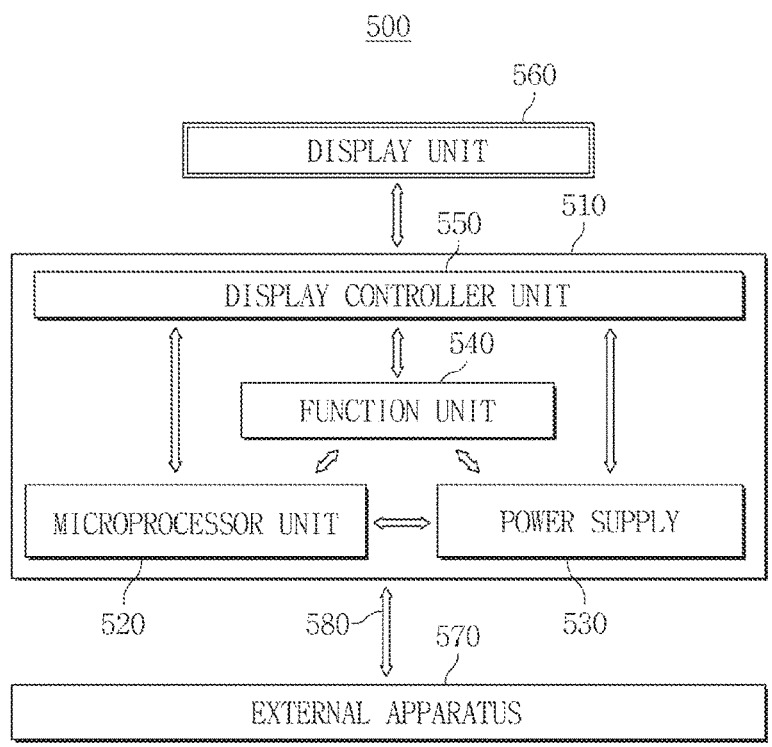
FIG. 24 is a conceptual block diagram showing an electronic system according to example embodiments of inventive concepts.

FIG. 24 is a conceptual block diagram showing an electronic system 500 according to example embodiments of inventive concepts.

Referring to FIG. 24, in example embodiments of inventive concepts, the electronic system 500 including the semiconductor device formed according to may be provided.

The electronic system 500 may include a body 510. The body 510 may include a microprocessor unit 520, a power supply 530, a function unit 540, and/or a display controller unit 550. The body 510 may be a system board or a mother board including a printed circuit board (PCB), etc.

The microprocessor unit 520, the power supply 530, the function unit 540, and the display controller unit 550 may be installed or mounted on the body 510. A display unit 560 may be disposed on an upper surface of the body 510 or outside the body 510. For example, the display unit 560 may be disposed on a surface of the body 510, and then may display an image processed by the display controller unit 550. The power supply 530 may receive a constant voltage from an external power supply, divide the voltage into various voltages levels, and supply those voltages to the microprocessor unit 520, the function unit 540, and the display controller unit 550, etc. The microprocessor unit 520 may receive a voltage from the power supply 530 to control the function unit 540 and the display unit 560.

The function unit 540 may perform various functions of the electronic system 500. For example, when the electronic system 500 is a mobile electronic product such as a cellular phone, etc., the function unit 540 may include various components which perform wireless communication functions such as dialing, image output to the display unit 560, or voice output to a speaker through communication with an external apparatus 570, and when a camera is included, the function unit 540 may serve as an image processor.

In example embodiments, when the electronic system 500 is connected to a memory card to expand the capacity, the function unit 540 may be a memory card controller. The function unit 540 may exchange signals with the external apparatus 570 through a wired or wireless communication unit 580.

Further, when the electronic system 500 requires a Universal Serial Bus (USB) to expand the functions, the function unit 540 may serve as an interface controller.

Figure 25:
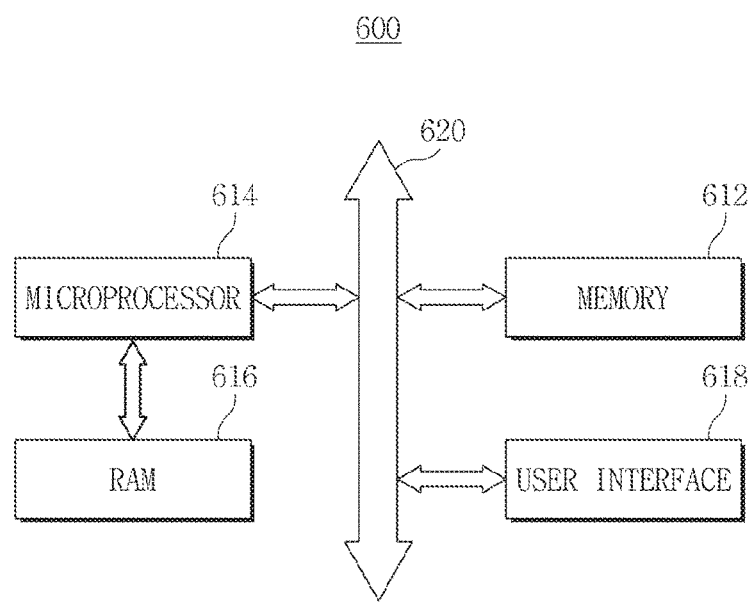
FIG. 25 is a schematic block diagram showing an electronic system according to example embodiments of inventive concepts.

FIG. 25 is a schematic block diagram showing an electronic system 600 according to example embodiments of inventive concepts.

Referring to FIG. 25, the electronic system 600 may include the semiconductor device formed according to example embodiments of inventive concepts. The electronic system 600 may include a memory 612, a microprocessor 614, a RAM 616, and a user interface 618 which perform data communication using a bus 620. The microprocessor 614 may program and control the electronic system 600. The RAM 616 may be used as an operational memory of the microprocessor 614. The microprocessor 614, the RAM 616 and/or other components may be assembled within a single package. The memory 612 may include the semiconductor device according to example embodiments of inventive concepts.

The user interface 618 may be used to input data to the electronic system 600 or output data from the electronic system 600. The memory 612 may store operational codes of the microprocessor 614, data processed by the microprocessor 614, or data received from the outside. The memory 612 may include a controller and a memory.

According to example embodiments of inventive concepts, in order to increase the degree of integration, a semiconductor pattern may be disposed on a semiconductor substrate, a three-dimensional memory array including three-dimensional memory cells may be disposed on the semiconductor pattern, and a peripheral interconnection structure may be disposed between the semiconductor substrate and the semiconductor pattern. The peripheral interconnection structure may include a lower interconnection structure having a damascene structure capable of forming a fine pattern and an upper interconnection structure capable of improving an electrical characteristic.

Cell gates of the three-dimensional memory array and a lower interconnection of the lower interconnection structure may be formed of a refractory metal formed using a CVD process. The cell gates of the three-dimensional memory array and the lower interconnection of the lower interconnection structure may have a tensile stress characteristic.

In order to limit (and/or suppress) the warpage due to the tensile stress characteristic of the cell gates of the three-dimensional memory array and the lower interconnection of the lower interconnection structure, the upper interconnection may be formed of a refractory metal having a different stress characteristic from the cell gates of the three-dimensional memory array and the lower interconnection of the lower interconnection structure. For example, the upper interconnection may be formed of a metal material, for example, a refractory metal formed using a PVD process capable of adjusting the stress.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor device comprising:
a semiconductor substrate;
a semiconductor pattern on the semiconductor substrate;
a three-dimensional memory array on the semiconductor pattern; and
a peripheral interconnection structure between the semiconductor pattern and the semiconductor substrate,
the peripheral interconnection structure including a lower interconnection structure, the lower interconnection structure including a lower interconnection,
wherein side surfaces of the lower interconnection have negative slopes.

2. The semiconductor device of claim 1, wherein an angle between an upper surface of the lower interconnection and each of the side surfaces of the lower interconnection is an acute angle.

3. The semiconductor device of claim 1, wherein the peripheral interconnection structure includes an upper interconnection structure over the lower interconnection structure, the upper interconnection structure including an upper interconnection, and
wherein side surfaces of the upper interconnection have positive slopes.

4. The semiconductor device of claim 3, wherein an angle between an upper surface of the upper interconnection and each of the side surfaces of the upper interconnection is an obtuse angle.

5. The semiconductor device of claim 3, wherein a thickness of the upper interconnection is greater than a thickness of the lower interconnection.

6. The semiconductor device of claim 3, wherein the lower interconnection includes a refractory metal having a tensile stress characteristic, and the upper interconnection includes a refractory metal having a different stress characteristic from the lower interconnection.

7. The semiconductor device of claim 3, wherein the upper interconnection structure further includes an upper barrier layer, and
wherein the upper barrier layer is under a bottom surface of the upper interconnection, and does not cover the side surfaces of the upper interconnection.

8. The semiconductor device of claim 1, wherein
the lower interconnection structure further includes a lower contact plug under the lower interconnection, and
the lower contact plug is integrally formed with the lower interconnection.

9. The semiconductor device of claim 8, wherein the lower interconnection structure further includes a lower barrier layer, and
wherein the lower barrier layer is under a bottom surface of the lower interconnection, covers the side surfaces of the lower interconnection, and extends on side surfaces and a bottom surface of the lower contact plug.

10. The semiconductor device of claim 1, wherein the three-dimensional memory array includes a plurality of cell gates disposed on the semiconductor pattern and spaced apart from each other in a direction perpendicular to an upper surface of the semiconductor pattern, and
wherein each of the plurality of cell gates includes a cell gate conductive pattern including a cell interconnection, and the cell interconnection includes a tungsten material.

11. The semiconductor device of claim 10, wherein the peripheral interconnection structure includes an upper interconnection structure between the lower interconnection structure and the semiconductor pattern, the upper interconnection structure including an upper interconnection, and
wherein side surfaces of the upper interconnection have positive slopes.

12. The semiconductor device of claim 11, wherein the cell interconnection includes a refractory metal having a tensile stress characteristic, and the upper interconnection includes a refractory metal having a different stress characteristic from the cell interconnection.

13. The semiconductor device of claim 10, further comprising:
a metal interconnection over the three-dimensional memory array,
wherein side surfaces of the metal interconnection have positive slopes.

14. The semiconductor device of claim 13, wherein an angle between an upper surface of the metal interconnection and each of the side surfaces of the metal interconnection is an obtuse angle.

15. The semiconductor device of claim 1, wherein
the peripheral interconnection structure further includes an upper interconnection structure over the lower interconnection structure,
the upper interconnection structure including an upper interconnection.

16. The semiconductor device of claim 15, wherein side surfaces of the upper interconnection have positive slopes.

17. The semiconductor device of claim 15, wherein a thickness of the upper interconnection is greater than a thickness of the lower interconnection.

18. The semiconductor device of claim 15, wherein the lower interconnection includes a refractory metal having a tensile stress characteristic, and the upper interconnection includes a refractory metal having a different stress characteristic from the lower interconnection.

19. The semiconductor device of claim 15, wherein the three-dimensional memory array includes a plurality of cell gates disposed on the semiconductor pattern and spaced apart from each other in a direction perpendicular to an upper surface of the semiconductor pattern, and
wherein each of the plurality of cell gates includes a cell gate conductive pattern including a cell interconnection, and the cell interconnection includes a tungsten material.

20. The semiconductor device of claim 19, further comprising:
a metal interconnection over the three-dimensional memory array,
wherein side surfaces of the metal interconnection have positive slopes.

* * * * *